(12) United States Patent
Wu et al.

(10) Patent No.: US 12,137,569 B2
(45) Date of Patent: Nov. 5, 2024

(54) MEMORY DEVICE AND METHOD OF FORMING THE SAME

(71) Applicant: Taiwan Semiconductor Manufacturing Company, Ltd., Hsinchu (TW)

(72) Inventors: Chao-I Wu, Hsinchu County (TW); Yu-Ming Lin, Hsinchu (TW); Shih-Lien Linus Lu, Hsinchu (TW); Sai-Hooi Yeong, Hsinchu County (TW); Bo-Feng Young, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 94 days.

(21) Appl. No.: 18/162,642

(22) Filed: Jan. 31, 2023

(65) Prior Publication Data

US 2023/0189529 A1 Jun. 15, 2023

Related U.S. Application Data

(63) Continuation of application No. 17/228,671, filed on Apr. 12, 2021, now Pat. No. 11,587,950.

(Continued)

(51) Int. Cl.
| | |
|---|---|
| *H10B 51/20* | (2023.01) |
| *H01L 29/24* | (2006.01) |
| *H10B 43/20* | (2023.01) |
| *H10B 51/10* | (2023.01) |
| *H10B 51/30* | (2023.01) |

(52) U.S. Cl.
CPC ............ *H10B 51/20* (2023.02); *H01L 29/24* (2013.01); *H10B 43/20* (2023.02); *H10B 51/10* (2023.02); *H10B 51/30* (2023.02)

(58) Field of Classification Search
CPC ......... H01L 29/24; H10B 43/20; H10B 51/10; H10B 51/20; H10B 51/30
See application file for complete search history.

(56) References Cited

U.S. PATENT DOCUMENTS

2014/0166981 A1* 6/2014 Doyle ............... H01L 29/42376
438/270
2018/0331127 A1* 11/2018 Sasaki ................... H01L 27/127
(Continued)

FOREIGN PATENT DOCUMENTS

| KR | 20110130916 A | * | 12/2011 |
|---|---|---|---|
| KR | 20140050862 A | * | 4/2014 |
| KR | 102216132 B1 | * | 2/2021 |

*Primary Examiner* — Matthew E Warren
(74) *Attorney, Agent, or Firm* — JCIPRNET

(57) ABSTRACT

A memory device includes a multi-layer stack, a plurality of channel layers and a plurality of ferroelectric layers. The multi-layer stack is disposed on a substrate and includes a plurality of gate layers and a plurality of dielectric layers stacked alternately. The plurality of channel layers penetrate through the multi-layer stack and are laterally spaced apart from each other, wherein the plurality of channel layers include a first channel layer and a second channel layer, and a first electron mobility of the first channel layer is different from a second electron mobility of the second channel layer. Each of the plurality of channel layers are spaced apart from the multi-layer stack by one of the plurality of ferroelectric layers, respectively.

20 Claims, 50 Drawing Sheets

Related U.S. Application Data

(60) Provisional application No. 63/047,243, filed on Jul. 1, 2020.

(56) References Cited

U.S. PATENT DOCUMENTS

| | | | |
|---|---|---|---|
| 2020/0051994 A1* | 2/2020 | Purayath | H10B 43/35 |
| 2021/0202751 A1* | 7/2021 | Goda | H01L 29/66833 |
| 2021/0288066 A1* | 9/2021 | Tan | H10B 43/27 |

* cited by examiner

MEMORY DEVICE AND METHOD OF FORMING THE SAME

CROSS-REFERENCE TO RELATED APPLICATION

This application is a continuation application of and claims the priority benefit of a prior application Ser. No. 17/228,671, filed on Apr. 12, 2021 which claims the priority benefit of U.S. provisional application Ser. No. 63/047,243, filed on Jul. 1, 2020. The entirety of the above-mentioned patent application is hereby incorporated by reference herein and made a part of this specification.

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three-dimensional (3D) memory device, such as a 3D NOR-type memory or a 3D NAND-type memory, has been introduced to replace a planar memory device. However, 3D memory device has not been entirely satisfactory in all respects, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
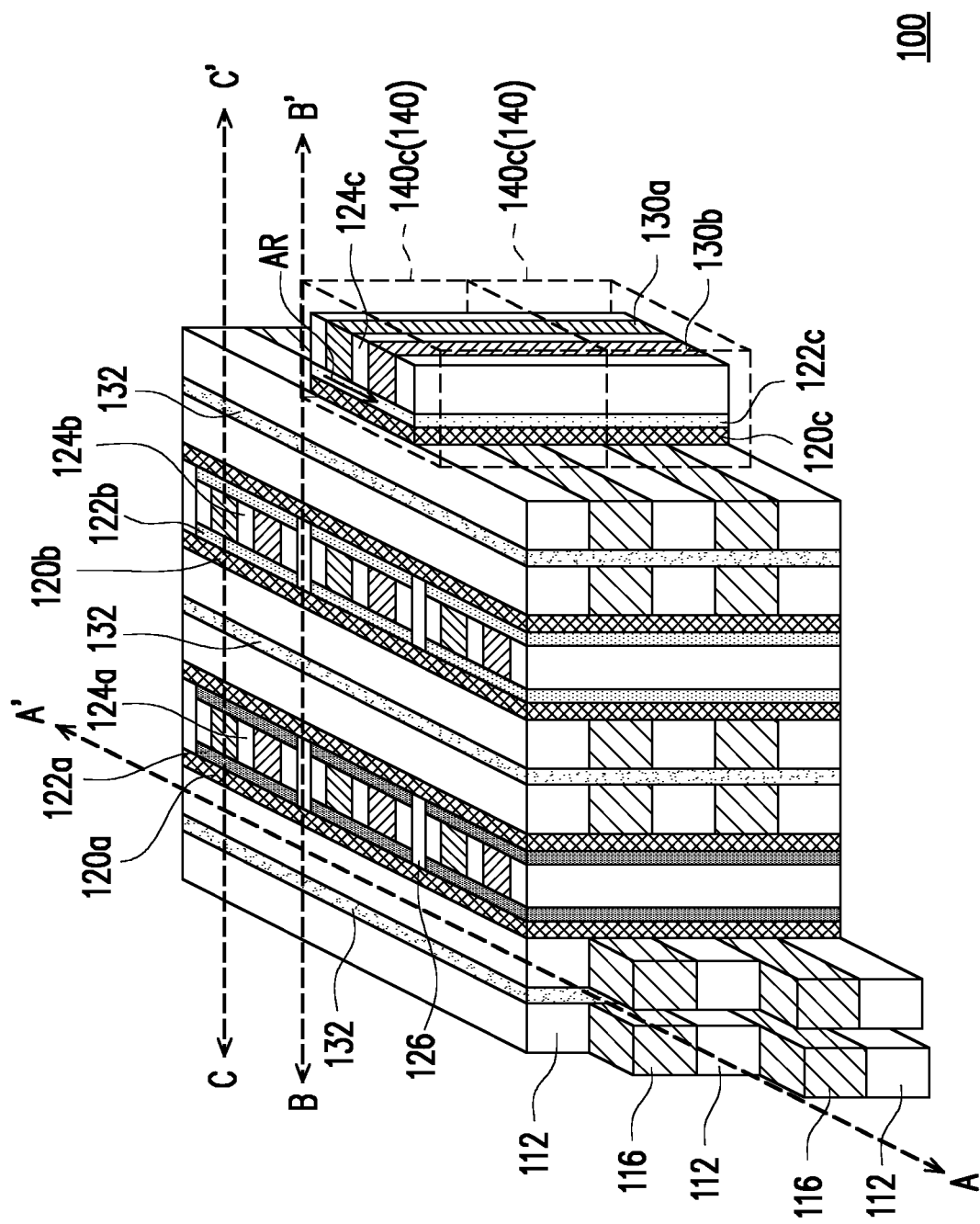
FIG. 1A is a schematic three-dimensional view illustrating a portion of a 3D memory device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a memory device such as a three-dimensional (3D) memory device is provided. In some embodiments, the 3D memory device is a ferroelectric field effect transistor (FeFET) memory circuit including a plurality of vertically stacked memory cells. In some embodiments, each memory cell is regarded as a FeFET which includes a word line region acting as a gate electrode, a bit line region acting as a first source/drain electrode, and a source line region acting as a second source/drain electrode, a ferroelectric material acting as a gate dielectric, and an oxide semiconductor (OS) acting as a channel region. In some embodiments, each memory cell is regarded as a thin film transistor (TFT).

Figure 1B:
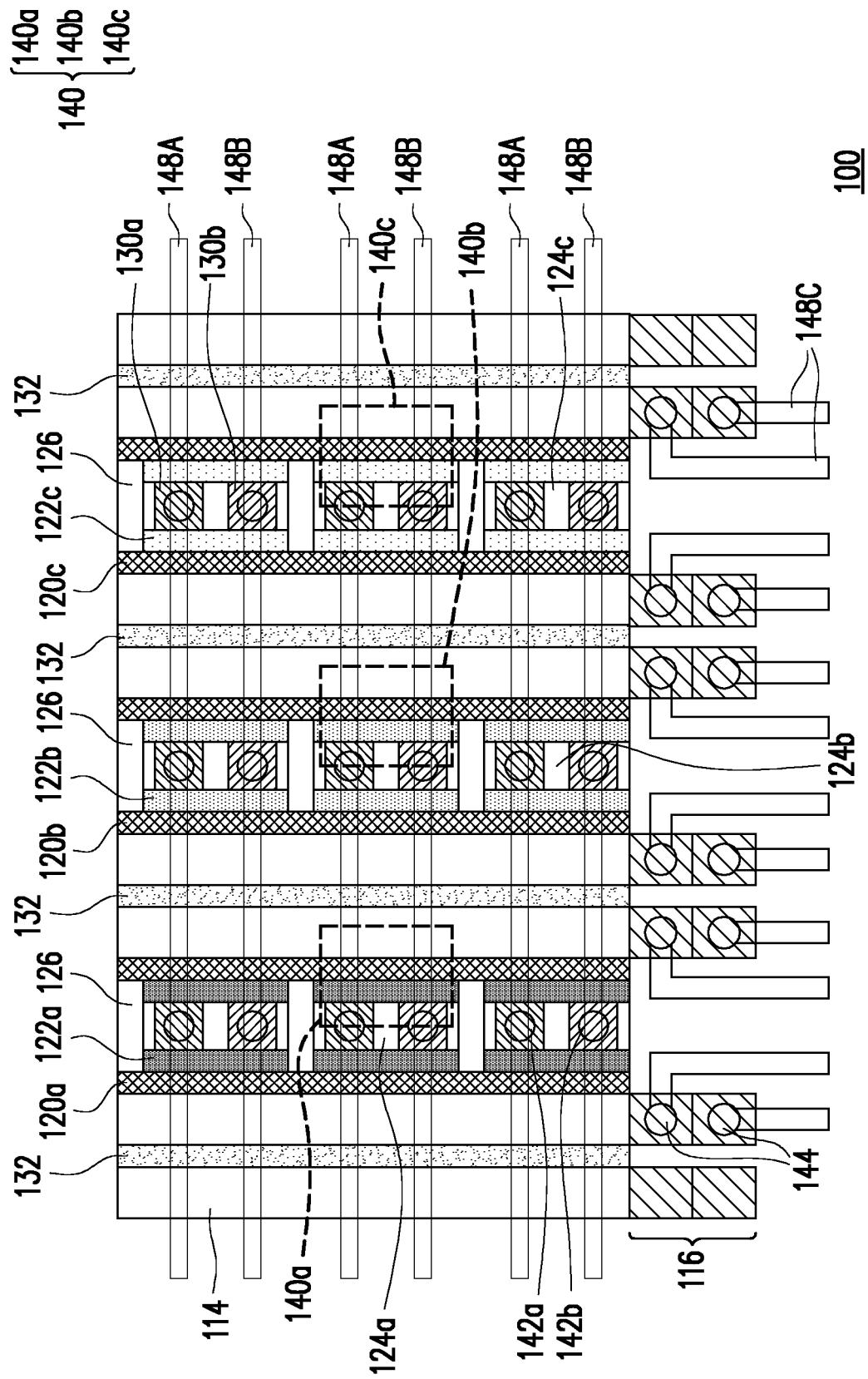
FIG. 1B is a top down view of the 3D memory device in accordance with some embodiments of the present disclosure.
Figure 1C:
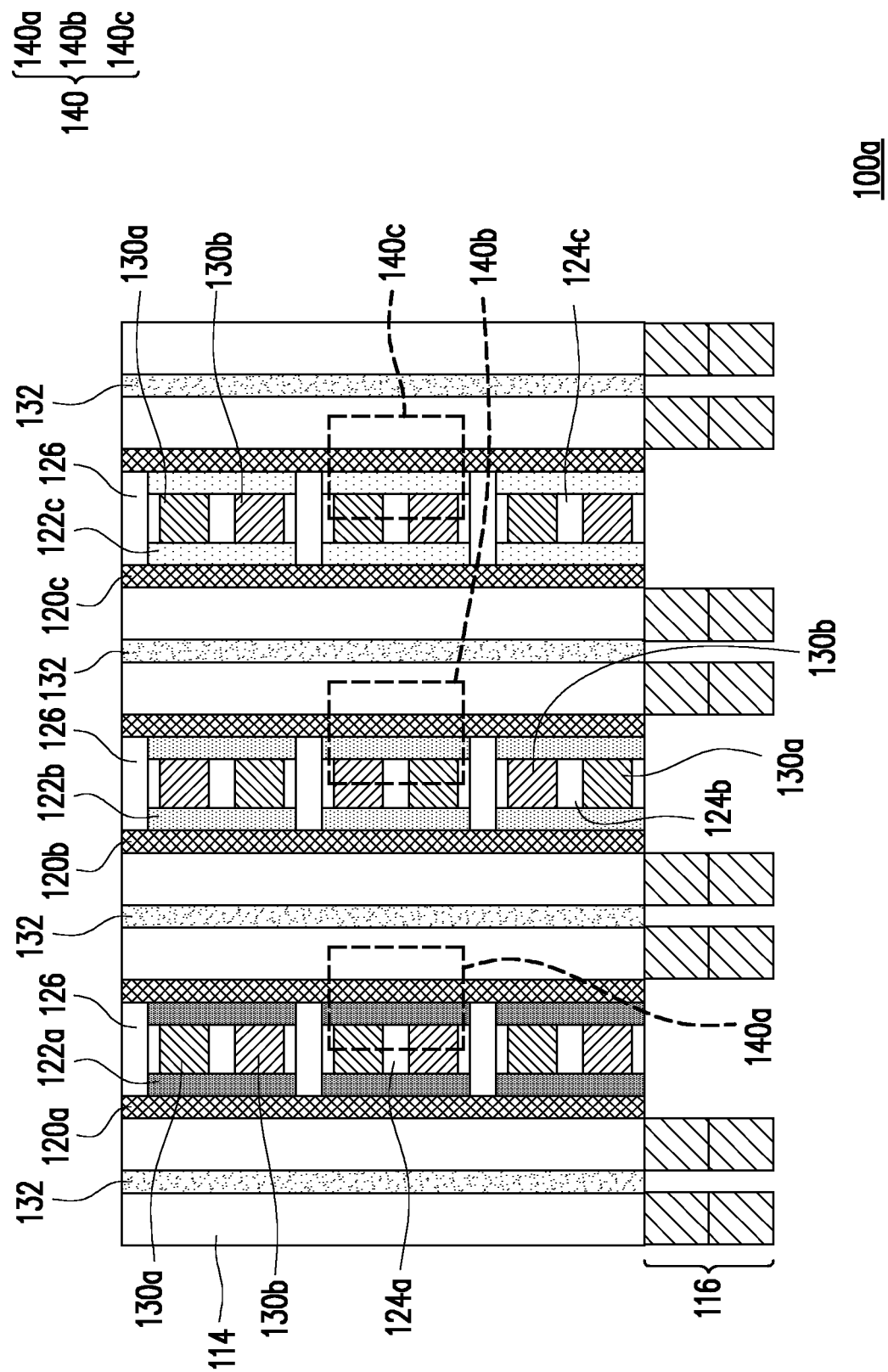
FIG. 1C is a top down view of a 3D memory device in accordance with some alternative embodiments of the present disclosure.

FIG. 1A is a schematic three-dimensional view illustrating a portion of a 3D memory device 100 in accordance with some embodiments of the present disclosure. FIG. 1B is a top down view of the 3D memory device 100 in accordance with some embodiments of the present disclosure. FIG. 1C is a top down view of a 3D memory device 100a in accordance with some alternative embodiments of the present disclosure.

Referring to FIG. 1A and FIG. 1B, the 3D memory device 100 includes a plurality of memory cells 140a, 140b and 140c (collectively referred to as memory cells 140), which may be arranged in a grid of rows and columns. The memory cells 140 may be further stacked vertically to provide a three dimensional memory array, thereby increasing device density. The 3D memory device 100 may be fabricated by the back end of line (BEOL) processes of a semiconductor die. For example, the memory array may be disposed in the interconnect structure of the semiconductor die, such as, above one or more active devices (e.g., transistors) formed in and/or on a semiconductor substrate.

In some embodiments, the 3D memory device 100 is a flash memory array, such as a NOR flash memory array, or the like. In some embodiments, a gate of each memory cell 140 is electrically coupled to a respective word line (e.g., conductive line 116), a drain region of each memory cell 140 is electrically coupled to a respective bit line (e.g., conductive lines 148A), and a source region of each memory cell 140 is electrically coupled to a respective source line (e.g., conductive lines 148B), which electrically couples the source region to ground. The memory cells (e.g., 140a, 140b or 140c) in a same horizontal row of the memory array may share a common word line while the memory cells 140 in a same vertical column of the memory array may share a common source line and a common bit line.

The 3D memory device 100 may include a plurality of vertically stacked conductive lines 116 (e.g., word lines) with dielectric layers 112 disposed between adjacent ones of the conductive lines 116. The conductive lines 116 may extend in a direction parallel to a major surface of an underlying substrate (not explicitly illustrated in FIGS. 1A and 1B). The conductive lines 116 may have a staircase configuration such that lower conductive lines 116 are longer than and extend laterally past endpoints of upper conductive lines 116. For example, in FIG. 1A, multiple stacked layers of conductive lines 116 are illustrated with topmost conductive lines 116 being the shortest and bottommost conductive lines 116 being the longest. Respective lengths of the conductive lines 116 may increase in a direction towards the underlying substrate. In this manner, a portion of each of the conductive lines 116 may be accessible from above the 3D memory device 100, and conductive contacts may be made to exposed portions of the conductive lines 116, respectively.

The 3D memory device 100 may further include conductive pillars 130a (e.g., electrically connected to bit lines) and conductive pillars 130b (e.g., electrically connected to source lines) arranged alternately. The conductive pillars 130a and 130b may each extend in a direction perpendicular to the conductive lines 116. A dielectric material (e.g., the dielectric layer 124a, 124b and 124c) is disposed between and isolates adjacent ones of the conductive pillars 130a and the conductive pillars 130b.

Pairs of the conductive pillars 130a and 130b along with an intersecting conductive line 116 define boundaries of each memory cell 140, and an isolation pillar 126 is disposed between and isolates adjacent pairs of the conductive pillars 130a and 130b. In some embodiments, the conductive pillars 130b are electrically coupled to ground. Although FIGS. 1A and 1B illustrate a particular placement of the conductive pillars 130a relative the conductive pillars 130b, it should be appreciated that the placement of the conductive pillars 130a and 130b may be exchanged in other embodiments, as shown in the 3D memory device 100a of FIG. 1C. In FIG. 1C, the placement of the conductive pillars 130a and 130b of the memory cell 140b are exchanged.

In some embodiments, the 3D memory device 100 may also include oxide semiconductor (OS) materials as channel layers 122a, 122b and 122c. The channel layers 122a, 122b and 122c may provide channel regions for the memory cells 140a, 140b and 140c, respectively. For example, when an appropriate voltage (e.g., higher than a respective threshold voltage ($V_{th}$) of a corresponding memory cell 140) is applied through a corresponding conductive line 116, a region of the channel layer (e.g., 122a, 122b and/or 122c) that intersects the corresponding conductive line 116 may allow current to flow from the conductive pillars 130a to the conductive pillars 130b or to flow from the conductive pillars 130b to the conductive pillars 130a (e.g., in the direction indicated by arrow AR).

In some embodiments, a ferroelectric layer (e.g., 120a, 120b or 120c) is disposed between the channel layer (e.g., 122a, 122b or 122c) and each of the conductive lines 116 and the dielectric layers 112. In some embodiments, the ferroelectric layer (e.g., 120a, 120b or 120c) may serve as a gate dielectric for each memory cell (e.g., 140a, 140b or 140c). In some embodiments, the ferroelectric layer (e.g., 120a, 120b or 120c) includes a ferroelectric material, such as a hafnium oxide, hafnium zirconium oxide, silicon-doped hafnium oxide, or the like.

The ferroelectric layer (e.g., 120a, 120b or 120c) may be polarized in one of two different directions, and the polarization direction may be changed by applying an appropriate voltage differential across the ferroelectric layer (e.g., 120a, 120b or 120c) and generating an appropriate electric field. The polarization may be relatively localized (e.g., generally contained within each boundaries of the memory cells 140), and a continuous region of the ferroelectric layer (e.g., 120a, 120b or 120c) may extend across a plurality of memory cells 140. Depending on a polarization direction of a particular region of the ferroelectric layer (e.g., 120a, 120b or 120c), a threshold voltage of a corresponding memory cell 140 varies, and a digital value (e.g., 0 or 1) can be stored. For example, when a region of the ferroelectric layer (e.g., 120a, 120b or 120c) has a first electrical polarization direction, the corresponding memory cell 140 may have a relatively low threshold voltage, and when the region of the ferroelectric layer (e.g., 120a, 120b or 120c) has a second electrical polarization direction, the corresponding memory cell 140 may have a relatively high threshold voltage. The difference between the two threshold voltages may be referred to as the threshold voltage shift. A larger threshold voltage shift makes it easier (e.g., less error prone) to read the digital value stored in the corresponding memory cell 140.

To perform a write operation on a memory cell 140 in such embodiments, a write voltage is applied across a portion of the ferroelectric layer (e.g., 120a, 120b or 120c) corresponding to the memory cell 140. In some embodiments, the write voltage is applied, for example, by applying appropriate voltages to a corresponding conductive line 116 (e.g., the word line) and the corresponding conductive pillars 130a/130b (e.g., the bit line/source line). By applying the write voltage across the portion of the ferroelectric layer (e.g., 120a, 120b or 120c), a polarization direction of the region of the ferroelectric layer (e.g., 120a, 120b or 120c) can be changed. As a result, the corresponding threshold voltage of the corresponding memory cell 140 can also be switched from a low threshold voltage to a high threshold voltage or vice versa, and a digital value can be stored in the memory cell 140. Because the conductive lines 116 intersect the conductive pillars 130a and 130b, individual memory cells 140 may be selected for the write operation.

To perform a read operation on the memory cell 140 in such embodiments, a read voltage (a voltage between the low and high threshold voltages) is applied to the corresponding conductive line 116 (e.g., the world line). Depending on the polarization direction of the corresponding region of the ferroelectric layer (e.g., 120a, 120b or 120c), the memory cell 140 may or may not be turned on. As a result, the conductive pillar 130a may or may not be discharged through the conductive pillar 130b (e.g., a source line that is coupled to ground), and the digital value stored in the memory cell 140 can be determined. Because the conductive lines 116 intersect the conductive pillars 130a and 130b, individual memory cells 140 may be selected for the read operation.

As shown in FIG. 1B, the dashed boxes in FIG. 1B illustrate the first memory cell 140a, the second memory cell 140b and the third memory cell 140c of the 3D memory device 100. The memory cell 140a includes a gate electrode (e.g., a portion of a corresponding conductive line 116), a gate dielectric (e.g., a portion of a corresponding ferroelectric layer 120a), a channel region (e.g., a portion of a corresponding channel layer 122a), and source/drain pillars (e.g., portions of corresponding conductive pillars 130a and 130b). The memory cell 140b includes a gate electrode (e.g., a portion of a corresponding conductive line 116), a gate dielectric (e.g., a portion of a corresponding ferroelectric layer 120b), a channel region (e.g., a portion of a corresponding channel layer 122b), and source/drain pillars (e.g., portions of corresponding conductive pillars 130a and 130b). The memory cell 140c includes a gate electrode (e.g., a portion of a corresponding conductive line 116), a gate dielectric (e.g., a portion of a corresponding ferroelectric layer 120c), a channel region (e.g., a portion of a corresponding channel layer 122c), and source/drain pillars (e.g., portions of corresponding conductive pillars 130a and 130b). The 3D memory device 100 includes a plurality of such memory cells. The memory cells 140a, 140b and 140c may be disposed in an array of vertically stacked rows and columns.

In some embodiments, the channel layers 122a, 122b and 122c have different carrier mobilities from each other. Accordingly, when the memory cells 140a, 140b and 140c are turned on, on-currents of the memory cells 140a, 140b and 140c may be different from each other. For example, electron mobility of the channel layer 122b may be about two times the electron mobility of the channel layer 122a, and the electron mobility of the channel layer 122c may be about two times the electron mobility of the channel layer 122b (i.e., about four times the electron mobility of the channel layer 122a), such that when the memory cells 140a, 140b and 140c are turned on, the on-current of the memory cell 140b may be about two times the on-current of the memory cell 140a, and the on-current of the memory cell 140c may be about two times the on-current of the memory cell 140b (i.e., about four times the on-current of the memory cell 140a).

If all memory cells of a memory device have the same on-current, at least eight memory cells having the same on-current are needed for storing 3-bit data. Since the on-currents of the memory cells 140a, 140b and 140c in the embodiments are different from each other, only three memory cells having different on-currents (i.e., one memory cell 140a, one memory cell 140b and one memory cell 140c) are needed for storing 3-bit data. Accordingly, the layout area of the memory device is reduced. In addition, the power efficiency and storing capacity are improved.

FIG. 1A further illustrates reference cross-sections of the 3D memory device 100 that are used in later figures. Cross-section A-A' is along a longitudinal axis of conductive lines 116 and in a direction, for example, parallel to the direction of current flow of the memory cells 140. Cross-section B-B' is perpendicular to cross-section A-A' and extends through the isolation pillars 126. Cross-section C-C' is perpendicular to cross-section A-A' and extends through the conductive pillars 130a or the conductive pillars 130b. Subsequent figures refer to these reference cross-sections for clarity.

FIGS. 2-16, 17A, 17B, 18A, 18B, 19A, 19B, 20A, 20B, 21-24, 25A, 25B, 25C and 25D illustrating varying views of manufacturing a 3D memory device 100 in accordance with some embodiments of the present disclosure.

Figure 2:
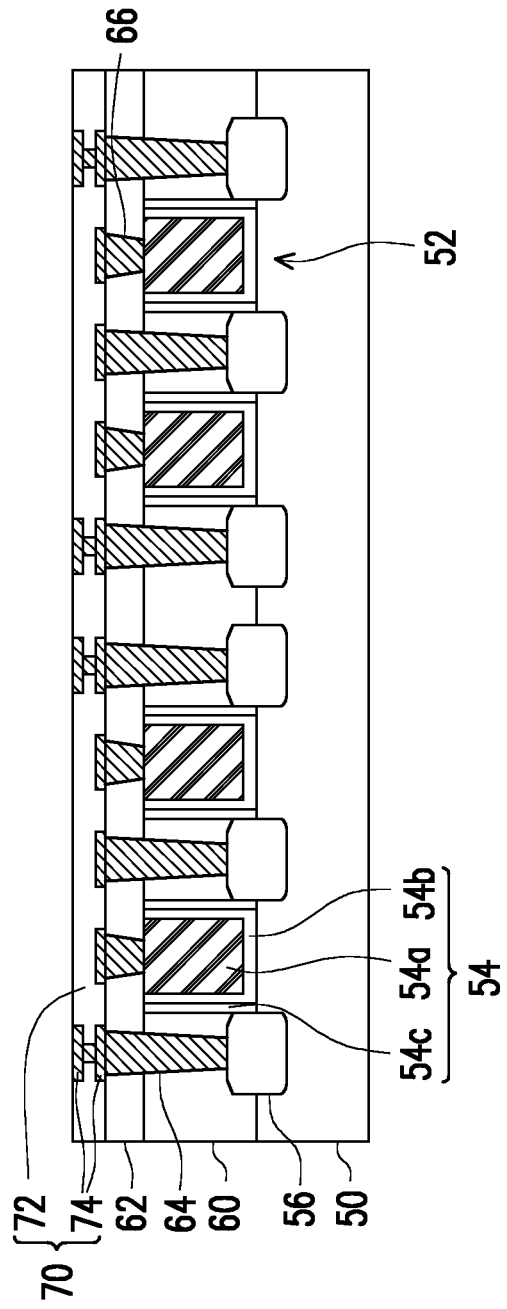
FIGS. 2-16, 17A, 17B, 18A, 18B, 19A, 19B, 20A, 20B, 21-24, 25A, 25B, 25C and 25D illustrating varying views of manufacturing a 3D memory device in accordance with some embodiments of the present disclosure.

Referring to FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be an integrated circuit die, such as a logic die, a memory die, an ASIC die, or the like. The substrate 50 may be a complementary metal oxide semiconductor (CMOS) die and may be referred to as a CMOS under array (CUA). The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may be made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide.

In FIG. 2, circuits formed over the substrate 50 are also shown. In some embodiments, the circuits are CMOS integrated circuits. The circuits may include metal-oxide-semiconductor (MOS) transistors 52 at a top surface of the substrate 50. The MOS transistors 52 may respectively include a gate structure 54 formed over the semiconductor substrate 50. In some embodiments, the gate structure 54 includes a gate electrode 54a, a gate dielectric layer 54b and a gate spacer 54c. The gate dielectric layer 54b may spread between the gate electrode 54a and the semiconductor substrate 50, and may or may not further cover a sidewall of the gate electrode 54a. The gate spacer 54c may laterally surround the gate electrode 54a and the gate dielectric layer 54b. Further, the MOS transistor 52 may further include source/drain regions 56. The source/drain regions 56 may be formed in the semiconductor substrate 50, and are located at opposite sides of the gate structure 54. In some embodiments, the source/drain regions 56 may be epitaxial structures, and may protrude from a surface of the semiconductor substrate 50. It should be noted that, although the MOS transistors 52 are depicted as planar-type MOS transistors that forms conductive channels (not shown) along the surface of the semiconductor substrate 50, the MOS transistors 52 may alternatively be fin field effect transistors (FinFETs), nanostructure (e.g., nanosheet, nanowire, gate-all-around, or the like) FETS (nano-FETs) or the like.

In some embodiments, a first inter-layer dielectric (ILD) 60 surrounds and isolates the source/drain regions 56 and gate structures 54, and a second ILD 62 is over the first ILD 60. Source/drain contacts 64 may extend through the second ILD 62 and the first ILD 60 and may be electrically coupled to the source/drain regions 56, and gate contacts 66 may extend through the second ILD 62 and may be electrically coupled to the gate electrodes 54a. An interconnect structure 70 may be over the second ILD 62, the source/drain contacts 64, and the gate contacts 66. The interconnect structure 320 may include one or more stacked dielectric layers 72 and conductive features 74 formed in the one or more dielectric layers 72, for example. The interconnect structure 70 may be electrically connected to the gate contacts 66 and the source/drain contacts 64 to form functional circuits. In some embodiments, the functional circuits formed by the interconnect structure 70 may include logic circuits, memory circuits, sense amplifiers, controllers, input/output circuits, image sensor circuits, the like, or combinations thereof. Although FIG. 2 discusses MOS transistors 52 formed over the substrate 50, other active devices (e.g., diodes or the like) and/or passive devices (e.g., capacitors, resistors, or the like) may also be formed as part of the functional circuits.

Figure 3:
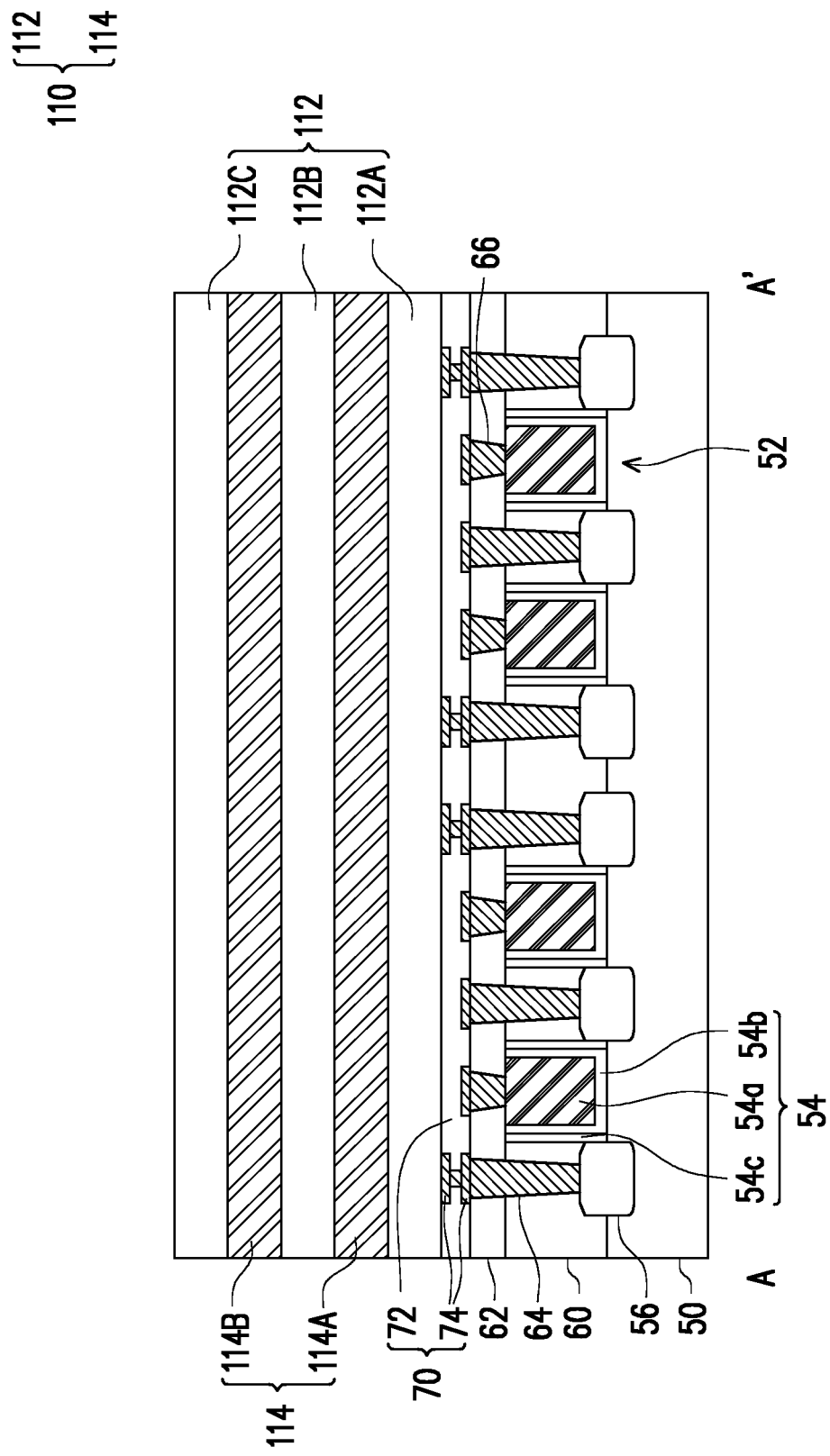

Referring to FIG. 3, a multi-layer stack 110 is formed over the structure of FIG. 2 including the substrate 50, the MOS transistors 52, the first and second ILDs 60 and 62, the source/drain contacts 64, the gate contacts 66 and the interconnect structure 70. The structure of FIG. 2 may be omitted from subsequent drawings for the purposes of simplicity and clarity. Although the multi-layer stack 110 is illustrated as contacting the dielectric layers 72 of the interconnect structure 70, any number of intermediate layers may be disposed between the substrate 50 and the multi-layer stack 110. For example, one or more interconnect layers including conductive features in insulting layers (e.g., low-k dielectric layers) may be disposed between the substrate 50 and the multi-layer stack 110. In some embodiments, the conductive features may be patterned to provide power, ground, and/or signal lines for the active devices on the substrate 50 and/or the 3D memory device 100. In some embodiments, one or more interconnect layers including conductive features in insulting layers (e.g., low-k dielectric layers) may be disposed over the multi-layer stack 110.

In FIG. 3, the multi-layer stack 110 includes a plurality of dielectric layers 112A-112B (collectively referred to as dielectric layers 112) and a plurality of sacrificial layers 114A-114B (collectively referred to as sacrificial layers 114) alternately stacked on one another. Each sacrificial layer 114 may be sandwiched between an underlying dielectric layer 112 and an overlying dielectric layer 112. In other words, the dielectric layers 112 space apart the sacrificial layers 114 from one another. In some embodiments, the sacrificial layers 114 are patterned and replaced in subsequent steps to be described with reference to FIGS. 21 through 23, so as to define conductive lines 116 (which may be functioned as word lines).

In some embodiments, the dielectric layers 112 and the sacrificial layers 114 are made of different materials with different etching selectivities. The materials of the dielectric layers 112 and the sacrificial layers 114 are not particularly limited, as long as said materials renders good etching selectivity between the dielectric layer 112 and the sacrificial layer 114, such that the dielectric layers 112 could remain substantially intact during removal of the sacrificial layers 114 in the subsequent step as to be described with reference to FIGS. 21 through 23. In some embodiments, the materials of the dielectric layers 112 and the sacrificial layers 114 may include dielectric materials, such as inorganic dielectric materials or organic dielectric materials. The inorganic dielectric material may include: a nitride such as silicon nitride or the like; an oxide such as silicon oxide; an oxynitride such as silicon oxynitride; phosphosilicate glass (PSG), borosilicate glass (BSG), boron-doped phosphosilicate glass (BPSG), or the like, or a combination thereof. The organic dielectric material may be a polymer, such as polybenzoxazole (PBO), polyimide, benzocyclobutene (BCB), or the like. In one embodiment, the dielectric layers 112 are made of an oxide (e.g., silicon oxide or the like) and the sacrificial layers 114 are a nitride (e.g., silicon nitride or the like). In some embodiments, the dielectric layers 112 and the sacrificial layers 114 may be formed, by spin coating, lamination, chemical vapor deposition (CVD) atomic layer deposition (ALD), physical vapor deposition (PVD), plasma enhanced CVD (PECVD), or the like.

It is noted that the multi-layer stack 110 illustrated herein is an example, and the numbers of the dielectric layers 112 and the sacrificial layers 114 may not be limited by the disclosure. In some alternative embodiments, more layers of the dielectric layers 112 and more layers of the sacrificial layers 114 may be formed over the substrate 50. In addition, although the multi-layer stack 110 is illustrated as having the dielectric layers as topmost and bottommost layers, the disclosure is not limited thereto. In some alternative embodiments, at least one of the topmost and bottommost layers of the multi-layer stack is a sacrificial layer.

FIGS. 4 through 8 are views of intermediate stages in the manufacturing of a staircase structure of the 3D memory device 100, in accordance with some embodiments. FIGS. 4 through 8 are illustrated along reference cross-section A-A' illustrated in FIG. 1A.

Figure 4:
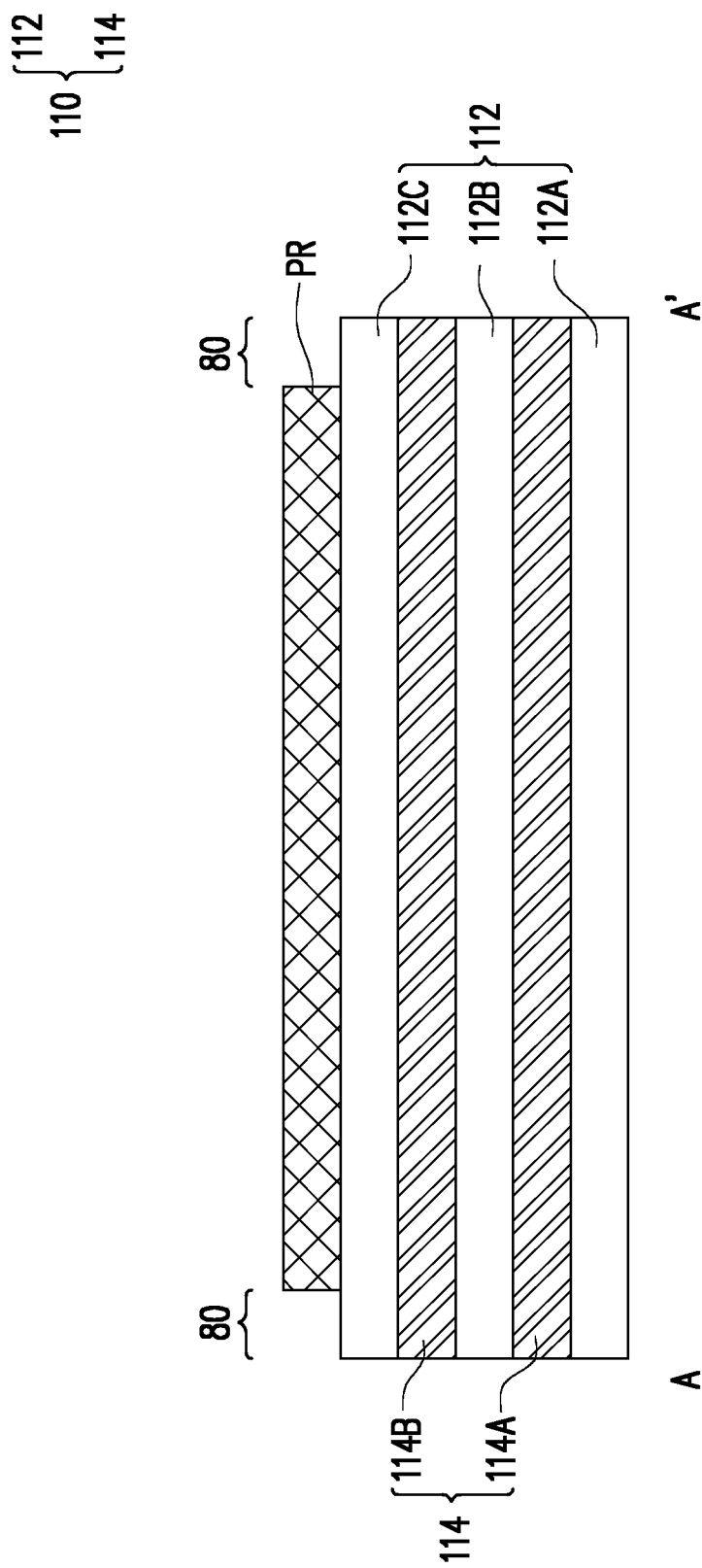

Referring to FIG. 4, a photoresist PR is formed over the multi-layer stack 110. In some embodiments, the photoresist PR is formed by a spin-on technique and patterned by an acceptable photolithography technique. Patterning the photoresist PR may expose the multi-layer stack 110 in regions 80, while masking remaining portions of the multi-layer stack 110. For example, a topmost layer of the multi-layer stack 110 (e.g., the dielectric layer 112C) may be exposed in the regions 80.

Figure 5:
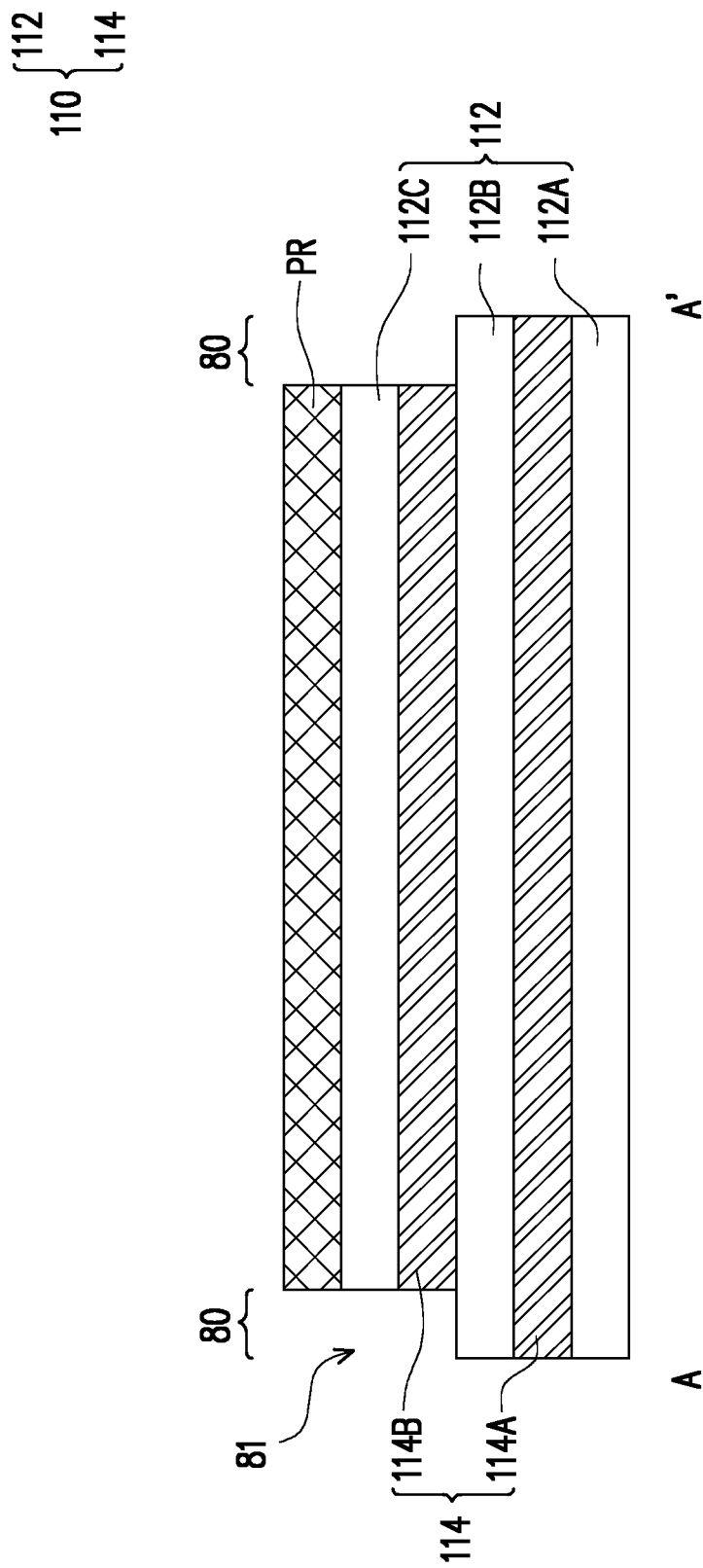

Referring to FIG. 5, the exposed portions of the multi-layer stack 110 in the regions 80 are etched using the photoresist PR as a mask. The etching may be any acceptable etching process, such as a dry etch (e.g., a reactive ion etch (RIE), a neutral beam etch (NBE), the like), a wet etch, the like, or a combination thereof. The etching may be anisotropic. The etching may remove portions of the dielectric layer 112C and the sacrificial layer 114B in the regions 80 and define openings 81. Because the dielectric layer 112C and the sacrificial layer 114B have different material compositions, etchants used to remove exposed portions of these layers may be different. In some embodiments, the sacrificial layer 114B acts as an etch stop layer while etching the dielectric layer 112C, and the dielectric layer 112B acts as an etch stop layer while etching sacrificial layer 114B. As a result, the portions of the dielectric layer 112C and the sacrificial layer 114B may be selectively removed without removing remaining layers of the multi-layer stack 110, and the openings 81 may be extended to a desired depth. Alternatively, a time-mode etching process may be used to stop the etching of the openings 61 after the openings 61 reach a desired depth. In the resulting structure, the dielectric layer 112B is exposed in the regions 80.

Figure 6:
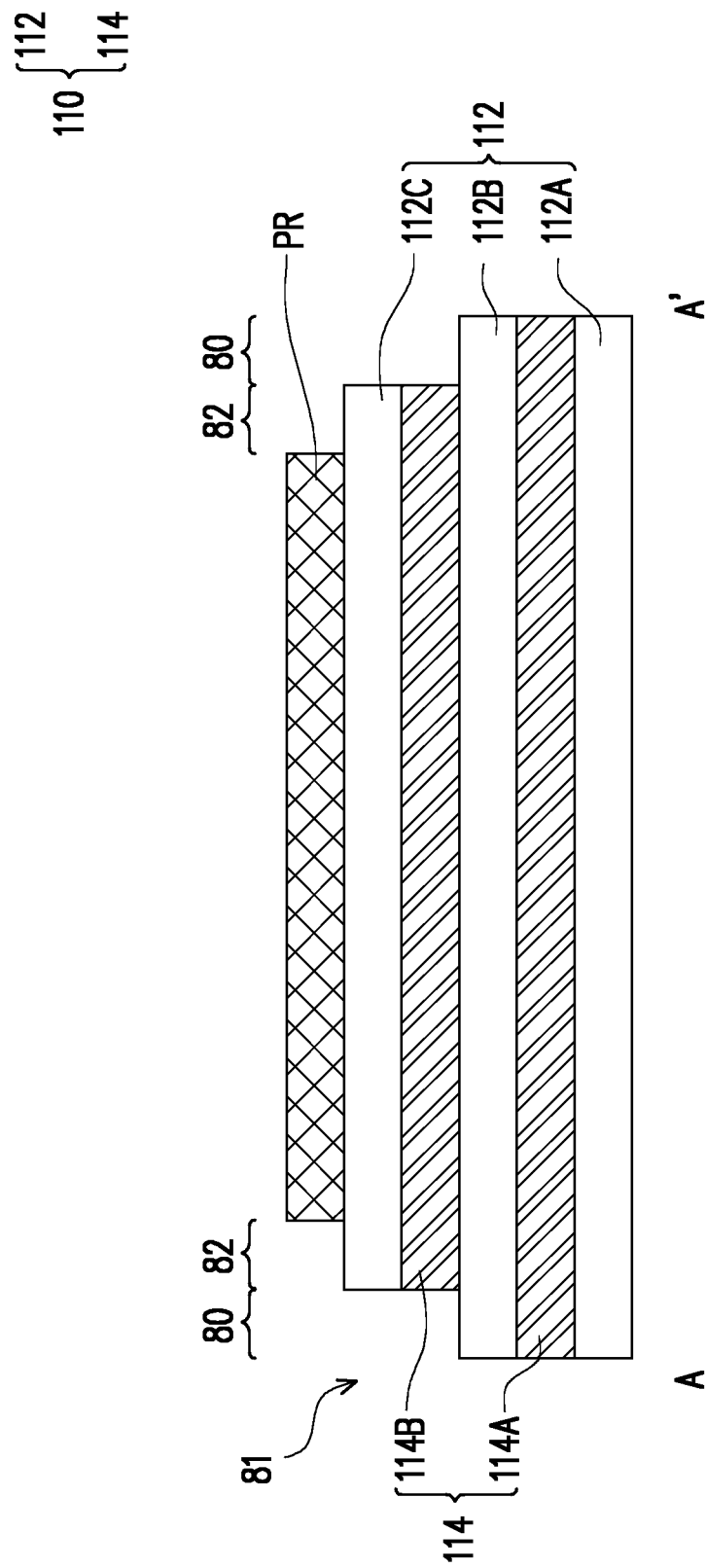

Referring to FIG. 6, the photoresist PR is trimmed to expose additional portions of the multi-layer stack 110. In some embodiments, the photoresist PR is trimmed by using an acceptable removing technique such as a lateral etching. As a result of the trimming, a width of the photoresist PR is reduced and portions the multi-layer stack 110 in the regions 80 and regions 82 may be exposed. For example, top surfaces of the dielectric layer 112B may be exposed in the regions 80, and top surfaces of the dielectric layer 112C may be exposed in the regions 62.

Figure 7:
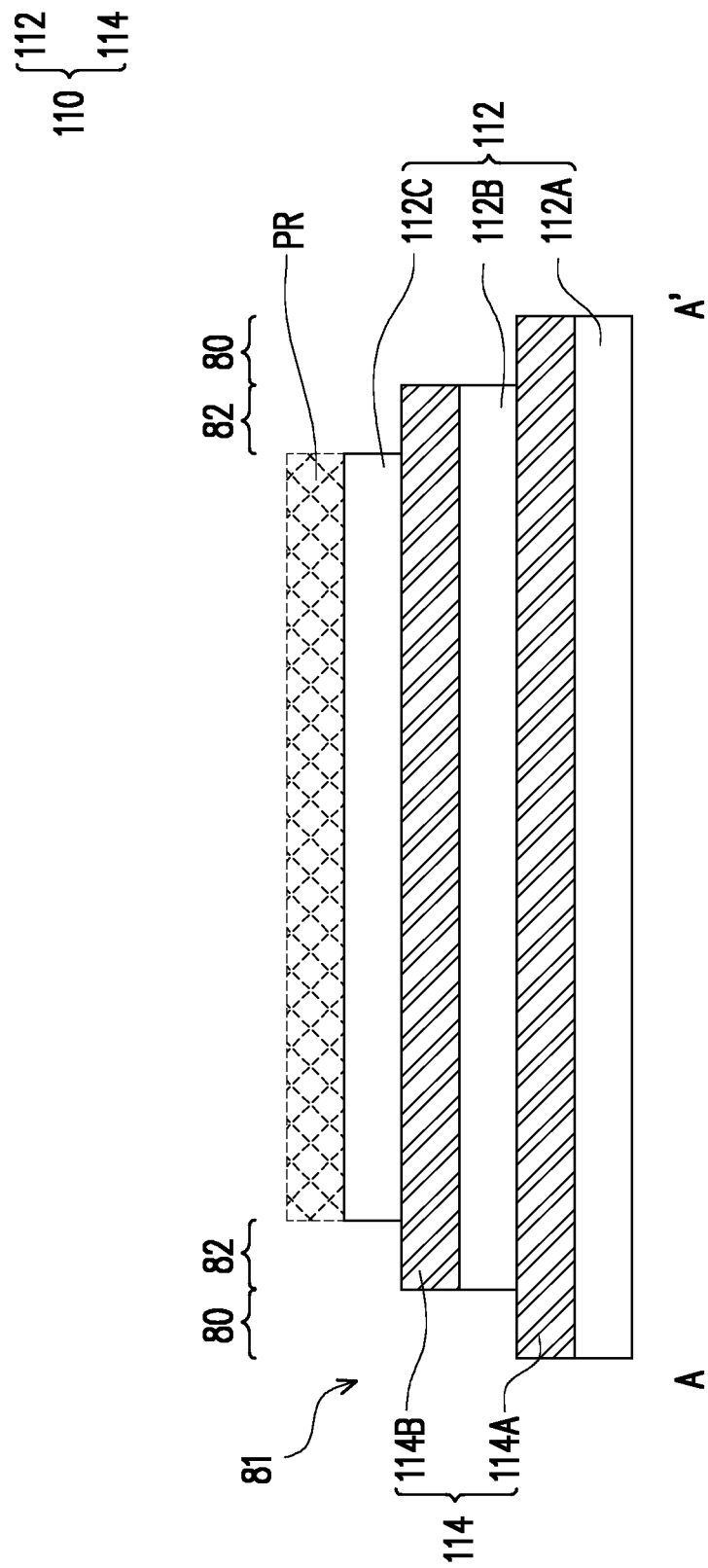

Referring to FIG. 7, portions of the dielectric layers 112C and 112B in the regions 80 and the regions 82 are removed by acceptable etching processes using the photoresist PR as a mask. The etching may be any acceptable etching process, such as a dry etch (e.g., RIE, NBE, the like), a wet etch, the like, or a combination thereof. The etching may be anisotropic. The etching may extend the openings 81 further into the multi-layer stack 110. In some embodiments, portions of the dielectric layers 112C and 112B in the regions 82 and 80 are removed by using the photoresist PR as a mask and using the underlying sacrificial layers 114B and 114A as etch stop layers. In the resulting structure, the sacrificial layer 114A is exposed in the regions 80, and the sacrificial layer 114B is exposed in the regions 82. Thereafter, the photoresist PR may be removed by an acceptable ashing or wet strip process.

Figure 8:
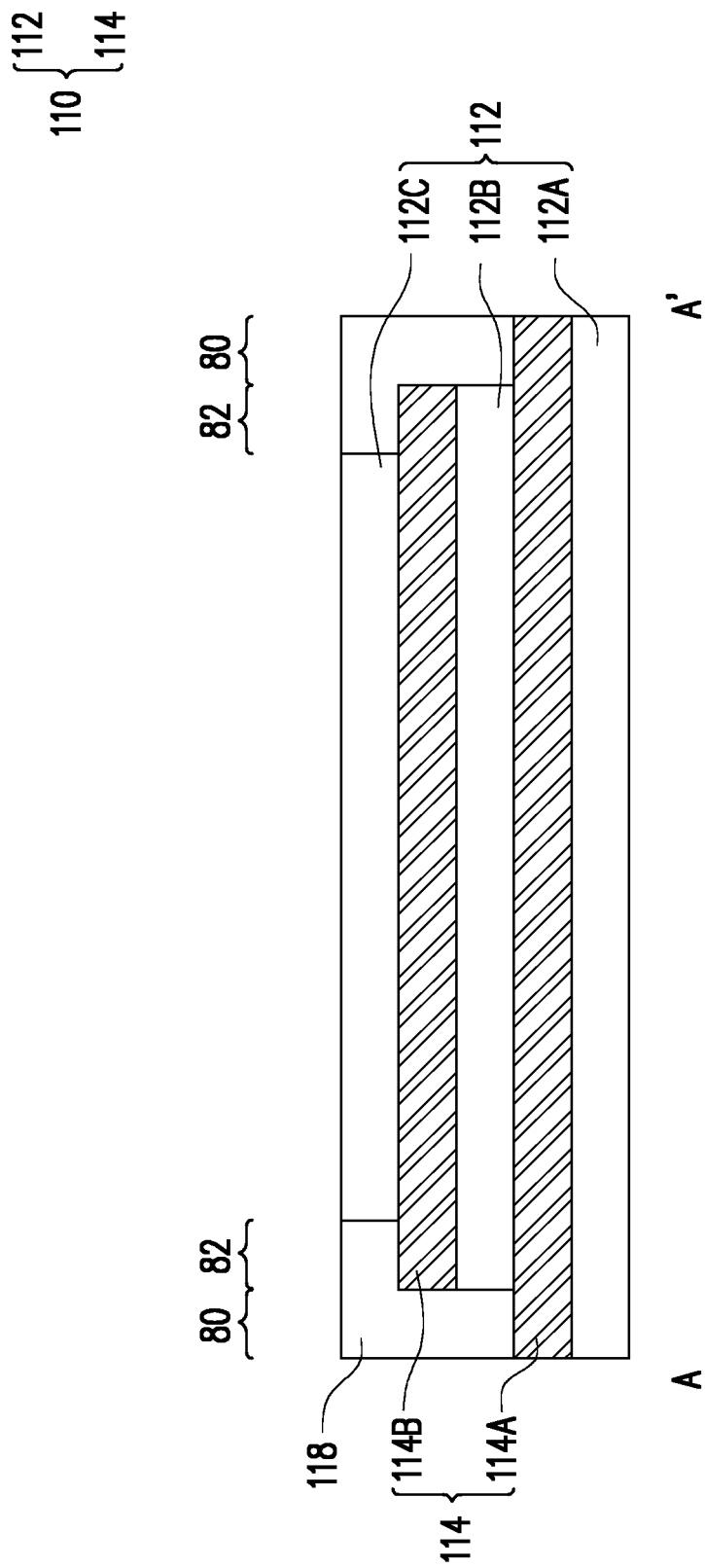

Referring to FIG. 8, an inter-metal dielectric (IMD) 118 is deposited over the staircase structure of the multi-layer stack 110. The IMD 118 may be formed of a dielectric material, and may be deposited by any suitable method, such as CVD, PECVD, flowable CVD (FCVD), or the like. The dielectric materials may include phospho-silicate glass (PSG), borosilicate glass (BSG), boron-doped phospho-silicate glass (BPSG), undoped silicate glass (USG), or the like. In some embodiments, the IMD 118 may include an oxide (e.g., silicon oxide or the like), a nitride (e.g., silicon nitride or the like), a combination thereof or the like. Other dielectric materials formed by any acceptable process may be used. The IMD 118 extends along sidewalls of the sacrificial layer 114B and sidewalls of the dielectric layers 112B-112C. Further, the IMD 118 may be in contact with top surfaces of the sacrificial layers 114A-114B.

In some embodiments, the IMD 118 is formed by depositing a dielectric material over the multi-layer stack 110 to completely fill the openings 81. After the dielectric material is formed, a planarization process (e.g., chemical mechanical planarization (CMP), etch back, the like, or the combination) may be performed to remove excessive portions of the dielectric material from the upper surface of the multi-layer stack 110, thereby forming the IMD 118. The planarization process exposes the multi-layer stack 110 such that top surfaces of the multi-layer stack 110 and IMD 118 are level after the planarization process is completed.

As shown in FIG. 8, an intermediate and bulk staircase structure is thus formed. The intermediate staircase structure includes alternating stacked layers of sacrificial layers 114 and dielectric layers 112. The sacrificial layers 114 are subsequently replaced with conductive lines 116, which will be described in details in FIGS. 21 through 23. Lower conductive lines 116 are longer and extend laterally past upper conductive lines 116, and a length of each of the conductive lines 116 increases in a direction towards the substrate 50 (see FIG. 1A). The staircase structure may be omitted from subsequent drawings for the purposes of simplicity and clarity.

FIGS. 9 through 16 are views of intermediate stages in the manufacturing of channel regions of the 3D memory device 100, in accordance with some embodiments. FIGS. 9 through 16 are illustrated in a partial three-dimensional view.

Figure 9:
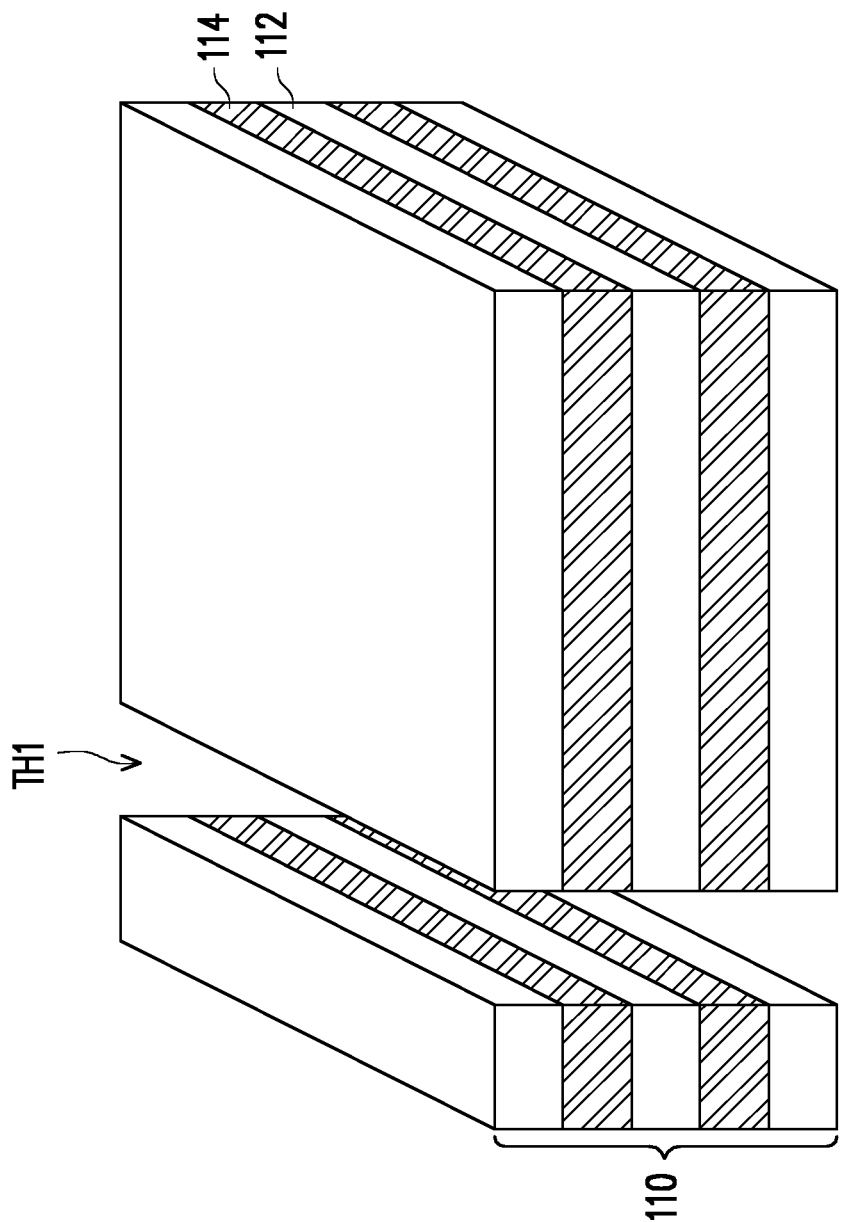

Referring to FIG. 9, the multi-layer stack 110 is patterned to form a trench TH1. In some embodiments, the trench TH1 penetrates through the multi-layer stack 110, and the trench TH1 exposes sidewalls of the multi-layer stack 110. In other words, the trench TH1 exposes sidewalls of the dielectric layers 112 and sidewalls of the sacrificial layers 114. In some embodiments, the trench TH1 is formed by using one or more etching process, such as by a dry etch (e.g., RIE, NBE, the like), a wet etch, the like, or a combination thereof. The etching may be anisotropic. A mask pattern, such as a patterned photoresist, may be formed on the multi-layer stack 110. The one or more etching process may then be performed by using the mask pattern as an etching mask to form the trench TH1. After the etching process is finished, the mask pattern (e.g., patterned photoresist) may be removed by a suitable removal process, such as ashing or stripping.

Figure 10:
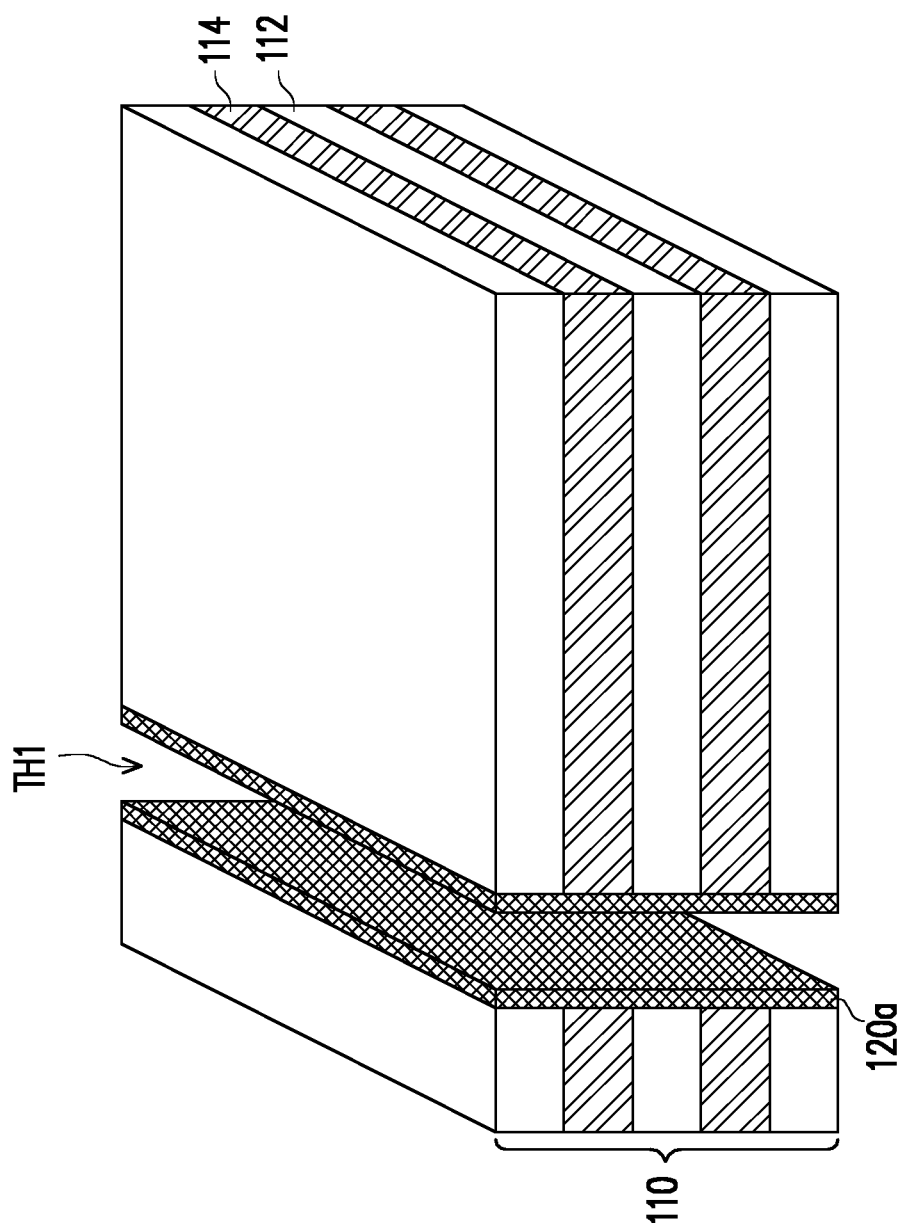

Referring to FIG. 9 and FIG. 10, a ferroelectric layer 120a is formed in the trench TH1 to cover the sidewalls of the trench TH1. In some embodiments, the ferroelectric layer 120a is formed by depositing a ferroelectric material that conformally covers the bottom and sidewalls of the trench TH1, and further covers the upper surface of the multi-layer stack 110; and then performing an anisotropic etching process to remove the ferroelectric material on the bottom of the trench TH1 and on the upper surface of the multi-layer stack 110. In some embodiments, the method of forming the ferroelectric layer 120a includes performing a suitable deposition technique, such as CVD, PECVD, metal oxide chemical vapor deposition (MOCVD), ALD, or the like.

Figure 11:
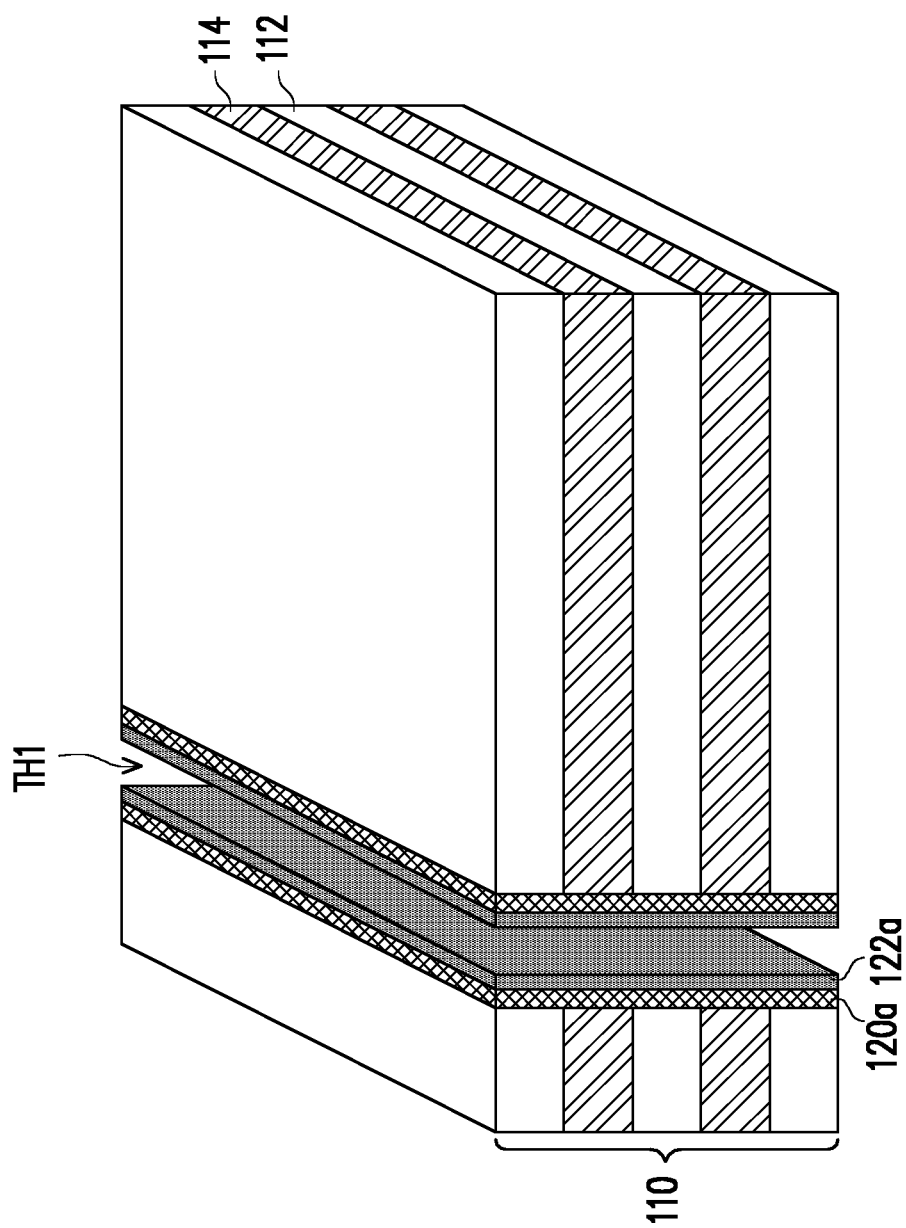

Referring to FIG. 10 and FIG. 11, a channel layer 122a is formed in the trench TH1 to cover the ferroelectric layer 120a. In some embodiments, the channel layer 122a is formed by depositing a channel material that conformally covers the ferroelectric layer 120a and the bottom of the trench TH1, and further covers the upper surface of the multi-layer stack 110; and then performing an anisotropic etching process to remove the channel material on the bottom of the trench TH1 and on the upper surface of the multi-layer stack 110. In some embodiments, the method of forming the channel layer 122a includes performing a suitable deposition technique, such as CVD, PVD, ALD, PECVD, or the like.

Figure 12:
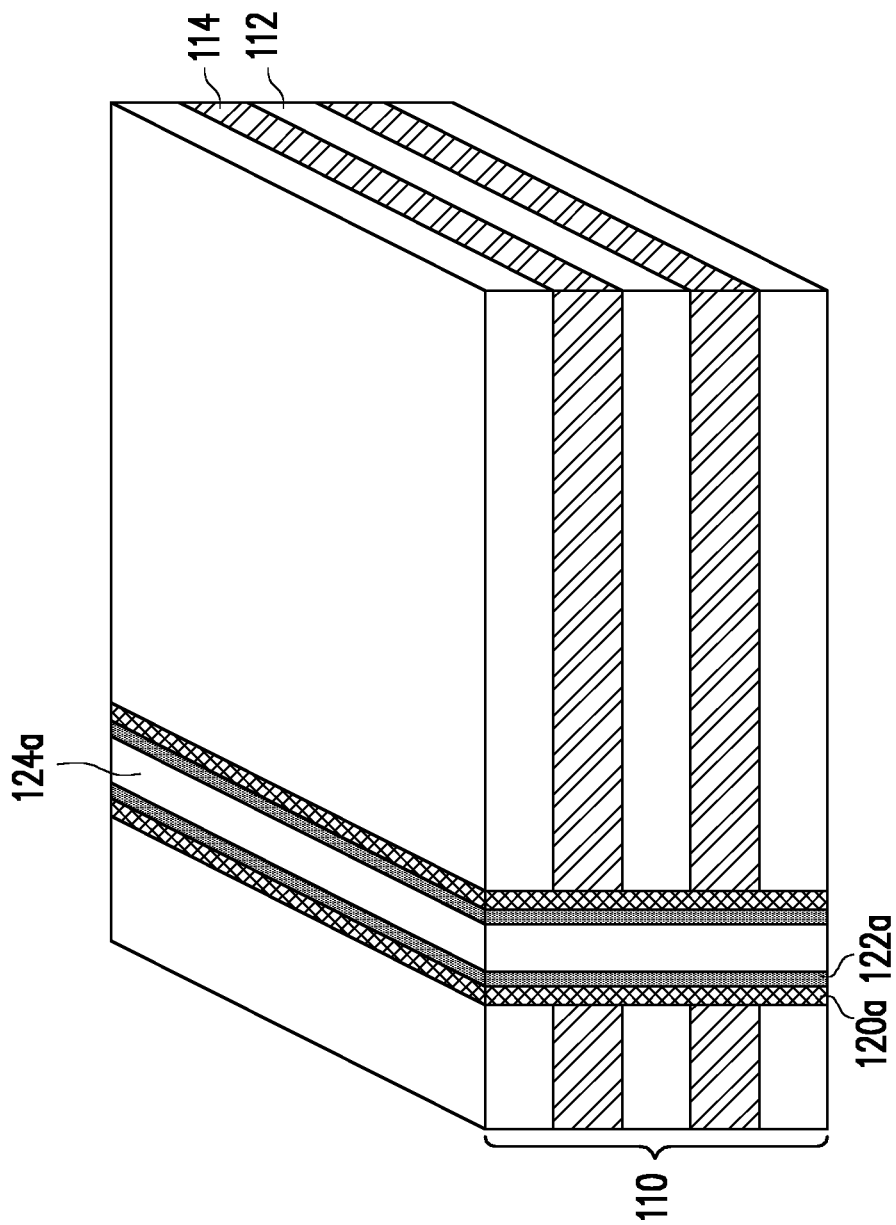

Referring to FIG. 11 and FIG. 12, a dielectric layer 124a is formed to fill up the trench TH1. In some embodiments, the dielectric layer 124a is formed by depositing a dielectric material that completely fills the trench TH1. After the dielectric material is formed, a planarization process (e.g., a chemical mechanical planarization (CMP), etch back, the like, or the combination) may be performed to remove excessive portions of the dielectric material from the upper surface of the multi-layer stack 110, thereby forming the dielectric layer 124a. After the planarization process, top surfaces of the multi-layer stack 110 (e.g., the dielectric layer 112C), the ferroelectric layer 120a, the channel layer 122a and the dielectric layer 124a may be substantially level (e.g., within process variations). In some embodiments, the method of forming the dielectric layer 124a includes performing a suitable deposition technique, such as CVD, PVD, ALD, PECVD, or the like.

Figure 13:
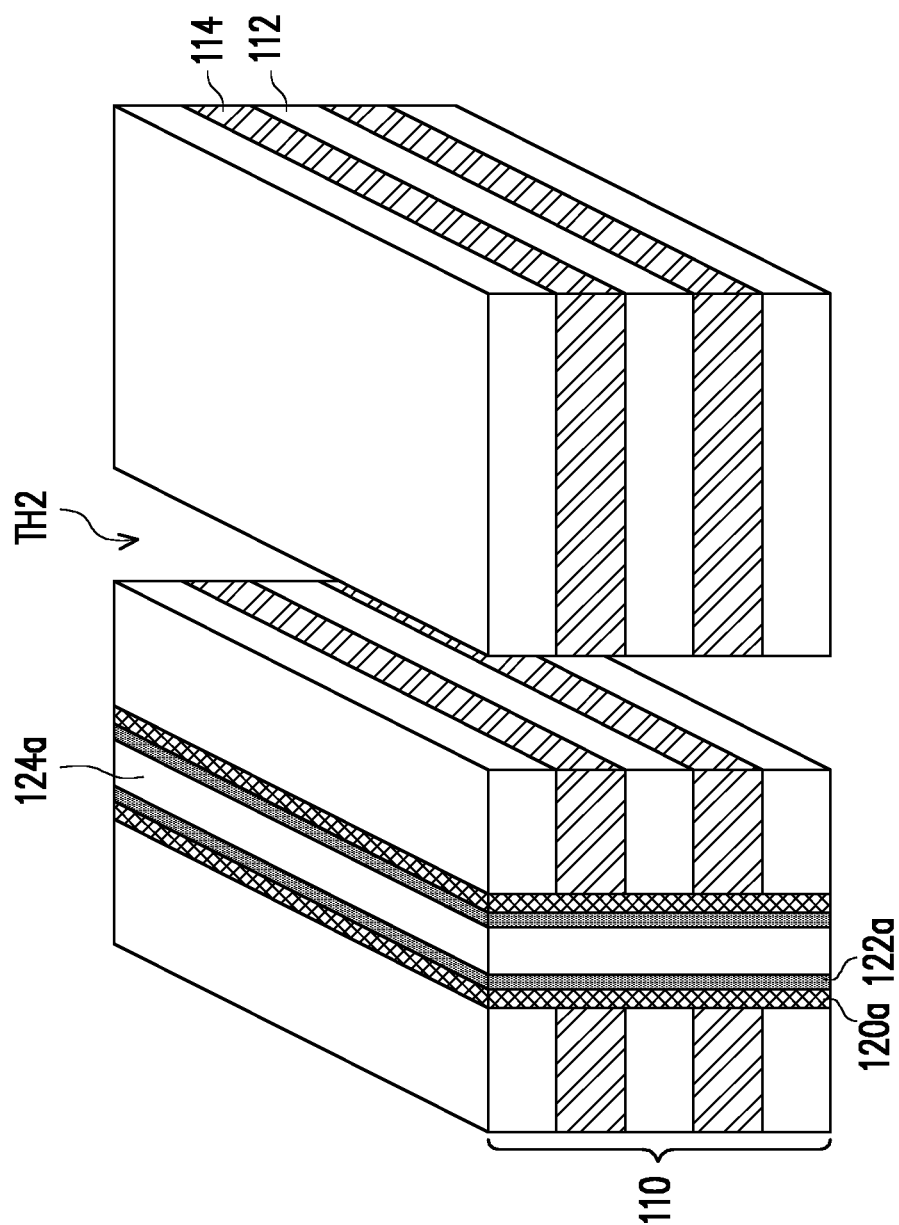

Referring to FIG. 13, the multi-layer stack 110 is further patterned to form a trench TH2 adjacent to the first trench TH1. The method of forming the trench TH2 may be the same as or similar to that of forming the trench TH1, and thus detailed descriptions are not repeated here.

Figure 14:
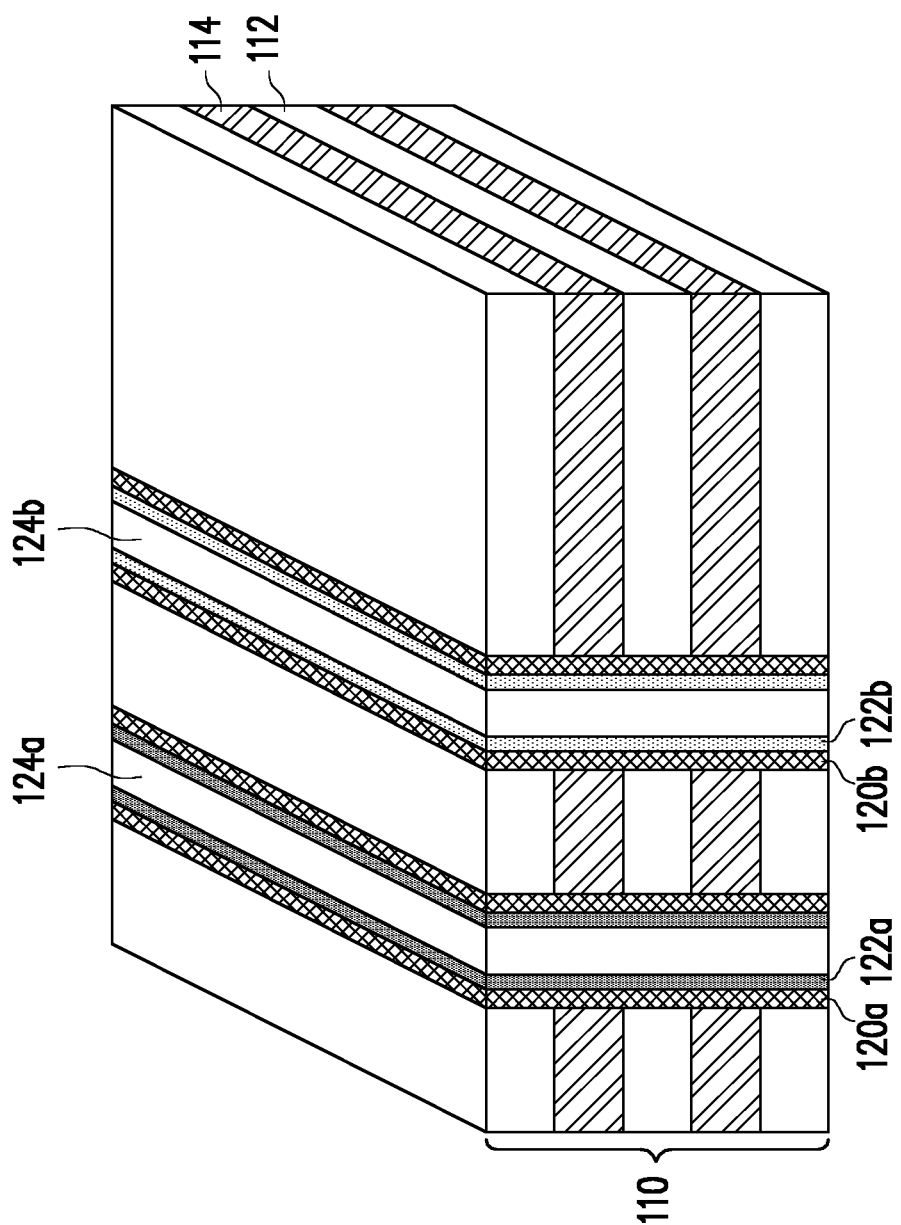

Referring to FIG. 13 and FIG. 14, a ferroelectric layer 120b, a channel layer 122b, and a dielectric layer 124b are formed in the trench TH2 in sequence. In some embodiments, the ferroelectric layer 120b is first formed to cover the sidewalls of the trench TH2. Next, the channel layer 122b is formed in the trench TH2 to cover the ferroelectric layer 120b. Thereafter, the dielectric layer 124b is formed to fill up the trench TH2. The methods of forming the ferroelectric layer 120b, the channel layer 122b, and the dielectric layer 124b may be the same as or similar to those of the ferroelectric layer 120a, the channel layer 122a, and the dielectric layer 124a, and thus detailed descriptions are not repeated here. After the ferroelectric layer 120b, the channel layer 122b, and the dielectric layer 124b are formed, top surfaces of the multi-layer stack 110 (e.g., the dielectric layer 112C), the ferroelectric layers 120a and 120b, the channel layers 122a and 122b and the dielectric layers 124a and 124b may be substantially level (e.g., within process variations).

Figure 15:
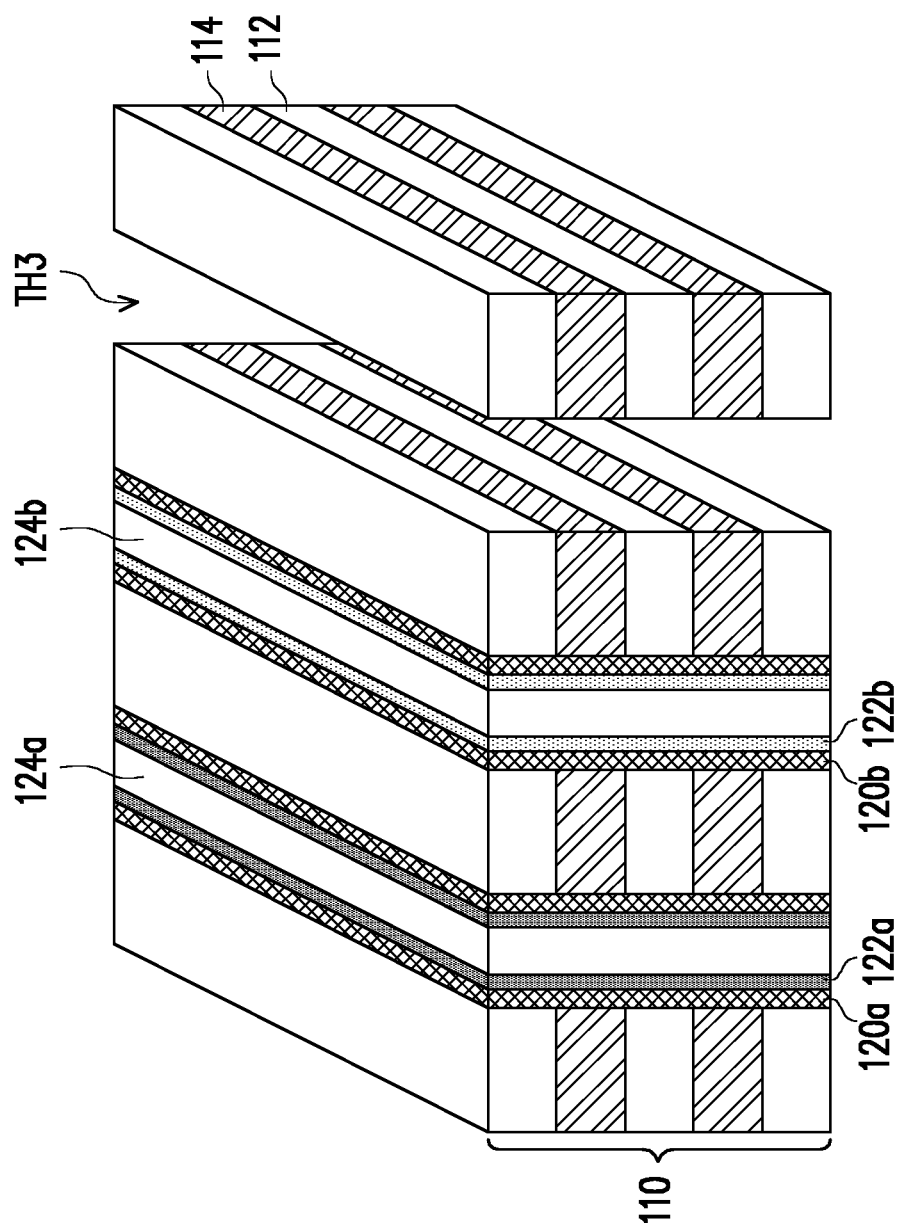

Referring to FIG. 15, the multi-layer stack 110 is further patterned to form a trench TH3 adjacent to the first trench TH2. The method of forming the trench TH3 may be the same as or similar to that of forming the trench TH1, and thus detailed descriptions are not repeated here.

Figure 16:
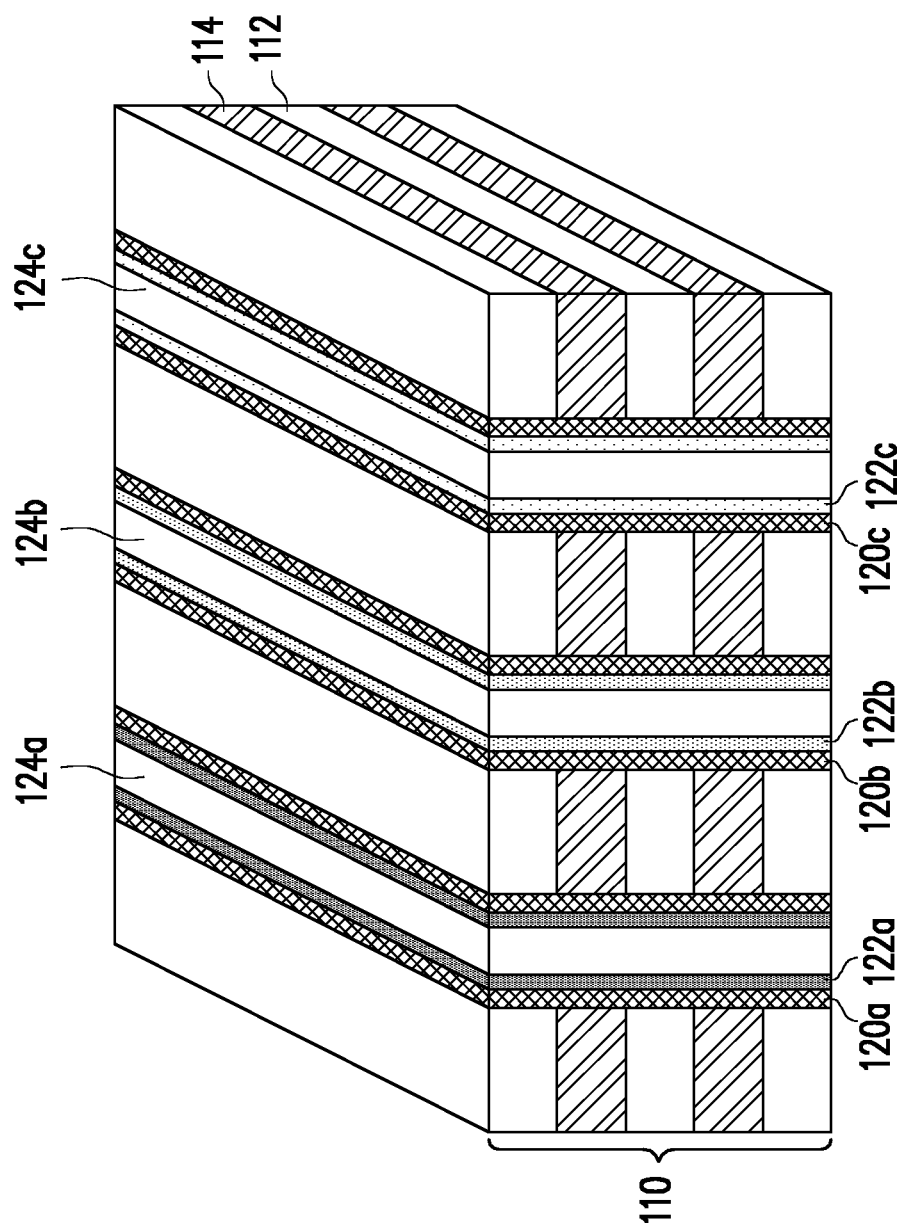

Referring to FIG. 15 and FIG. 16, a ferroelectric layer 120c, a channel layer 122c, and a dielectric layer 124c are formed in the trench TH3 in sequence. In some embodiments, the ferroelectric layer 120c is first formed to cover the sidewalls of the trench TH3. Next, the channel layer 122c is formed in the trench TH3 to cover the ferroelectric layer 120c. Thereafter, the dielectric layer 124c is formed to fill up the trench TH3. The methods of forming the ferroelectric layer 120c, the channel layer 122c, and the dielectric layer 124c may be the same as or similar to those of the ferroelectric layer 120a, the channel layer 122a, and the dielectric layer 124a, and thus detailed descriptions are not repeated here. After the ferroelectric layer 120c, the channel layer 122c, and the dielectric layer 124c are formed, top surfaces of the multi-layer stack 110 (e.g., the dielectric layer 112C), the ferroelectric layers 120a, 120b and 120c, the channel layers 122a, 122b and 122c and the dielectric layers 124a, 124b and 124c may be substantially level (e.g., within process variations).

In some embodiments, the ferroelectric layers 120a, 120b and 120c may include materials that are capable of switching between two different polarization directions by applying an appropriate voltage differential across the ferroelectric layer 120a. For example, the ferroelectric layers 120a, 120b and 120c may include a high-k dielectric material, such as a hafnium (Hf) based dielectric materials or the like. In some embodiments, the ferroelectric layers 120a, 120b and 120c include hafnium oxide, hafnium zirconium oxide, silicon-doped hafnium oxide, or the like. In some embodiments, the ferroelectric layers 120a, 120b and 120c may include barium titanium oxide (BaTiO$_3$), lead titanium oxide (PbTiO$_3$), lead zirconium oxide (PbZrO$_3$), lithium niobium oxide (LiNbO$_3$), sodium niobium oxide (NaNbO$_3$), potassium niobium oxide (KNbO$_3$), potassium tantalum oxide (KTaO$_3$), bismuth scandium oxide (BiScO$_3$), bismuth iron oxide (BiFeO$_3$), hafnium erbium oxide (Hf$_{1-x}$Er$_x$O), hafnium lanthanum oxide (Hf$_{1-x}$La$_x$O), hafnium yttrium oxide (Hf$_{1-x}$Y$_x$O), hafnium gadolinium oxide (Hf$_{1-x}$Gd$_x$O), hafnium aluminum oxide (Hf$_{1-x}$Al$_x$O), hafnium zirconium oxide (Hf$_{1-x}$Zr$_x$O, HZO), hafnium titanium oxide (Hf$_{1-x}$Ti$_x$O), hafnium tantalum oxide (Hf$_{1-x}$Ta$_x$O), or the like. In some embodiments, materials of the ferroelectric layers 120a, 120b and 120c may be the same as or similar to each other.

In some embodiments, the materials of the channel layers 122a, 122b and 122c include oxide semiconductor (OS) such as zinc oxide (ZnO), indium tungsten oxide (InWO), indium gallium zinc oxide (InGaZnO, IGZO), indium zinc oxide (InZnO), indium tin oxide (ITO), combinations thereof, or the like. In some embodiments, the channel layers 122a, 122b and 122c include polycrystalline silicon (poly-Si), amorphous silicon (a-Si), or the like. In some embodiments, materials of the channel layers 122a, 122b and 122c may be similar to or different from each other, and the materials of the channel layers 122a, 122b and 122c have different electron mobilities from each other. As a result of different electron mobilities, when an appropriate voltage (e.g., higher than a threshold voltage ($V_{th}$) of the memory cells 140) is applied through the conductive lines 116 (see FIG. 1A), the channel layers 122a, 122b and 122c may allow currents with different values to flow between the conductive pillars 130a and 130b. In other words, the currents flowing in the channel layers 122a, 122b and 122c may be different from each other. In some embodiments, the material of the channel layer 122b is chosen to have an electron mobility about two times the electron mobility of the channel layer 122a, and the material of the channel layer 122c is chosen to have an electron mobility about two times the electron mobility of the channel layer 122b (i.e., about four times the electron mobility of the channel layer 122a), such that the current flowing in the channel layer 122b is about two times the current flowing in the channel layer 122a, and the current flowing in the channel layer 122c is about two times the current flowing in the channel layer 122b (i.e., about four times the current flowing in the channel layer 122a). For example, in one embodiment, the channel layer 122a includes indium gallium zinc oxide (InGaZnO, IGZO) which has an electron mobility ranging from about 10 cm$^2$/Vs to about 20 cm$^2$/Vs; the channel layer 122b includes indium-rich IGZO or Mg-doped IGZO which has an electron mobility ranging from about 20 cm$^2$/Vs to about 40 cm$^2$/Vs; and the channel layer 122c includes c-axis aligned crystalline (CAAC) IGZO which has an electron mobility ranging from about 40 cm2/Vs to about 80 cm2/Vs. Noted that if the channel layer 122a includes IGZO and the channel layer 122b includes indium-rich IGZO, the ratio of indium to the other compositions in the channel layer 122b is greater than the ratio of indium to the other compositions in the channel layer 122a.

In some embodiments, the materials of the dielectric layers 124a, 124b and 124c include silicon oxide, silicon nitride, silicon oxynitride, or the like. In some embodiments, the materials of the dielectric layers 124a, 124b, 124c may be the same as or similar to each other.

As shown in FIG. 16, the trenches TH1, TH2, TH3 extend through the bulk multi-layer stack 110, and strip-shaped sacrificial layers 114 and strip-shaped dielectric layers 112 are accordingly defined. In addition, the trenches TH1, TH2, TH3 extend through the bulk staircase structure, and strip-shaped staircase structures are accordingly defined.

Although three trenches (i.e., the first, second and third trenches TH1, TH2 and TH3) are depicted in FIG. 16, more than three trenches laterally spaced apart from each other may be formed. For example, a plurality of first trenches TH1 may be formed in the multi-layer stack 110, and then the ferroelectric layer 120a, the channel layer 122a and the dielectric layer 124a may be formed in the plurality of first trenches TH1. Next, a plurality of second trenches TH2 may be formed in the multi-layer stack 110, and then the ferroelectric layer 120b, the channel layer 122b and the dielectric layer 124b are formed in the plurality of second trenches TH2. Thereafter, a plurality of third trenches TH3 may be formed in the multi-layer stack 110, and then the ferroelectric layer 120c, the channel layer 122c and the dielectric layer 124c are formed in the plurality of third trenches TH3. The first trenches TH1, the second trenches TH2 and the third trenches TH3 may be arranged in sequence or may be arranged alternately.

Figure 17A:
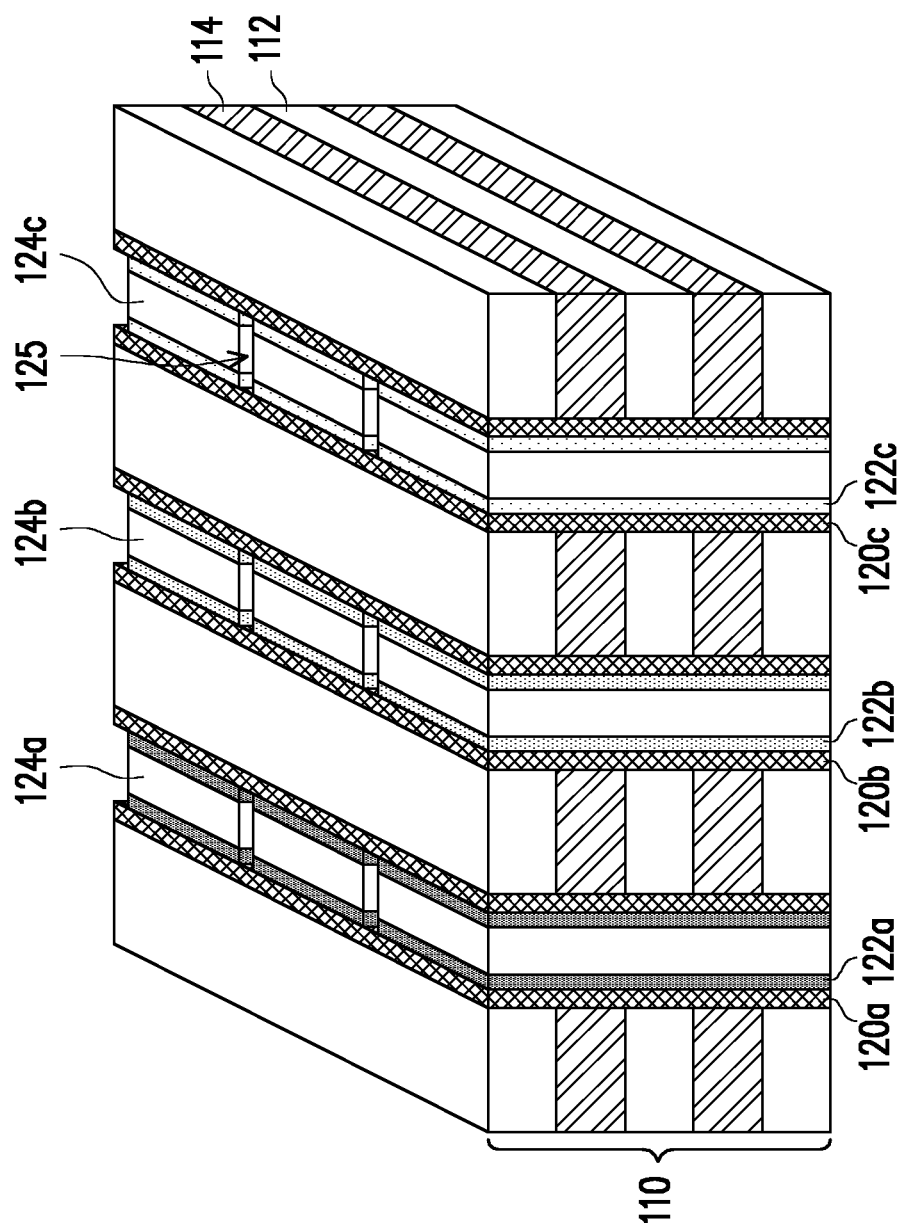
Figure 17B:
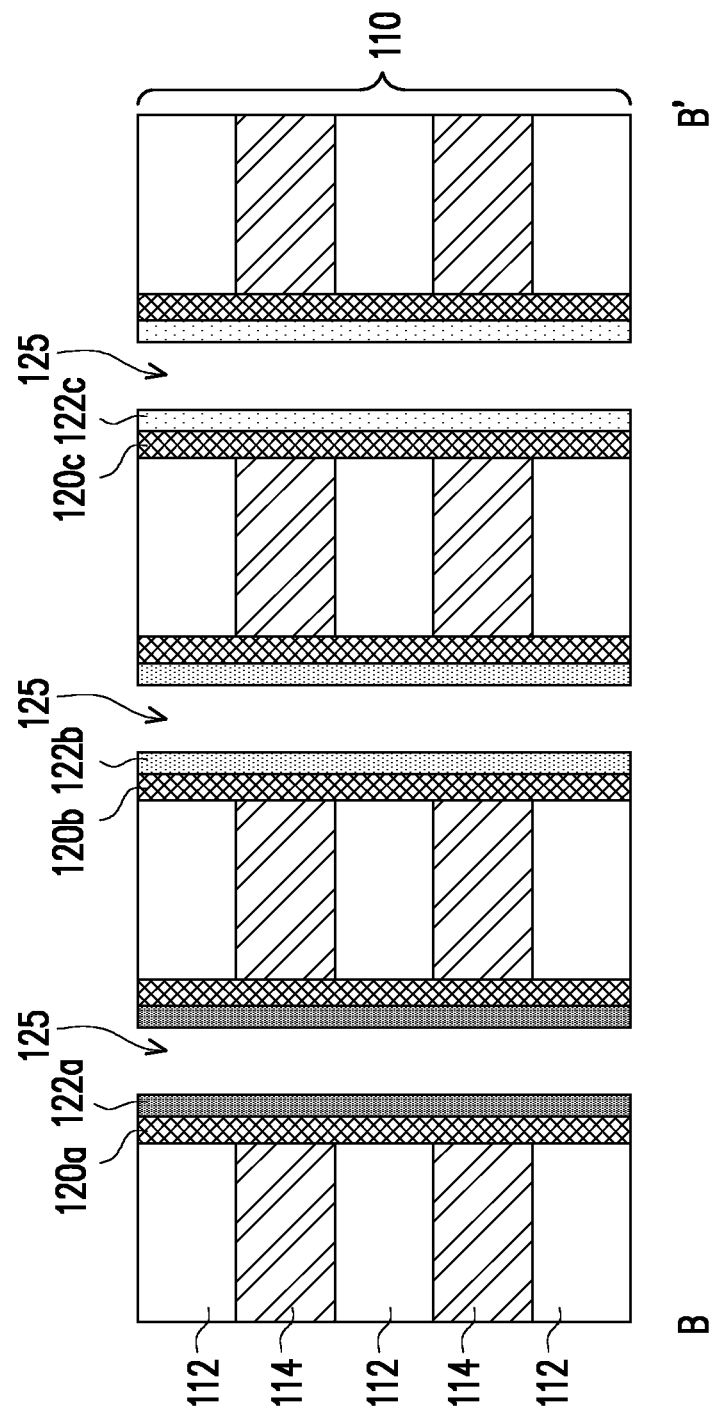
Figure 18A:
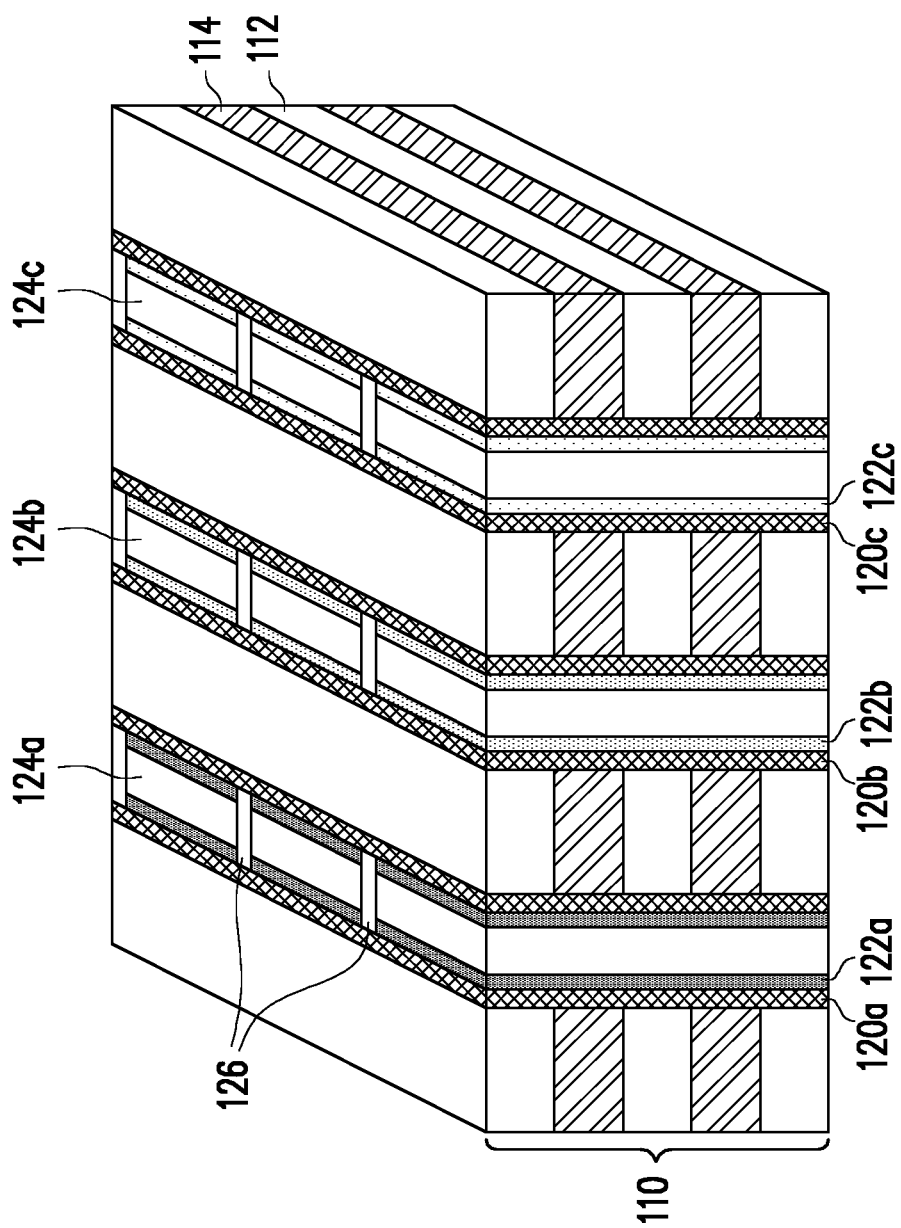
Figure 18B:
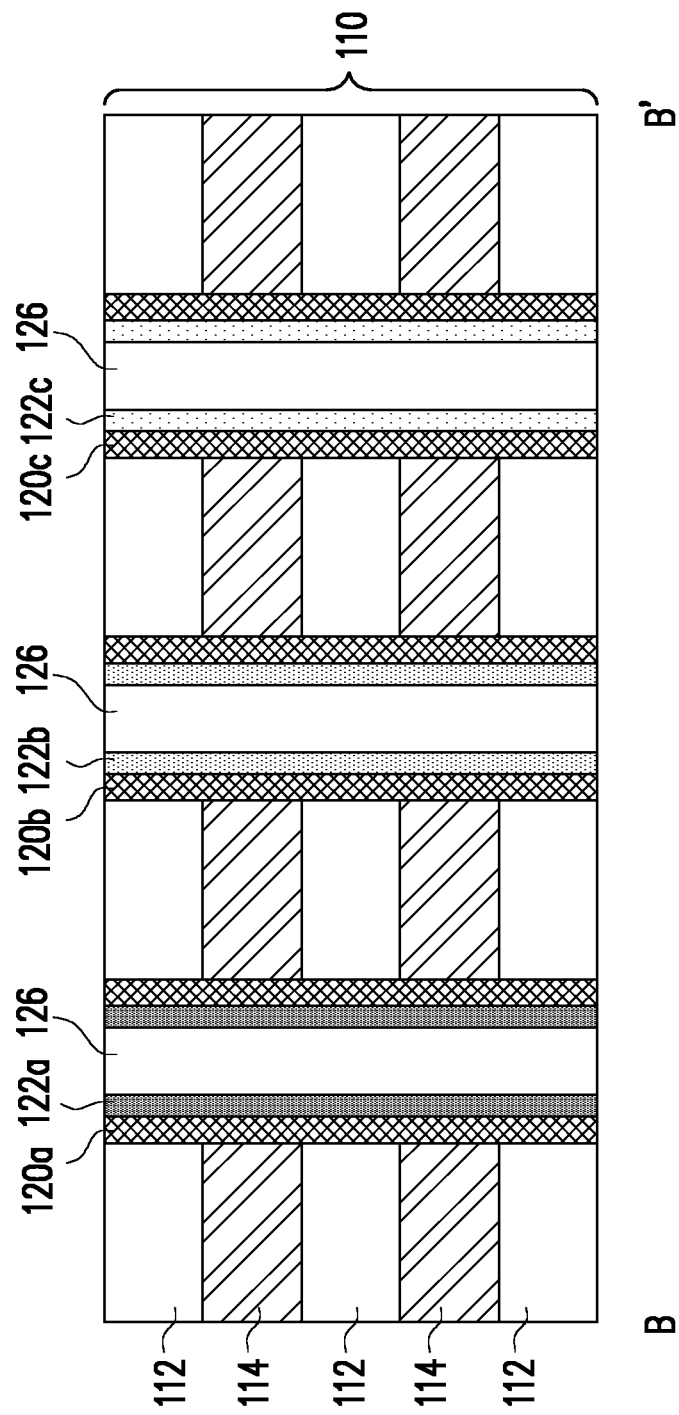
Figure 19A:
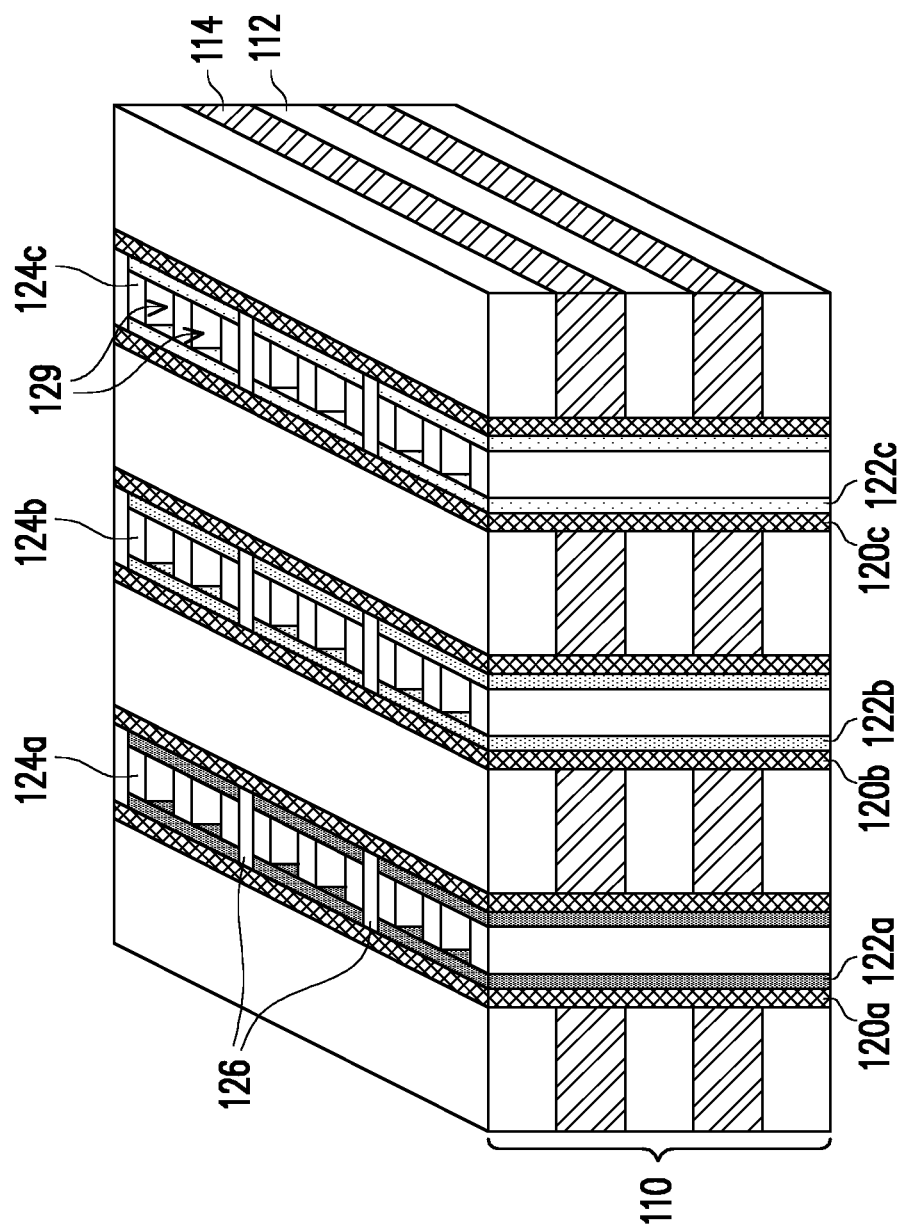
Figure 19B:
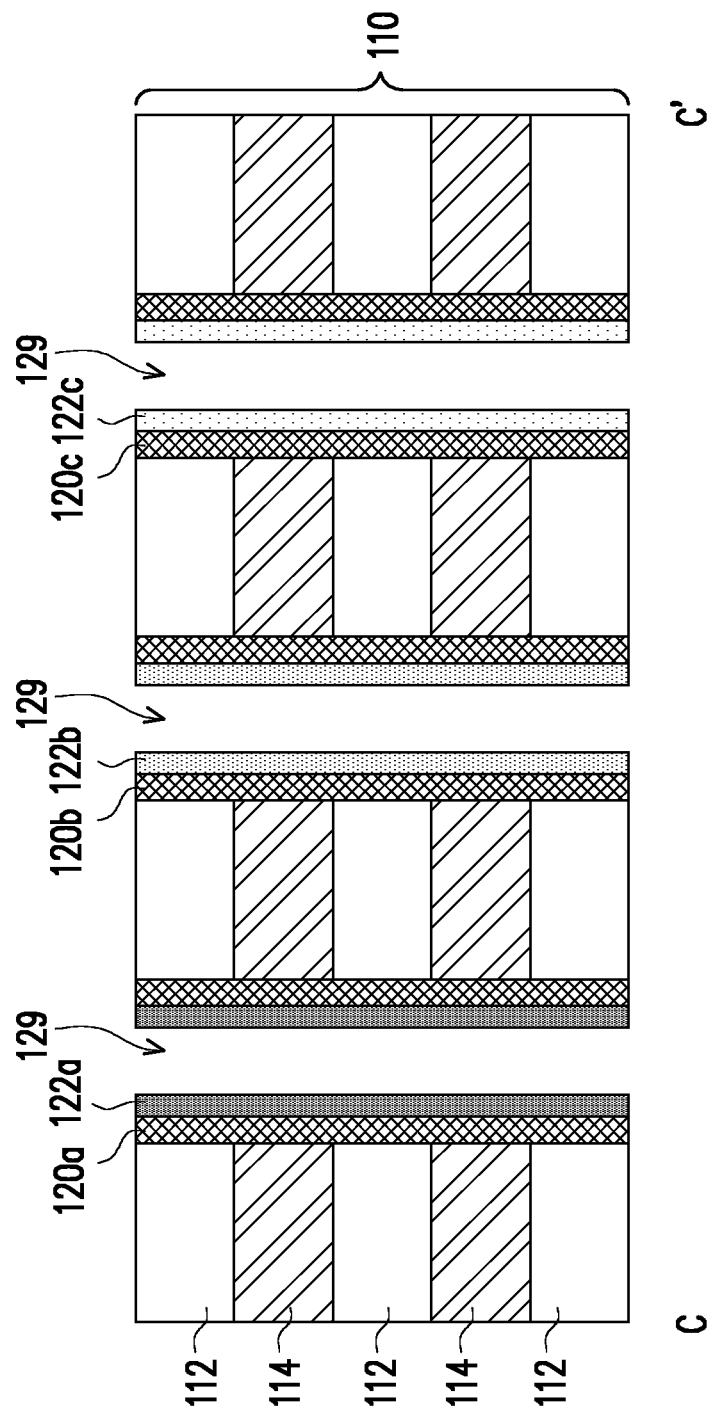
Figure 20A:
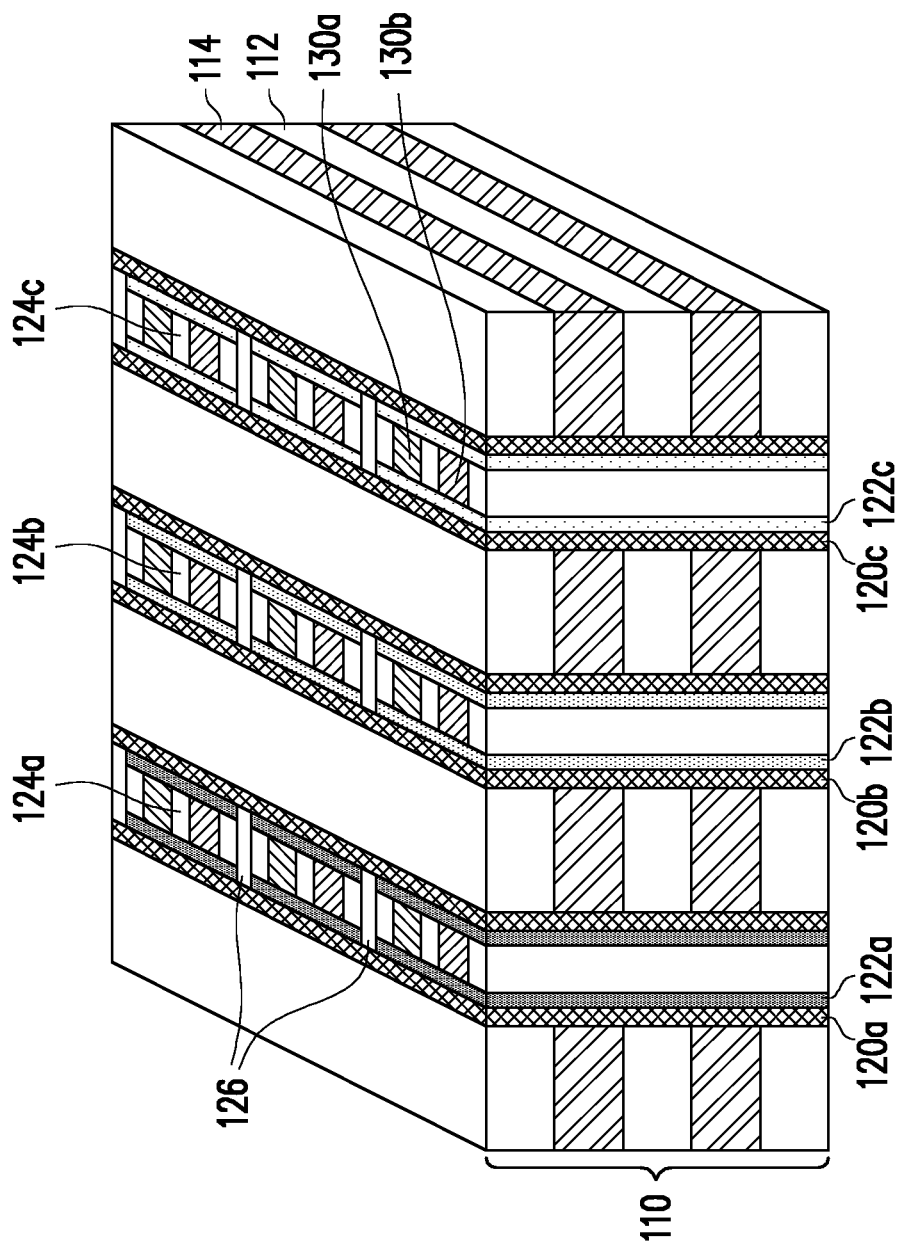
Figure 20B:
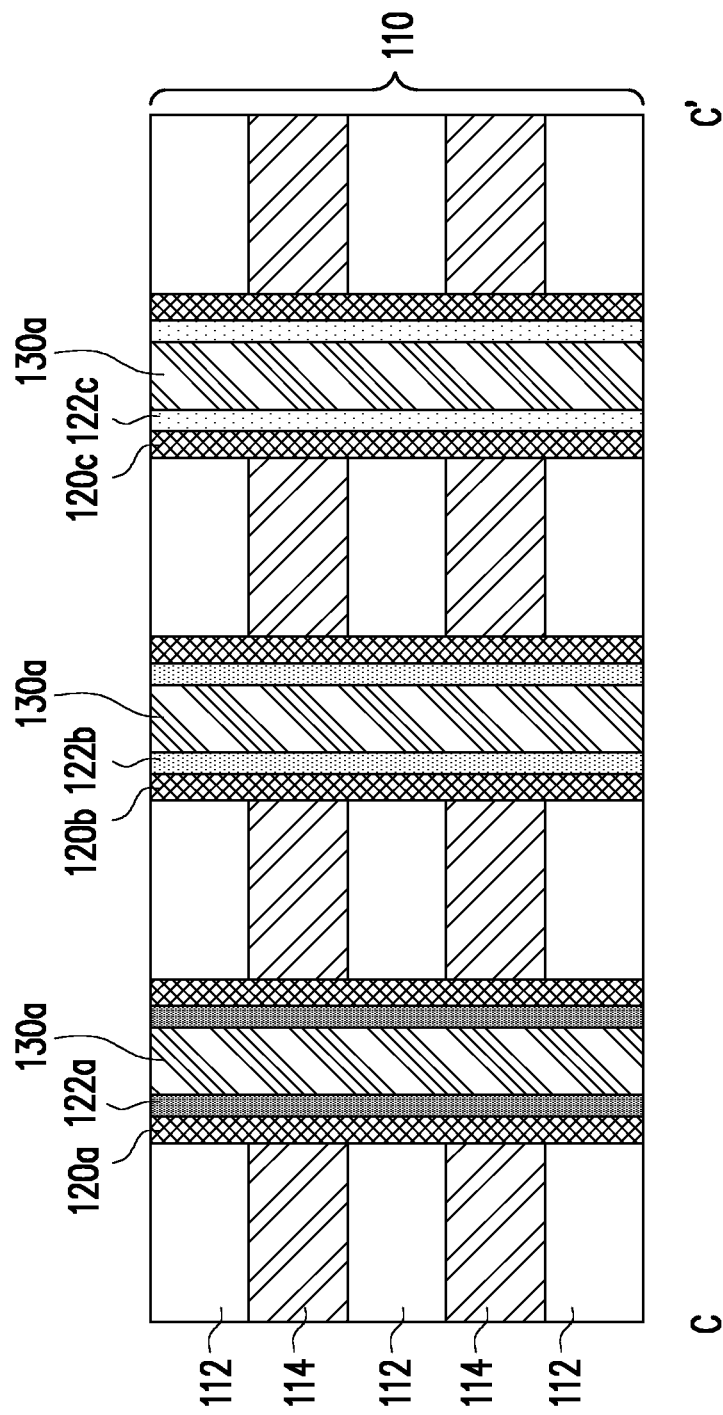

FIGS. 17A, 17B, 18A, 18B, 19A, 19B, 20A and 20B are views of intermediate stages in the manufacturing of the conductive pillars 130a and 130b (e.g., source/drain pillars) of the 3D memory device 100, in accordance with some embodiments. FIGS. 17A, 18A, 19A and 20A are illustrated in a partial three-dimensional view. FIGS. 17B and 18B are illustrated along reference cross-section B-B' illustrated in FIG. 1A. FIGS. 19B and 20B are illustrated along reference cross-section C-C' illustrated in FIG. 1A.

Referring to FIG. 17A and FIG. 17B, the channel layers 122a, 122b, 122c and the dielectric layers 124a, 124b, 124c are patterned by a combination of photolithography and etching to form openings 125. In some embodiments, the openings 125 penetrate through the channel layers 122a, 122b, 122c and the dielectric layers 124a, 124b, 124c, and the openings 125 may be disposed between opposing sidewalls of the ferroelectric layer (e.g., 120a, 120b or 120c), such that the channel layers 122a, 122b, 122c and the dielectric layers 124a, 124b, 124c are respectively cut into multiple segments by the openings 125. In some embodiments, in a direction perpendicular to sidewalls of the channel layers (e.g., 122a, 122b, 122c) and the dielectric layers (e.g., 124a, 124b, 124c), one opening 125 extending through the channel layer 122a and the dielectric layer 124a is aligned with a corresponding opening 125 extending through the channel layer 122b and the dielectric layer 124b, and is aligned with a corresponding opening 125 extending through the channel layer 122c and the dielectric layer 124c. However, in some alternative embodiments, the openings 125 extending through the channel layer 122a and the dielectric layer 124a are not aligned with the openings 125 extending through the channel layer 122b and the dielectric layer 124b, and are not aligned with the openings 125 extending through the channel layer 122c and the dielectric layer 124c.

Referring to FIG. 18A and FIG. 18B, isolation pillars 126 are formed in the openings 125. In some embodiments, an isolation material is deposited over the multi-layer stack 110 to fill into the openings 125. The isolation material may include, for example, silicon oxide, silicon nitride, silicon oxynitride, or the like, which may be deposited by CVD, PVD, ALD, PECVD, or the like. The isolation material may extend along sidewalls and bottom surfaces of the openings 125, and further extend along the upper surface of the multi-layer stack 110. After the isolation material is formed, a planarization process (e.g., a CMP, etch back, the like, or the combination) may be performed to remove excess portions of the isolation material from the upper surface of the multi-layer stack 110, thereby forming the isolation pillars 126. After the planarization process, top surfaces of the multi-layer stack 110 (e.g., the dielectric layer 112C), the ferroelectric layers 120a, 120b and 120c, the channel layers 122a, 122b and 122c, the dielectric layers 124a, 124b and 124c, and the isolation pillars 126 may be substantially level (e.g., within process variations).

In some embodiments, the isolation pillars 126 may be referred to as cell isolations. The isolation pillars 126 may be disposed between and isolate adjacent memory cells 140 (see FIG. 1B). The isolation pillars 126 may divide the channel layers 122a, 122b, 122c into multiple channel segments and may divide the dielectric layers 124a, 124b, 124c respectively into multiple dielectric segments. In other words, the channel segments of the channel layers 122a, 122b, 122c are spaced apart from each other by the isolation pillars 126, and the dielectric segments of the dielectric layers 124a, 124b, 124c are also spaced apart from each other by the isolation pillars 126.

Referring to FIG. 19A and FIG. 19B, the dielectric layers 124a, 124b, 124c are patterned by a combination of photolithography and etching to form multiple pairs of openings 129. In some embodiments, the openings 129 penetrate through the dielectric layers 124a, 124b, 124c. Each pair of the openings 129 may be respectively disposed between adjacent isolation pillars 126. The openings 129 may be disposed between opposing sidewalls of the channel layer (e.g., 122a, 122b or 122c), and the openings 129 may expose sidewalls of the of the channel layer (e.g., 122a, 122b or 122c). In some embodiments, in a direction perpendicular to sidewalls of the channel layers (e.g., 122a, 122b, 122c) and the dielectric layers (e.g., 124a, 124b, 124c), one opening 129 extending through the dielectric layer 124a is aligned with a corresponding opening 129 extending through the dielectric layer 124b, and is aligned with a corresponding opening 129 extending through the dielectric layer 124c. However, in some alternative embodiments, the openings 129 extending through the dielectric layer 124a are not aligned with the openings 129 extending through the dielectric layer 124b, and are not aligned with the openings 129 extending through the dielectric layer 124c.

Referring to FIG. 20A and FIG. 20B, multiple pairs of conductive pillars 130a and 130b (e.g., source/drain pillars) are respectively formed in the multiple pairs of openings 129. In some embodiments, the conductive pillars 130a and 130b may penetrate through the dielectric layers 124a, 124b, 124c. Each pair of the conductive pillars 130a and 130b are respectively disposed between adjacent isolation pillars 126, and the conductive pillars 130a are separated from the conductive pillars 130b by the dielectric layer (e.g., 124a, 124b or 124c). In some embodiments, sidewalls of the conductive pillars 130a and 130b are substantially aligned with sidewalls of the dielectric layers 124a, 124b, 124c. In some alternative embodiments, the conductive pillars 130a and 130b may protrude from sidewalls of the dielectric layers 124a, 124b, 124c and protrude laterally into the adjacent channel layers 122a, 122b, 122c. In some embodiments, the conductive pillars 130a and 130b are formed by depositing a conductive material over the multi-layer stack 110 to fill into the openings 129. The conductive material may include, for example, copper, titanium, titanium nitride, tantalum, tantalum nitride, tungsten, ruthenium, aluminum, combinations thereof, or the like, which may be deposited by CVD, PVD, ALD, PECVD, or the like. The conductive material may extend along sidewalls and bottom surfaces of the openings 129, and further extend along the upper surface of the multi-layer stack 110. After the conductive material is formed, a planarization process (e.g., a CMP, etch back, the like, or the combination) may be performed to remove excess portions of the conductive material from the upper surface of the multi-layer stack 110, thereby forming the conductive pillars 130a and 130b. After the planarization process, top surfaces of the multi-layer stack 110 (e.g., the dielectric layer 112C), the ferroelectric layers 120a, 120b and 120c, the channel layers 122a, 122b and 122c, the dielectric layers 124a, 124b and 124c, the isolation pillars 126, and the conductive pillars 130a and 130b may be substantially level (e.g., within process variations).

In some embodiments, the conductive pillars 130a and 130b extend along a direction perpendicular to the conductive lines 116 such that individual cells of the memory device 100 may be selected for read and write operations. In some embodiments, the conductive pillars 130a (e.g., drain pillars) correspond to and are electrically connected to the bit lines in the memory device 100, and the conductive pillars 130b (e.g., source pillars) correspond to and are electrically connected to the source lines in the memory device 100. In some embodiments, since the channel layers 122a, 122b, 122c may not laterally span on the top surfaces of the underlying substrate (e.g., the substrate 50 in FIG. 2 or 3), each pair of the conductive pillars 130a and 130b in each memory cell 140 can be prevented from being electrically connected with each other through an underlying path, which may be barely controlled by a gate voltage applied to the gate layers (i.e., the conductive lines 116 in FIG. 1A).

It is noted that although the conductive pillars 130a and 130b are spaced apart from the isolation pillars 126 by the dielectric layers 124a, 124b, 124c as illustrate in the figures. However, the conductive pillars 130a and 130b may be in contact with the isolation pillars 126 in some alternative embodiment.

FIGS. 21 through 24 are views of intermediate stages in the manufacturing of memory regions of the 3D memory device 100, in accordance with some embodiments. FIGS. 21 through 24 are illustrated in a partial three-dimensional view.

Figure 21:
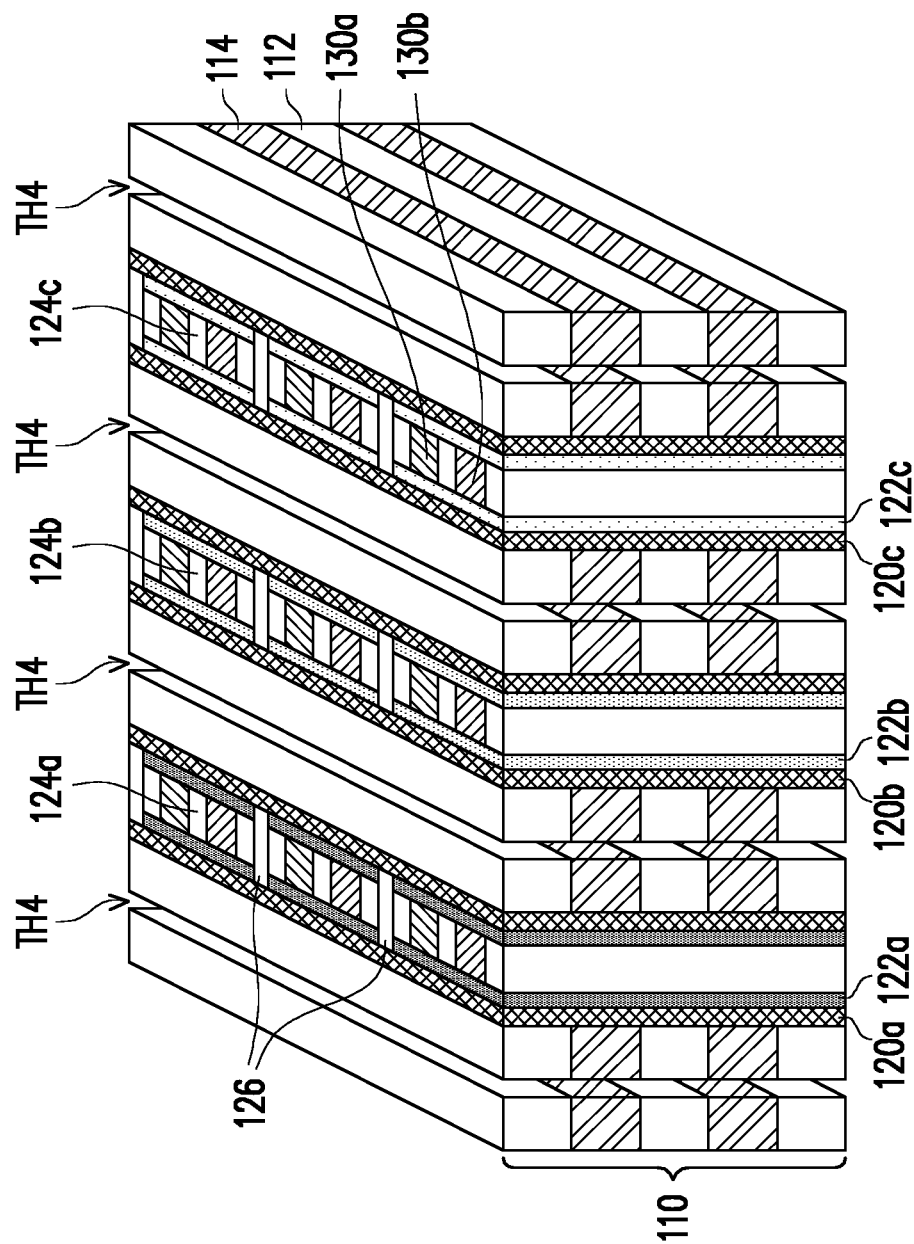

Referring to FIG. 21, the multi-layer stack 110 is further patterned to form trenches TH4. In some embodiments, the trenches TH4 penetrates through the multi-layer stack 110, and the trenches TH4 may be respectively between adjacent ones of the first, second and third trenches TH1, TH2, TH3. In some embodiments, the trenches TH4 expose sidewalls of the multi-layer stack 110. In other words, the trenches TH4 expose sidewalls of the dielectric layers 112 and sidewalls of the sacrificial layers 114. In some embodiments, the trenches TH4 are formed by using one or more etching process, such as by a dry etch (e.g., RIE, NBE, the like), a wet etch, the like, or a combination thereof. The etching may be anisotropic. A mask pattern, such as a patterned photoresist, may be formed on the multi-layer stack 110. The one or more etching process may then be performed by using the mask pattern as an etching mask to form the trenches TH4. After the etching process is finished, the mask pattern (e.g., patterned photoresist) may be removed by a suitable removal process, such as ashing or stripping.

Figure 22:
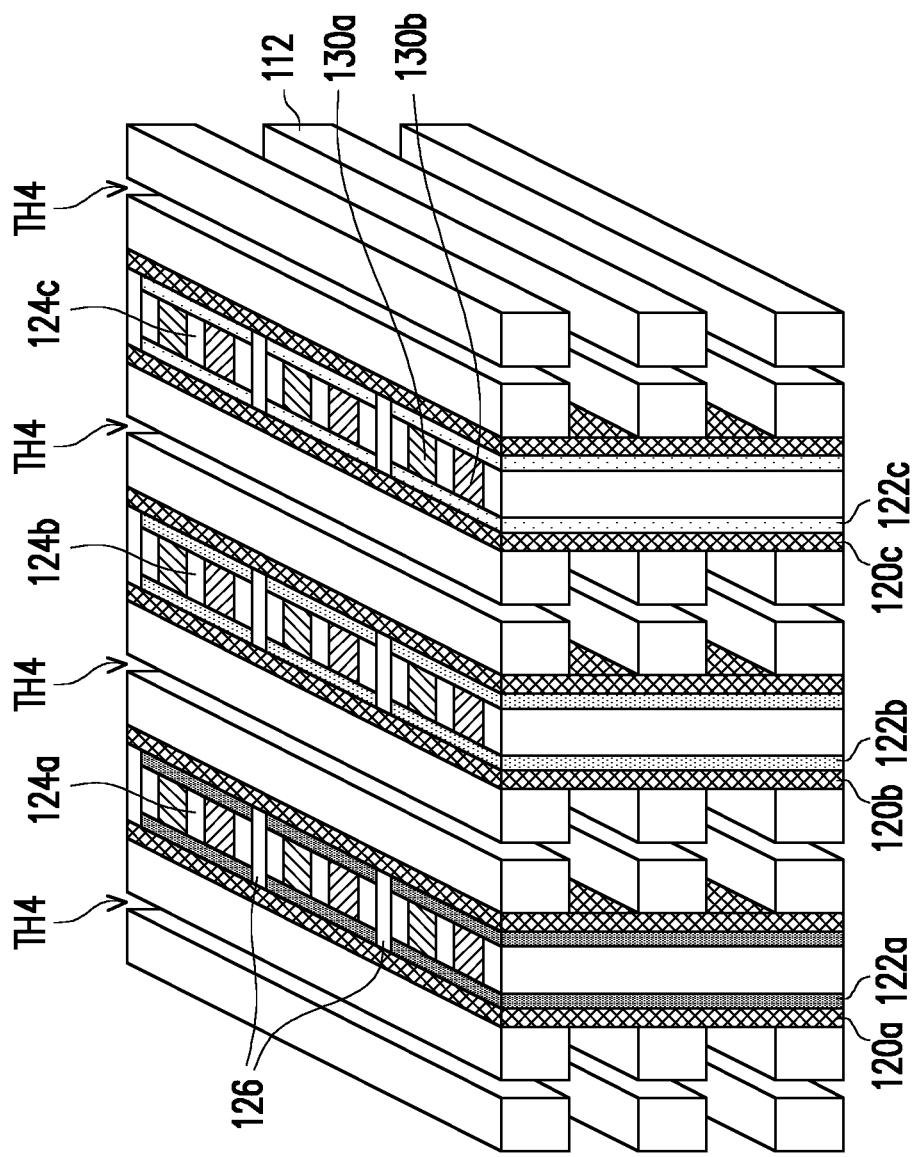
Figure 23:
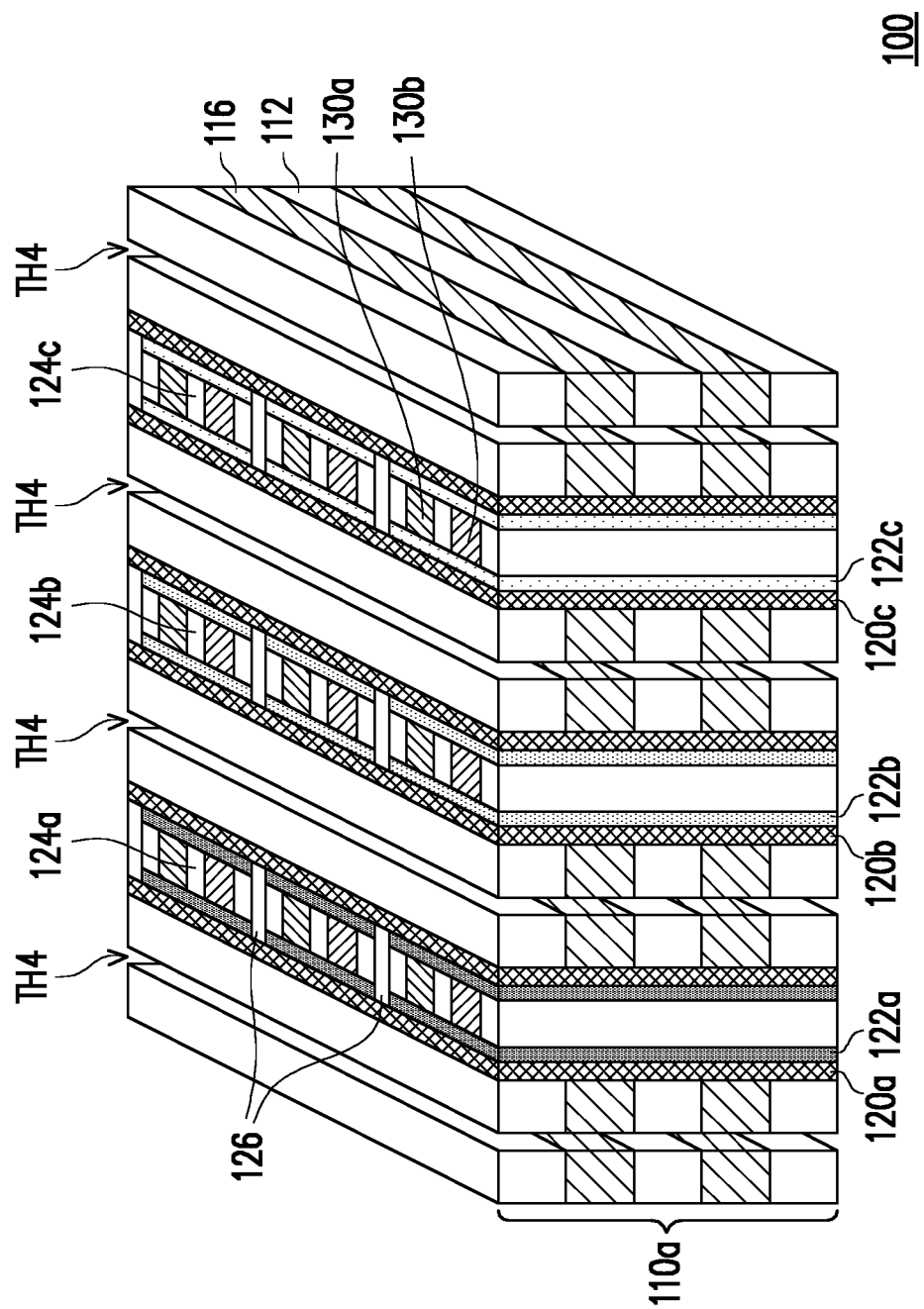

Referring to FIG. 22 and FIG. 23, after the trenches TH4 are formed to expose the sidewalls of the sacrificial layers 114, the sacrificial layers 114 are replaced with conductive materials to define the conductive lines 116 (see FIG. 23). The conductive lines 116 may correspond to word lines in the 3D memory device 100, and the conductive lines 116 may further provide gate electrodes for the resulting memory cells of the 3D memory device 100. The conductive lines 116 at the same level may be collectively referred to as a conductive layer (gate layer) 116.

As shown in FIG. 22, the sacrificial layers 114 are removed. By removing the sacrificial layers 114, surfaces of the dielectric layers 112 and the ferroelectric layers 120a, 120b and 120c previously in contact with the sacrificial layers 114 are exposed. In some embodiments, the sacrificial layers 114 are removed by an isotropic etching process. Since the dielectric layers 112 and the ferroelectric layers 120a, 120b and 120c may have sufficient etching selectivity with respect to the sacrificial layers 114, the sacrificial layers 114 can be selectively removed during such isotropic etching process. Thereafter, as shown in FIG. 23, conductive lines 116 are filled into the spaces between two adjacent dielectric layers 112. In some embodiments, the conductive lines 116 are formed in spaces previously occupied by the sacrificial layers 114. In other words, the previously existed sacrificial layers 114 are replaced by the conductive lines 116 (or gate layers 116). In some embodiments, sidewalls of the dielectric layers 112 are substantially aligned with sidewalls of the dielectric layers 112.

In some embodiments, barrier layers (not shown) are formed between the conductive lines 116 and the dielectric layers 112. The barrier layers may prevent the conductive lines from diffusion to the adjacent dielectric layers 112. The barrier layers may also provide the function of increasing the adhesion between the conductive lines 116 and the adjacent dielectric layers 112, and may be referred to as glue layers in some examples. In some embodiments, the barrier layers are formed of a metal nitride, such as titanium nitride, tantalum nitride, molybdenum nitride, zirconium nitride, hafnium nitride, or the like. In some embodiments, the conductive lines 116 may be formed of a metal, such as tungsten, ruthenium, molybdenum, cobalt, aluminum, nickel, copper, silver, gold, alloys thereof, or the like. The barrier layers and the conductive lines 116 may each be formed by an acceptable deposition process such as CVD, PVD, ALD, PECVD, or the like. The barrier layers and the conductive lines 116 may be further deposited on the sidewalls of the multi-layer stack 58 and fill in the trenches T4. Thereafter, the barrier layers and the conductive lines 116 in the trenches T4 are removed by an etching back process. An acceptable etch back process may be performed to remove excess materials from the sidewalls of the dielectric layers 112 and the bottoms of the trenches T4. The acceptable etch back process includes an anisotropic etching process. In some embodiments, after the etch back process, sidewalls of the dielectric layers 112 are substantially coplanar with sidewalls of the dielectric layers 112. In some embodiments, the dielectric layers 112 and the conductive layers 116 constitute a multi-layer stack 110a.

Figure 24:
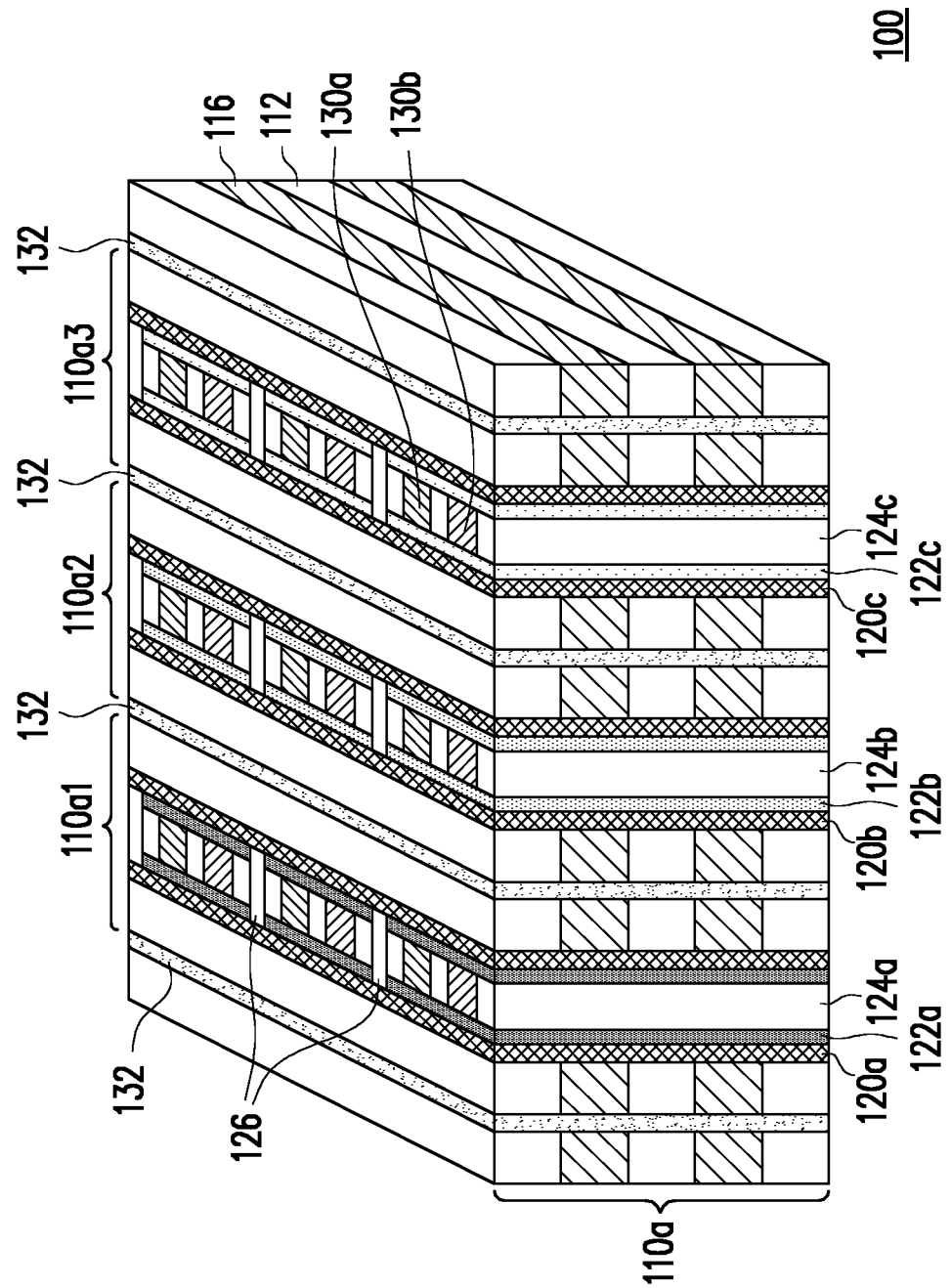

Referring to FIG. 24, after the sacrificial layers 114 are replaced with the conductive lines 116, dielectric isolations 132 are formed in the trenches TH4. In some embodiments, the dielectric isolations 132 may be referred to as gate isolations. The dielectric isolations 132 may be disposed between and isolate gates electrodes of the adjacent memory cells 140 (see FIG. 1B). In some embodiments, the dielectric isolations 132 penetrate through the multi-layer stack 110a and extend between adjacent columns of the memory cells 140, so as to divide the multi-layer stack 110a into a plurality of multi-layer stacks (e.g., multi-layer stacks 110a1, 110a2, 110a3). That is, the plurality of multi-layer stacks (e.g., multi-layer stacks 110a1, 110a2, 110a3) laterally spaced apart from one another by the dielectric isolations 132, respectively. Each of the plurality of multi-layer stacks (e.g., multi-layer stacks 110a1, 110a2, 110a3) includes portions of the dielectric layers 112 and portions of the conductive layers 116. In some embodiments, the ferroelectric layer 120a, the channel layer 122a, and the dielectric layer 124a are embedded in the multi-layer stack 110a1, the ferroelectric layer 120b, the channel layer 122b, and the dielectric layer 124b are embedded in the multi-layer stack 110a2, and the ferroelectric layer 120c, the channel layer 122c, and the dielectric layer 124c are embedded in the multi-layer stack 110a3.

In some embodiments, the dielectric isolations 132 are formed by depositing a dielectric material that completely fills the trench TH4. After the dielectric material is formed, a planarization process (e.g., a chemical mechanical planarization (CMP), etch back, the like, or the combination) may be performed to remove excessive portions of the dielectric material from the upper surface of the multi-layer stack 110a, thereby forming the dielectric isolations 132. After the planarization process, top surfaces of the multi-layer stack 110a (e.g., the dielectric layer 112C), the ferroelectric layers 120a, 120b and 120c, the channel layers 122a, 122b and 122c, the dielectric layers 124a, 124b and 124c, the isolation pillars 126, the conductive pillars 130a and 130b, and the dielectric isolations 132 may be substantially level (e.g., within process variations). In some embodiments, the material of the dielectric isolations 132 includes silicon oxide, silicon nitride, silicon oxynitride, or the like. In some embodiments, the method of forming the dielectric isolations 132 includes performing a suitable deposition technique, such as CVD, PVD, ALD, PECVD, or the like.

In some embodiments, the isolation pillars 126 and the conductive pillars 130a and 130b are formed before the conductive lines 116 and the dielectric isolations 132 are formed. However, in some alternative embodiments, the isolation pillars 126 and the conductive pillars 130a and 130b are formed after the conductive lines 116 and the dielectric isolations 132 are formed. In these cases, after the ferroelectric layer 120c, the channel layer 122c, and the dielectric layer 124c are formed in the trench TH3, the fourth trenches TH4 are first formed. Then, the sacrificial layers 114 are replaced with the conductive lines 116, and the fourth trenches TH4 are filled with the isolation pillars 126. Thereafter, the isolation pillars 126 are formed in the channel layers 122a, 122b, 122c and the dielectric layers 124a, 124b, 124c, and the conductive pillars 130a and 130b are formed in the dielectric layers 124a, 124b, 124c.

Figure 25A:
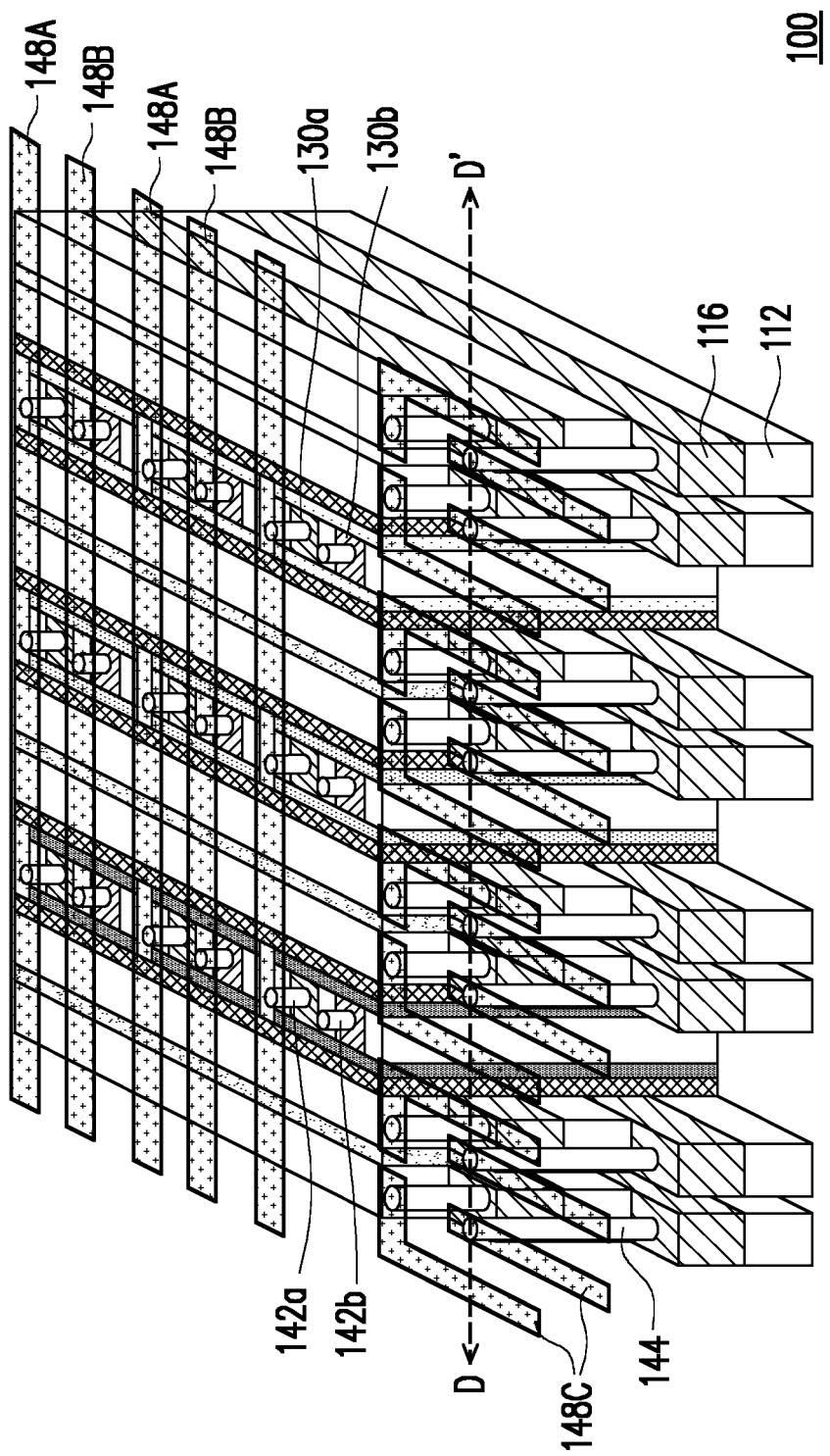
Figure 25B:
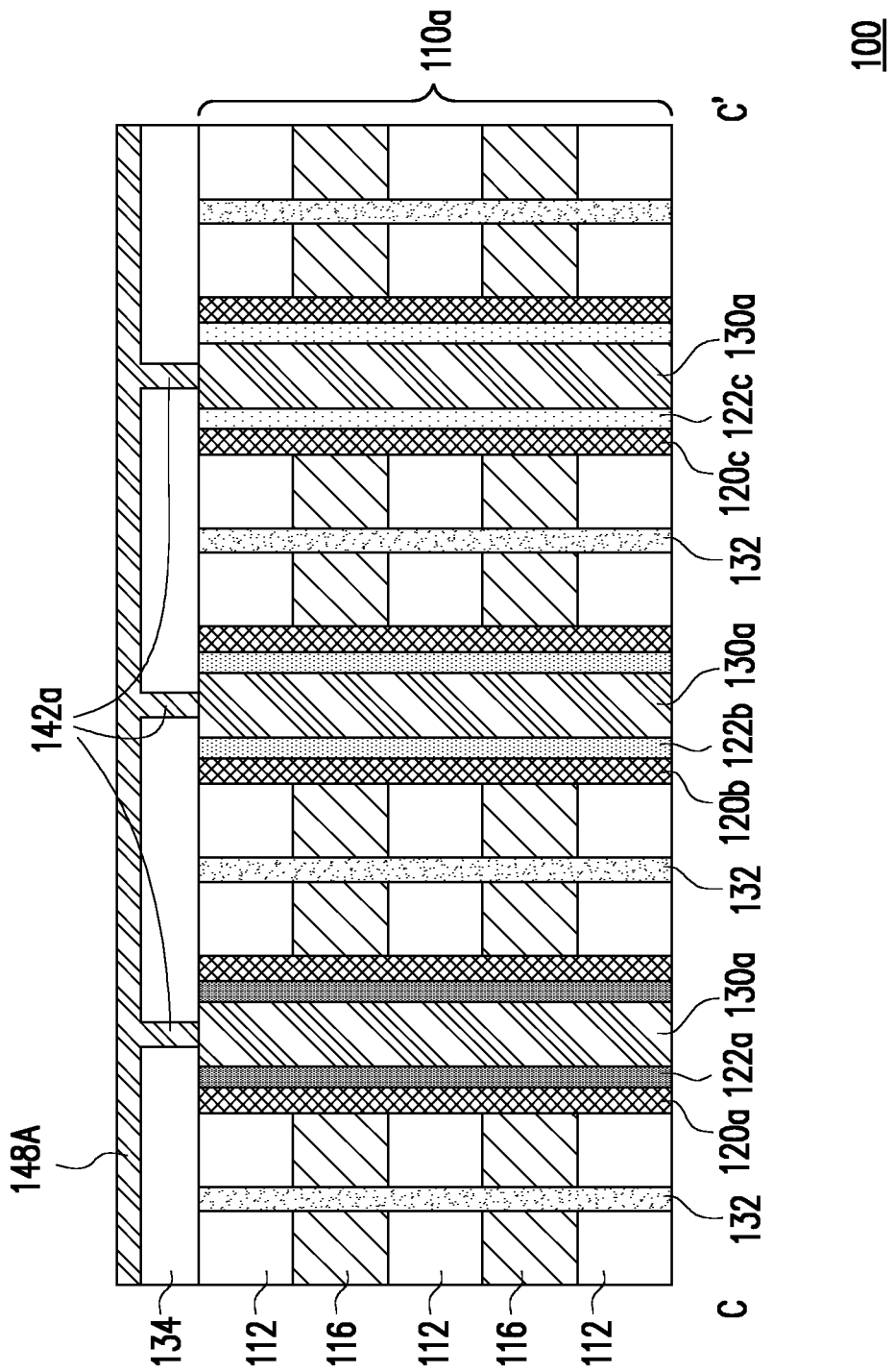
Figure 25C:
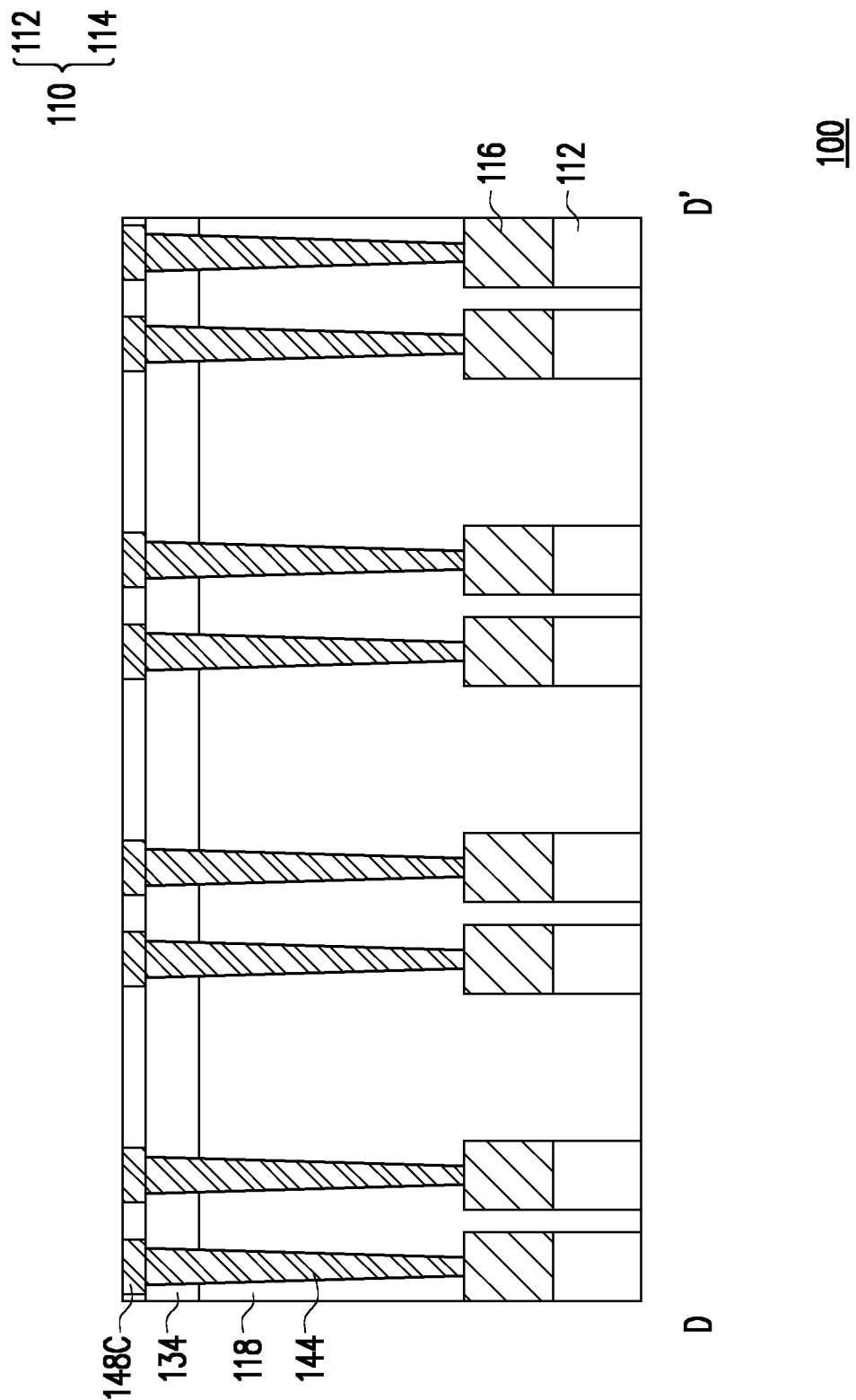
Figure 25D:
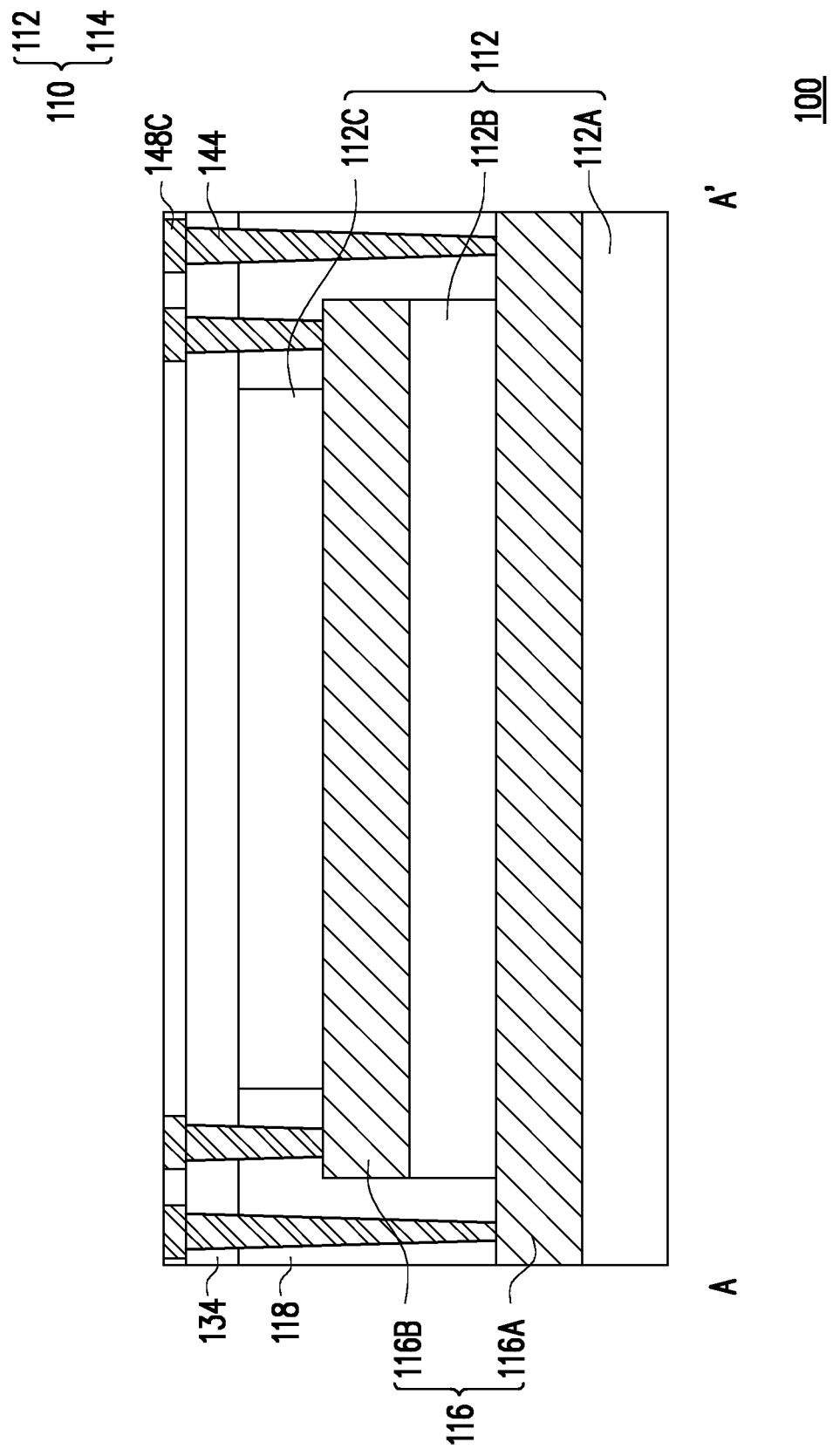

Referring to FIGS. 25A, 25B, 25C and 25D, an IMD layer 134 is formed on top surfaces of the multi-layer stack 110a (e.g., the dielectric layer 112C), the ferroelectric layers 120a, 120b, 120c, the channel layers 122a, 122b, 122c, the dielectric layers 124a, 124b, 124c, the conductive pillars 130a, 130b and the IMD 118. Conductive contacts 142a, 142b, and 144 are made on the conductive pillars 130a, the conductive pillars 130b and the conductive lines 116, respectively. FIG. 25A illustrates a perspective view of the 3D memory device 100. FIG. 25B illustrates a cross-sectional view of the device along line C-C' of FIG. 1A. FIG. 25C illustrates a cross-sectional view along the line D-D' of FIG. 25A. FIG. 25D illustrates a cross-sectional view of the device along line A-A' of FIG. 1A.

The IMD 134 may be formed of a dielectric material, and may be deposited by any suitable method, such as CVD, PECVD, flowable CVD (FCVD), or the like. The dielectric materials may include phospho-silicate glass (PSG), borosilicate glass (BSG), boron-doped phospho-silicate glass (BPSG), undoped silicate glass (USG), or the like. In some embodiments, the IMD 134 may include an oxide (e.g., silicon oxide or the like), a nitride (e.g., silicon nitride or the like), a combination thereof or the like. Other dielectric materials formed by any acceptable process may be used. Thereafter, a removal process is applied to the IMD 134 to remove excess dielectric material over the multi-layer stack 110a. In some embodiments, the removal process may be a planarization process, such as a chemical mechanical polish (CMP), an etch-back process, combinations thereof, or the like.

In some embodiments, the staircase shape of the conductive lines 116 may provide a surface on each of the conductive lines 116 for the conductive contacts 144 to land on. In some embodiments, forming the contacts 144 may include patterning openings in the IMD 134 and IMD 118 to expose portions of the conductive lines 116 using a combination of photolithography and etching, for example. A liner (not shown), such as a diffusion barrier layer, an adhesion layer, or the like, and a conductive material are formed in the openings. The liner may include titanium, titanium nitride, tantalum, tantalum nitride, or the like. The conductive material may include copper, a copper alloy, silver, gold, tungsten, cobalt, aluminum, nickel, or the like. A planarization process, such as a CMP, may be performed to remove excess material from the surface of the IMD 134. The remaining liner and conductive material form the conductive contacts 144 in the openings.

As also illustrated by the perspective view of FIG. 25A, conductive contacts 142a and 142b may also be made on the conductive pillars 130a and the conductive pillars 130b, respectively. The conductive contacts 142a, 142b and 144 may be electrically connected to conductive lines 148A, 148B and 148C, respectively, which connect the memory device to an underlying/overlying circuitry (e.g., control circuitry) and/or signal, power, and ground lines in the semiconductor die. For example, as shown in FIG. 25D, the conductive contacts 144 may extend through the IMD 118 and IMD 134 to electrically connect conductive lines 148C to the conductive lines 116 and the underlying active devices of the substrate. Other conductive contacts or vias may be formed through the IMD 134 to electrically connect the conductive lines 148A and 148B to the underlying active devices of the substrate, respectively. In alternate embodiments, routing and/or power lines to/from the memory array may be provided by an interconnect structure formed over the memory device 100 in addition to or in lieu of the interconnect structure 70 (shown in FIGS. 2 and 3). Accordingly, the 3D memory device 100 according to some embodiments of the present disclosure may be completed.

As shown in FIG. 25A and FIG. 25B, each of the conductive lines 148A (which may be functioned as bit lines) is connected to the conductive pillar 130a of one memory cell 140a, the conductive pillar 130a of one memory cell 140b and the conductive pillar 130a of one memory cell 140c through the corresponding conductive contacts 142a. In some embodiments, one memory cell 140a having 1× on-current, one memory cell 140b having 2× on-current and one memory cell 140c having 4× on-current constitute a 3-bit memory unit, wherein 2× on-current is about two times the 1× on-current, and 4× on-current is about two times the 2× on-current. When a read operation is performed, a read voltage (a voltage between the low and high threshold voltages) is applied to the corresponding world lines, and currents from the memory cell 140a, the memory cell 140b and the memory cell 140c are summed up to determine the digital value stored in the 3-bit memory unit. For example, if a first bit "0", a second bit "0" and a third bit "0" (i.e., a 3-bit digital value "000") are respectively stored in the memory cell 140a, the memory cell 140b and the memory cell 140c, an overall current from the memory cell 140a, the memory cell 140b and the memory cell 140c is about zero; if a first bit "1", a second bit "0" and a third bit "0" (i.e., a 3-bit digital value "100") are respectively stored in the memory cell 140a, the memory cell 140b and the memory cell 140c, an overall current from the memory cell 140a, the memory cell 140b and the memory cell 140c is about 1× on-current; if a first bit "0", a second bit "1" and a third bit "0" (i.e., a 3-bit digital value "010") are respectively stored in the memory cell 140a, the memory cell 140b and the memory cell 140c, an overall current from the memory cell 140a, the memory cell 140b and the memory cell 140c is about 2× on-current; if a first bit "1", a second bit "1" and a third bit "0" (i.e., a 3-bit digital value "110") are respectively stored in the memory cell 140a, the memory cell 140b and the memory cell 140c, an overall current from the memory cell 140a, the memory cell 140b and the memory cell 140c is about 3× on-current; if a first bit "0", a second bit "0" and a third bit "1" (i.e., a 3-bit digital value "001") are respectively stored in the memory cell 140a, the memory cell 140b and the memory cell 140c, an overall current from the memory cell 140a, the memory cell 140b and the memory cell 140c is about 4× on-current; if a first bit "1", a second bit "0" and a third bit "1" (i.e., a 3-bit digital value "101") are respectively stored in the memory cell 140*a*, the memory cell 140*b* and the memory cell 140*c*, an overall current from the memory cell 140*a*, the memory cell 140*b* and the memory cell 140*c* is about 5× on-current; if a first bit "0", a second bit "1" and a third bit "1" (i.e., a 3-bit digital value "011") are respectively stored in the memory cell 140*a*, the memory cell 140*b* and the memory cell 140*c*, an overall current from the memory cell 140*a*, the memory cell 140*b* and the memory cell 140*c* is about 6× on-current; if a first bit "1", a second bit "1" and a third bit "1" (i.e., a 3-bit digital value "111") are respectively stored in the memory cell 140*a*, the memory cell 140*b* and the memory cell 140*c*, an overall current from the memory cell 140*a*, the memory cell 140*b* and the memory cell 140*c* is about 7× on-current. Since the on-currents of the memory cells 140*a*, 140*b* and 140*c* are different from each other, only three memory cells having different on-currents are needed for storing 3-bit data.

Figure 26A:
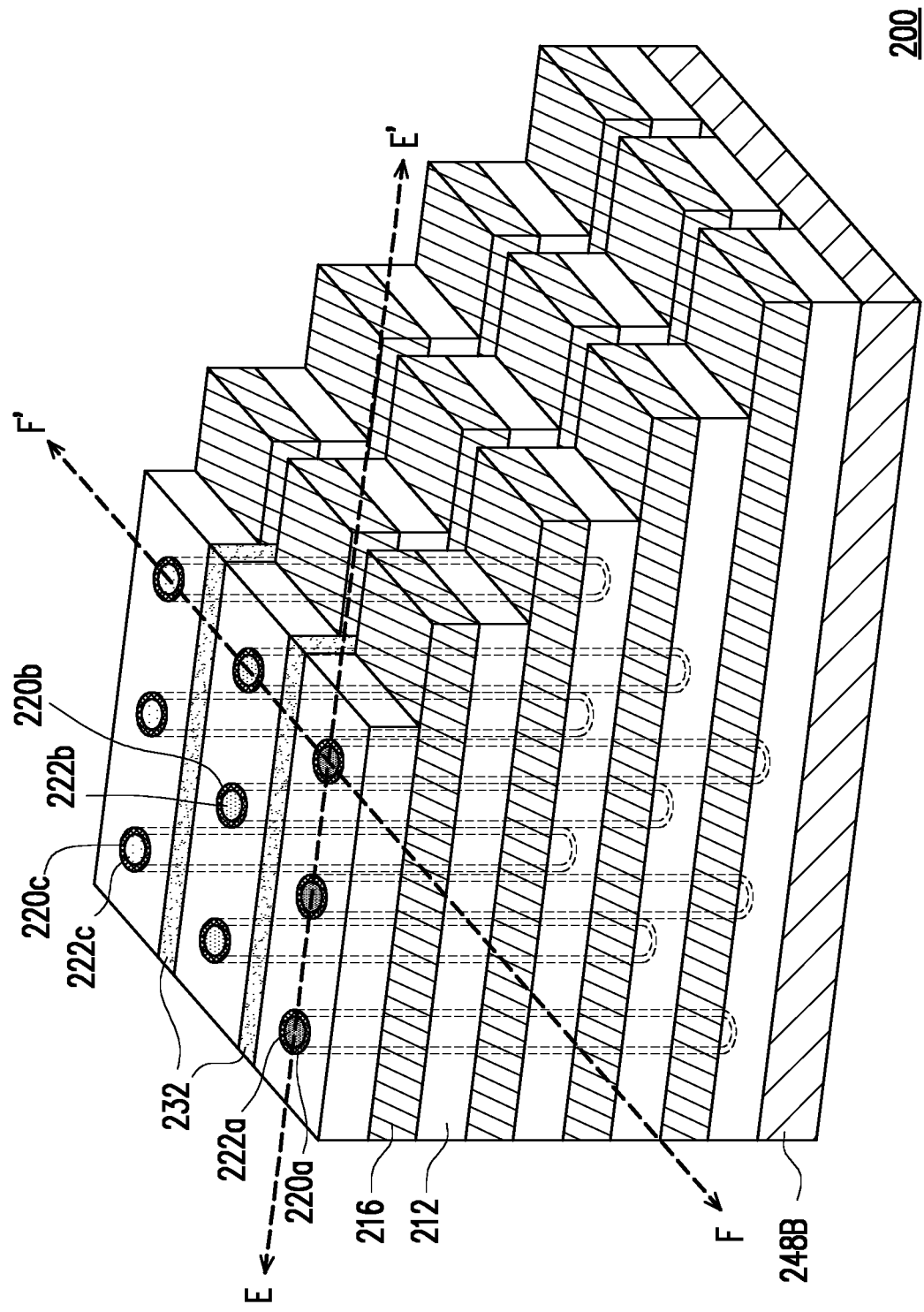
FIG. 26A is a schematic three-dimensional view illustrating a portion of a 3D memory device in accordance with some other embodiments of the present disclosure.
Figure 26B:
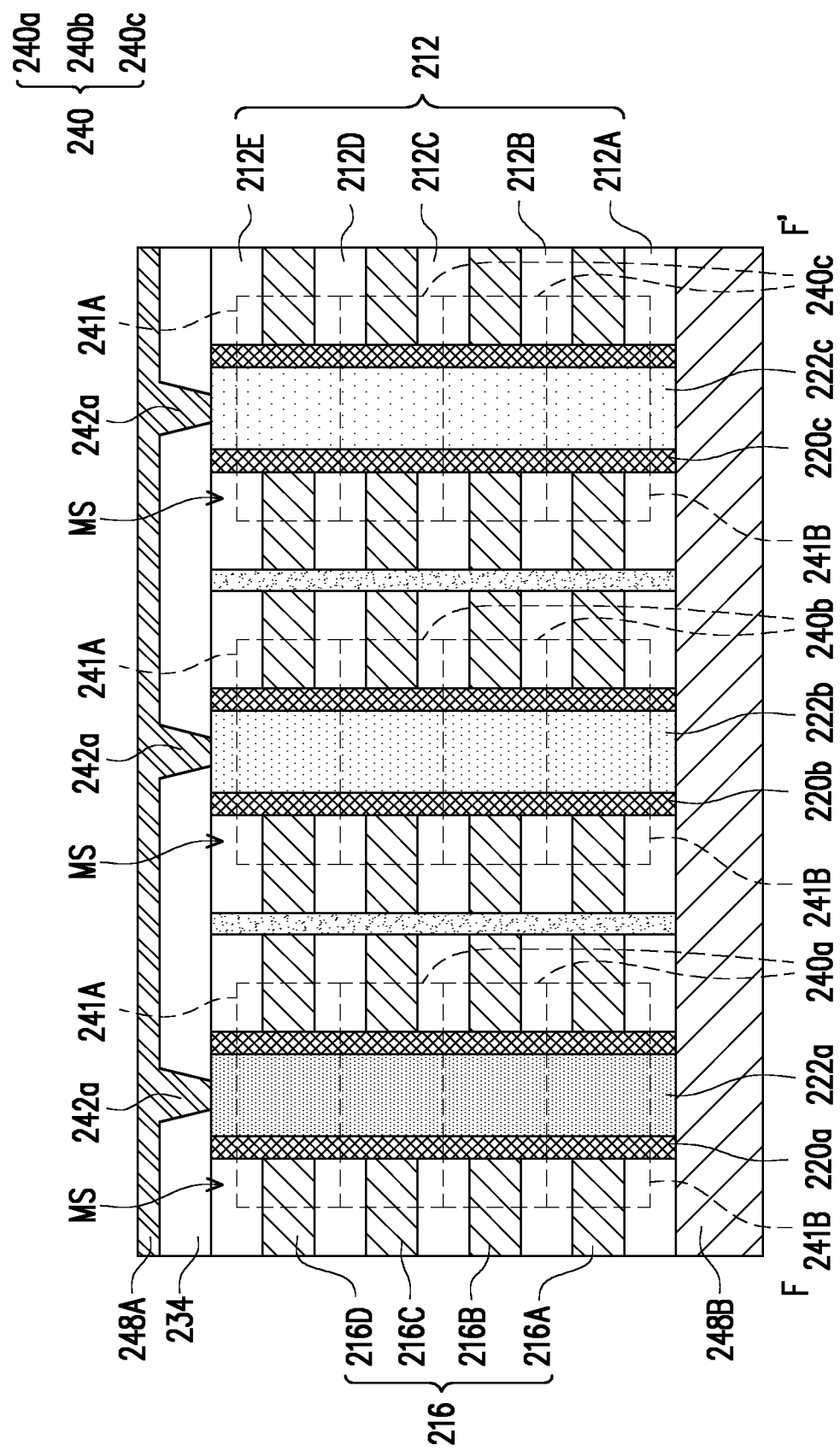
FIG. 26B is a cross-sectional view of the 3D memory device along line F-F' of FIG. 26A.

FIG. 26A is a schematic three-dimensional view illustrating a portion of a 3D memory device 200 in accordance with some other embodiments of the present disclosure. FIG. 26B is a cross-sectional view of the 3D memory device 200 along line F-F' of FIG. 26A.

Referring to FIG. 26A and FIG. 26B, the 3D memory device 200 includes a plurality of memory cells 240*a*, 240*b* and 240*c* (collectively referred to as memory cells 240), which may be arranged in a grid of rows and columns. The memory cells 240 may be further stacked vertically to provide a three dimensional memory array, thereby increasing device density. The 3D memory device 200 may be fabricated by the back end of line (BEOL) processes of a semiconductor die. For example, the memory array may be disposed in the interconnect layers of the semiconductor die, such as, above one or more active devices (e.g., transistors) formed on a semiconductor substrate.

In some embodiments, the 3D memory device 200 is a flash memory array, such as a NAND flash memory array, or the like. Multiple memory cells (e.g., 240*a*, 240*b* or 240*c*) in a same vertical column of the memory array are connected in series. The 3D memory device 200 may further include first select transistors 241A and second select transistors 241B. Each of the first select transistors 241A may be respectively disposed over the topmost memory cells 240, and each of the second select transistors 241B may be respectively disposed under the bottommost memory cells 240. The first select transistor 241A, the second select transistor 241B and the memory cells (e.g., 240*a*, 240*b* or 240*c*) between the first select transistor 241A and the second select transistor 241B are connected in series and constitute a NAND string MS.

In some embodiments, a control gate of each memory cells 240 is electrically coupled to a respective word line (e.g., conductive line 216B or 216C), a select gate of each select transistors 241A is electrically coupled to a respective select line (e.g., conductive line 216D), and a select gate of each select transistors 241B is electrically coupled to a respective select line (e.g., conductive line 216A). When the select transistors 241A are turned on, a drain terminal of each NAND string MS is electrically coupled to a respective bit line (e.g., conductive lines 248A). When the select transistors 241B are turned on, a source terminal of each NAND string MS is electrically coupled to a common source (e.g., conductive layer 248B), which electrically couples to ground. The memory cells (e.g., 240*a*, 240*b* or 240*c*) in a same horizontal row of the memory array may share a common word line (e.g., conductive line 216B or 216C), while the memory cells (e.g., 240*a*, 240*b* or 240*c*) in a same vertical column of the memory array may share a common bit line (e.g., conductive lines 248A). In addition, all memory cells 240 may share a common source (e.g., conductive layer 248B).

The 3D memory device 200 may include a plurality of vertically stacked conductive lines 216A, 216B, 216C and 216D (collectively referred to as conductive lines 216) with dielectric layers 212A, 212B, 212C, 212D and 212E (collectively referred to as conductive lines 212) disposed between adjacent ones of the conductive lines 216. The conductive lines 216 may extend in a direction parallel to a major surface of an underlying substrate (not explicitly illustrated in FIGS. 26A and 26B). The conductive lines 216 may have a staircase configuration such that lower conductive lines 216 are longer than and extend laterally past endpoints of upper conductive lines 216. For example, in FIG. 1A, multiple stacked layers of conductive lines 216 are illustrated with topmost conductive lines 216 being the shortest and bottommost conductive lines 216 being the longest. Respective lengths of the conductive lines 216 may increase in a direction towards the underlying substrate. In this manner, a portion of each of the conductive lines 216 may be accessible from above the 3D memory device 200, and conductive contacts may be made to exposed portions of the conductive lines 216, respectively.

In some embodiments, the 3D memory device 200 may also include oxide semiconductor (OS) materials as channel layers (or channel pillars) 222*a*, 222*b* and 222*c*. The channel layers 222*a*, 222*b* and 222*c* may provide channel regions for the memory cells 240*a*, 240*b* and 240*c*, respectively. In some embodiments, a ferroelectric layer (or ferroelectric sheath) (e.g., 220*a*, 220*b* or 220*c*) is disposed between the channel layer (e.g., 222*a*, 222*b* or 222*c*) and each of the conductive lines 216 and the dielectric layers 212. Each ferroelectric layer 220*a* may surround and cover a sidewall of a corresponding channel layer 220*a*. Each ferroelectric layer 220*b* may cover a sidewall of a corresponding channel layer 220*b*. Each ferroelectric layer 220*c* may cover a sidewall of a corresponding channel layer 220*c*. In some embodiments, the ferroelectric layer (e.g., 220*a*, 220*b* or 220*c*) may serve as a gate dielectric for each memory cell (e.g., 240*a*, 240*b* or 240*c*). The materials and characterization of the channel layers 222*a*, 222*b* and 222*c* and the ferroelectric layers 222*a*, 222*b* and 222*c* may be the similar to those of the channel layers 122*a*, 122*b* and 122*c* and the ferroelectric layers 122*a*, 122*b* and 122*c* illustrated in FIGS. 1A and 1B, respectively, and thus detailed descriptions are not repeated here.

To perform a write operation on the memory cells 240 of the NAND string MS in such embodiments, the select transistors 241A and 241B of the NAND string MS are turned on, and a write voltage is applied across a portion of the ferroelectric layer (e.g., 220*a*, 220*b* or 220*c*) corresponding to the memory cells 240 of the NAND string MS. In some embodiments, the write voltage is applied, for example, by applying appropriate voltages to corresponding conductive lines 216B and 216C (e.g., the word lines), a corresponding conductive line 248A (e.g., the bit line) and the conductive layer 248B (e.g., the common source). By applying the write voltage across the portion of the ferroelectric layer (e.g., 220*a*, 220*b* or 220*c*), a polarization direction of the region of the ferroelectric layer (e.g., 220*a*, 220*b* or 220*c*) can be changed. As a result, the corresponding threshold voltage of the memory cells 240 can also be switched from a low threshold voltage to a high threshold voltage or vice versa, and a digital value can be stored in the memory cells 240 of the NAND string MS. Because the conductive lines 216B and 216C intersect the conductive lines 248A, individual NAND string MS may be selected for the write operation.

To perform a read operation on the memory cells 240 of the NAND string MS in such embodiments, the select transistors 241A and 241B of the NAND string MS are turned on, and a read voltage (a voltage between the low and high threshold voltages) is applied to the corresponding conductive lines 216B and 216C (e.g., the world lines). Depending on the polarization direction of the corresponding region of the ferroelectric layer (e.g., 120a, 120b or 120c), the memory cells 140 of the NAND string MS may or may not be turned on. As a result, the drain terminal of the NAND string MS may or may not be discharged through the source terminal of the NAND string MS (e.g., the common source that is coupled to ground), and the digital value stored in the memory cells 140 of the NAND string MS can be determined. Because the conductive lines 216B and 216C intersect the conductive lines 248A, individual NAND string MS may be selected for the read operation.

As shown in FIG. 26B, the dashed boxes in FIG. 26B illustrate the first memory cells 240a, the second memory cells 240b, the third memory cells 240c, the first select transistors 241A and the second select transistors 241B of the 3D memory device 200. The memory cell 240a includes a gate electrode (e.g., a portion of a corresponding conductive line 216B or 216C), a gate dielectric (e.g., a portion of a corresponding ferroelectric layer 220a) and a channel region (e.g., a portion of a corresponding channel layer 222a). The memory cell 240b includes a gate electrode (e.g., a portion of a corresponding conductive line 216B or 216C), a gate dielectric (e.g., a portion of a corresponding ferroelectric layer 220b) and a channel region (e.g., a portion of a corresponding channel layer 222b). The memory cell 240c includes a gate electrode (e.g., a portion of a corresponding conductive line 216B or 216C), a gate dielectric (e.g., a portion of a corresponding ferroelectric layer 220c) and a channel region (e.g., a portion of a corresponding channel layer 222c). The first select transistor 241A includes a gate electrode (e.g., a portion of a corresponding conductive line 216D), a gate dielectric (e.g., a portion of a corresponding ferroelectric layer 220a, 220b or 220c) and a channel region (e.g., a portion of a corresponding channel layer 222a, 222b or 222c). The second select transistor 241B includes a gate electrode (e.g., a portion of a corresponding conductive line 216A), a gate dielectric (e.g., a portion of a corresponding ferroelectric layer 220a, 220b or 220c) and a channel region (e.g., a portion of a corresponding channel layer 222a, 222b or 222c). The 3D memory device 100 includes a plurality of such memory cells and a plurality of such select transistors. The memory cells 140a, 140b and 140c and the select transistors 241A and 241B may be disposed in an array of vertically stacked rows and columns.

In some embodiments, the channel layers 222a, 222b and 222c have different electron mobilities from each other. Accordingly, when the memory cells 240a, 240b and 240c are turned on, on-currents of the memory cells 240a, 240b and 240c may be different from each other. For example, electron mobility of the channel layer 222b may be about two times the electron mobility of the channel layer 222a, and the electron mobility of the channel layer 222c may be about two times the electron mobility of the channel layer 222b (i.e., about four times the electron mobility of the channel layer 222a), such that when the memory cells 240a, 240b and 240c are turned on, the on-current of the memory cell 240b may be about two times the on-current of the memory cell 240a, and the on-current of the memory cell 240c may be about two times the on-current of the memory cell 240b (i.e., about four times the on-current of the memory cell 240a).

Since the on-currents of the memory cells 240a, 240b and 240c may be different from each other, only three memory cells having different on-currents (i.e., one memory cell 240a, one memory cell 240b and one memory cell 240c) are needed for storing 3-bit data. Accordingly, the layout area of the memory device is reduced. In addition, the power efficiency and storing capacity are improved.

Although the 3-bit memory unit is described above, those skilled in the art may implement a 2-bit memory unit which includes two memory cells having different on-currents in other embodiments according to design requirement. That is, two memory cells having different on-currents may be used for storing a 2-bit data.

FIG. 26A further illustrates reference cross-sections of the 3D memory device 200 that are used in later figures. Cross-section E-E' is along a longitudinal axis of conductive lines 216 and extends through the channel pillars 222a and the ferroelectric sheaths 220a. Cross-section F-F' is perpendicular to cross-section E-E' and extends through the channel pillars 222a, 222b, 222c and the ferroelectric sheathes 220a, 220b, 220c. Subsequent figures refer to these reference cross-sections for clarity.

FIGS. 27-29, 30A, 30B, 31, 32, 33A, 33B, 34A, 34B, 35A, 35B and 35C illustrating varying views of manufacturing a 3D memory device 200 in accordance with some other embodiments of the present disclosure.

Figure 27:
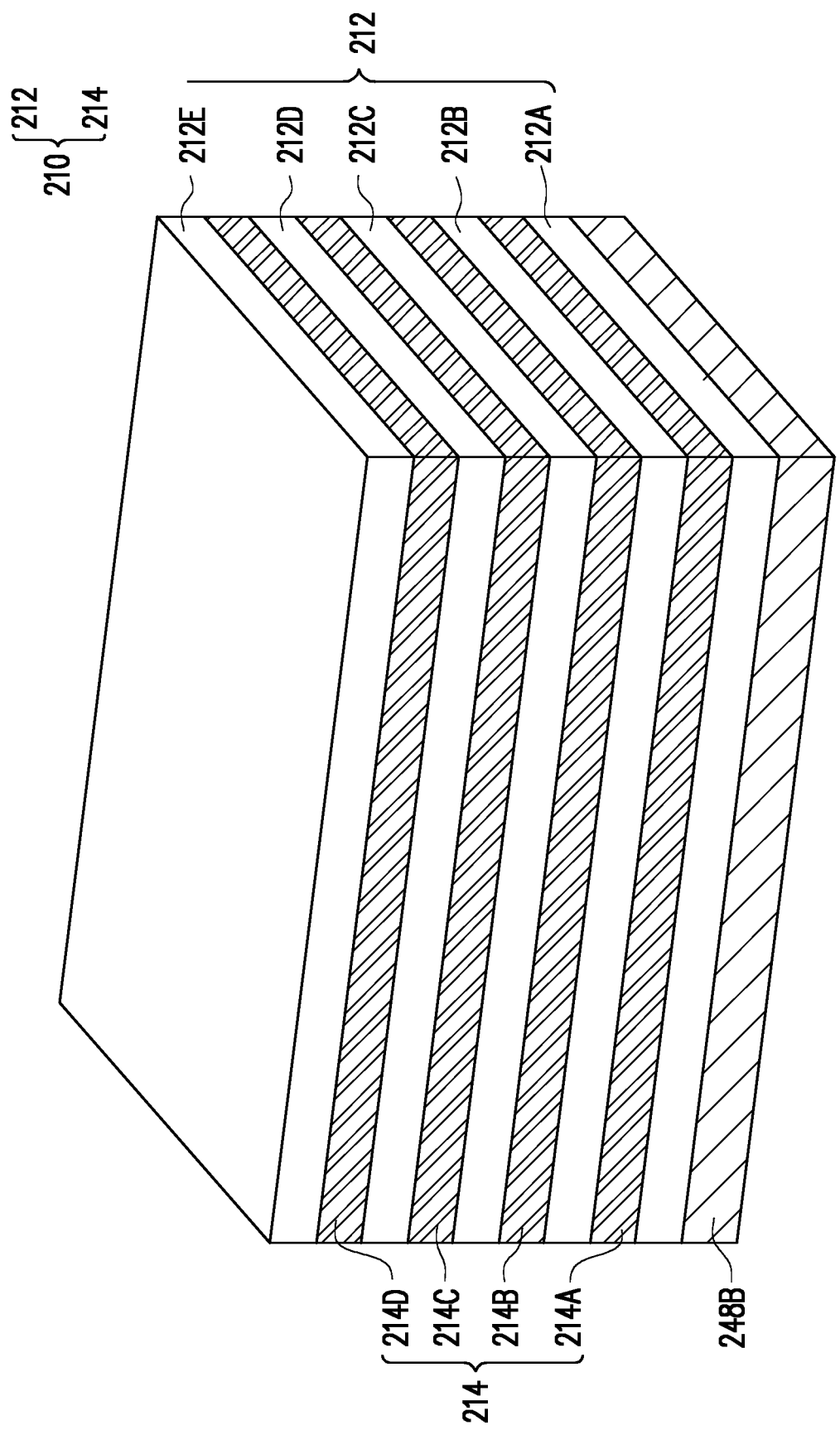
FIGS. 27-29, 30A, 30B, 31, 32, 33A, 33B, 34A, 34B, 35A, 35B and 35C illustrating varying views of manufacturing a 3D memory device in accordance with some other embodiments of the present disclosure.

Referring to FIG. 27, a conductive layer 248B and a multi-layer stack 210 are formed over a substrate (not shown). For example, the conductive layer 248B may be formed over the structure of FIG. 2 which includes the substrate 50, the MOS transistors 52, the first and second ILDs 60 and 62, the source/drain contacts 64, the gate contacts 66 and the interconnect structure 70. The multi-layer stack 210 includes a plurality of dielectric layers 212A-212E (collectively referred to as dielectric layers 112) and a plurality of sacrificial layers 214A-214D (collectively referred to as sacrificial layers 214) alternately stacked on one another. Each sacrificial layer 214 may be sandwiched between an underlying dielectric layer 212 and an overlying dielectric layer 212. In other words, the dielectric layers 212 space apart the sacrificial layers 214 from one another. In some embodiments, the sacrificial layers 214 are patterned and replaced in subsequent steps to be described with reference to FIGS. 31 and 32, so as to define conductive lines 216 (which may be functioned as word lines or select lines). The materials and forming methods of the dielectric layers 212 and the sacrificial layers 214 may be the same as or similar to those of the dielectric layers 112 and the sacrificial layers 114, and thus detailed descriptions are not repeated here. In some embodiments, the conductive layer 248B may include, for example, copper, titanium, titanium nitride, tantalum, tantalum nitride, tungsten, ruthenium, aluminum, combinations thereof, or the like, which may be deposited by CVD, PVD, ALD, PECVD, or the like.

It is noted that the multi-layer stack 210 illustrated herein is an example, and the numbers of the dielectric layers 212 and the sacrificial layers 214 may not be limited by the disclosure. In some alternative embodiments, more layers of the dielectric layers 212 and more layers of the sacrificial layers 214 may be formed over the substrate. In addition, although the multi-layer stack 210 is illustrated as having the dielectric layers as topmost layer, the disclosure is not limited thereto. In some alternative embodiments, the topmost layer of the multi-layer stack is a sacrificial layer.

Figure 28:
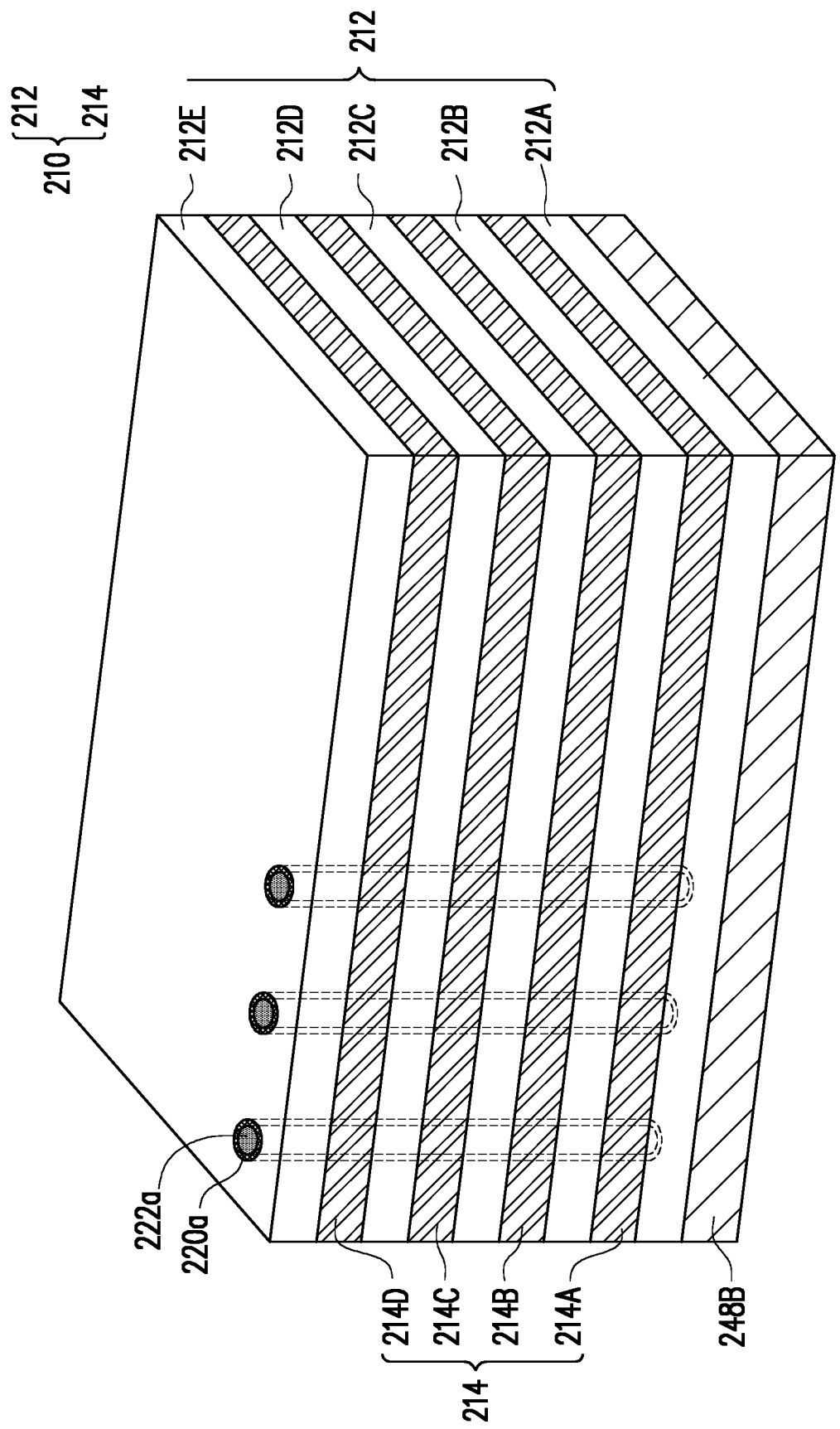
Figure 29:
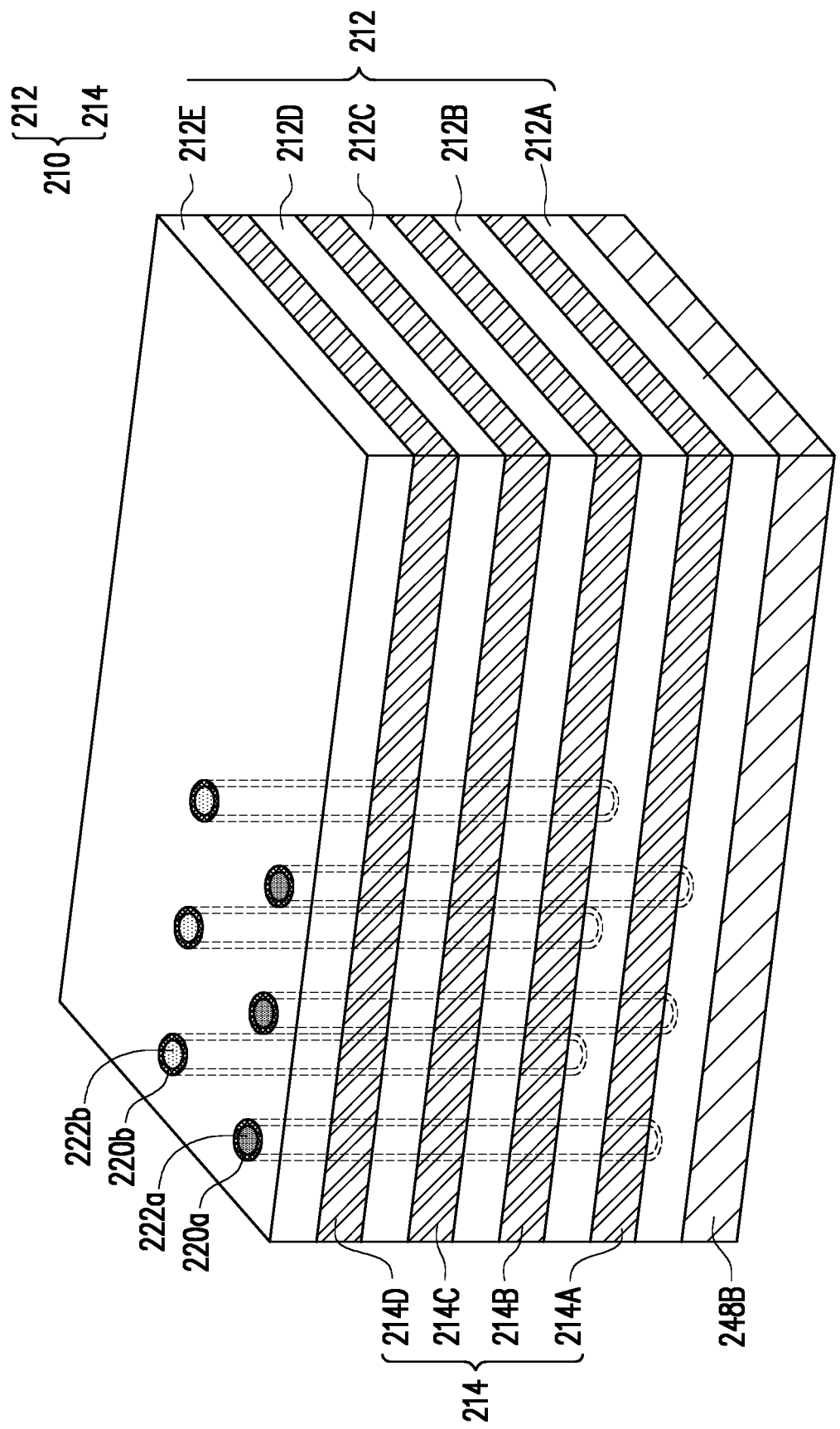
Figure 30A:
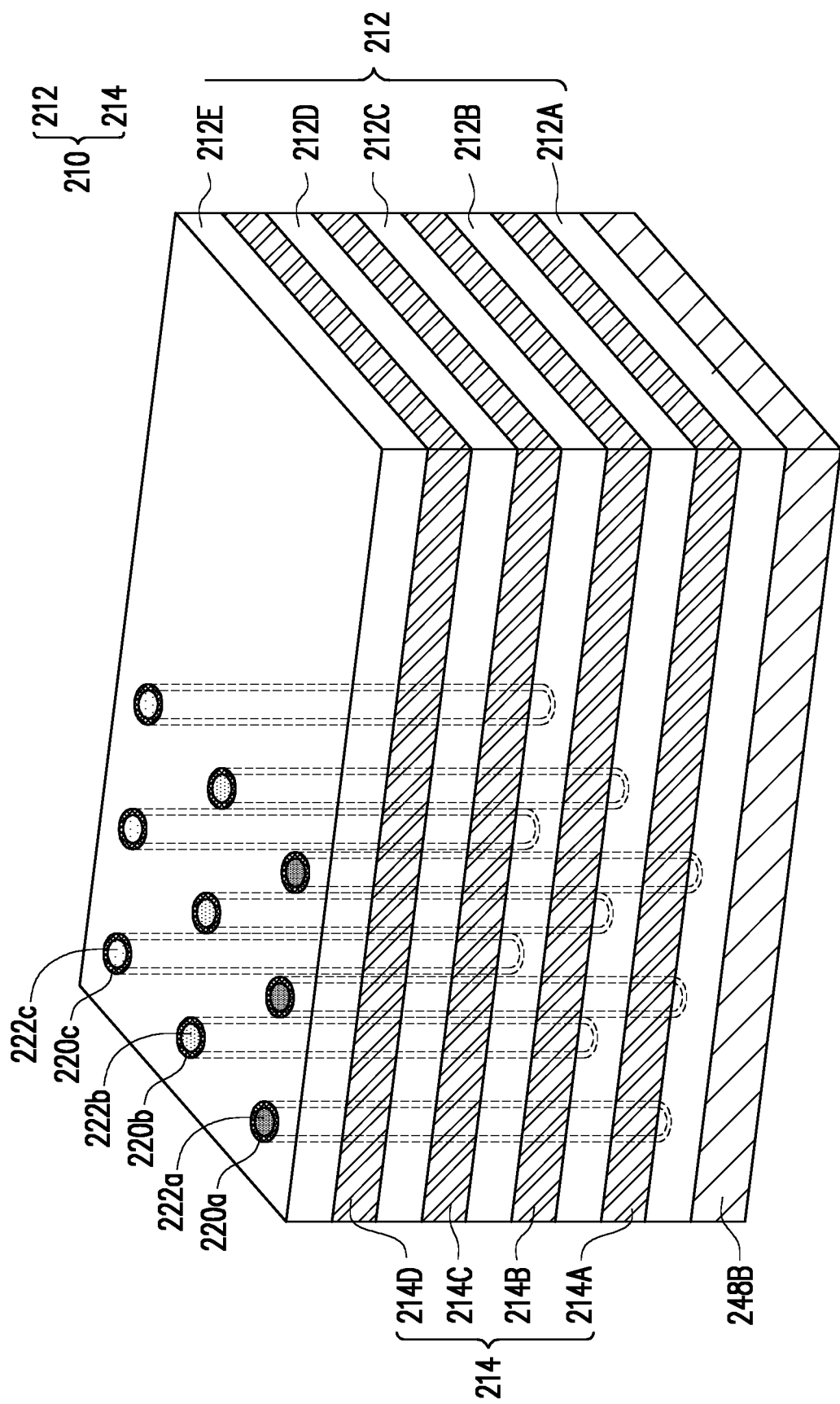
Figure 30B:
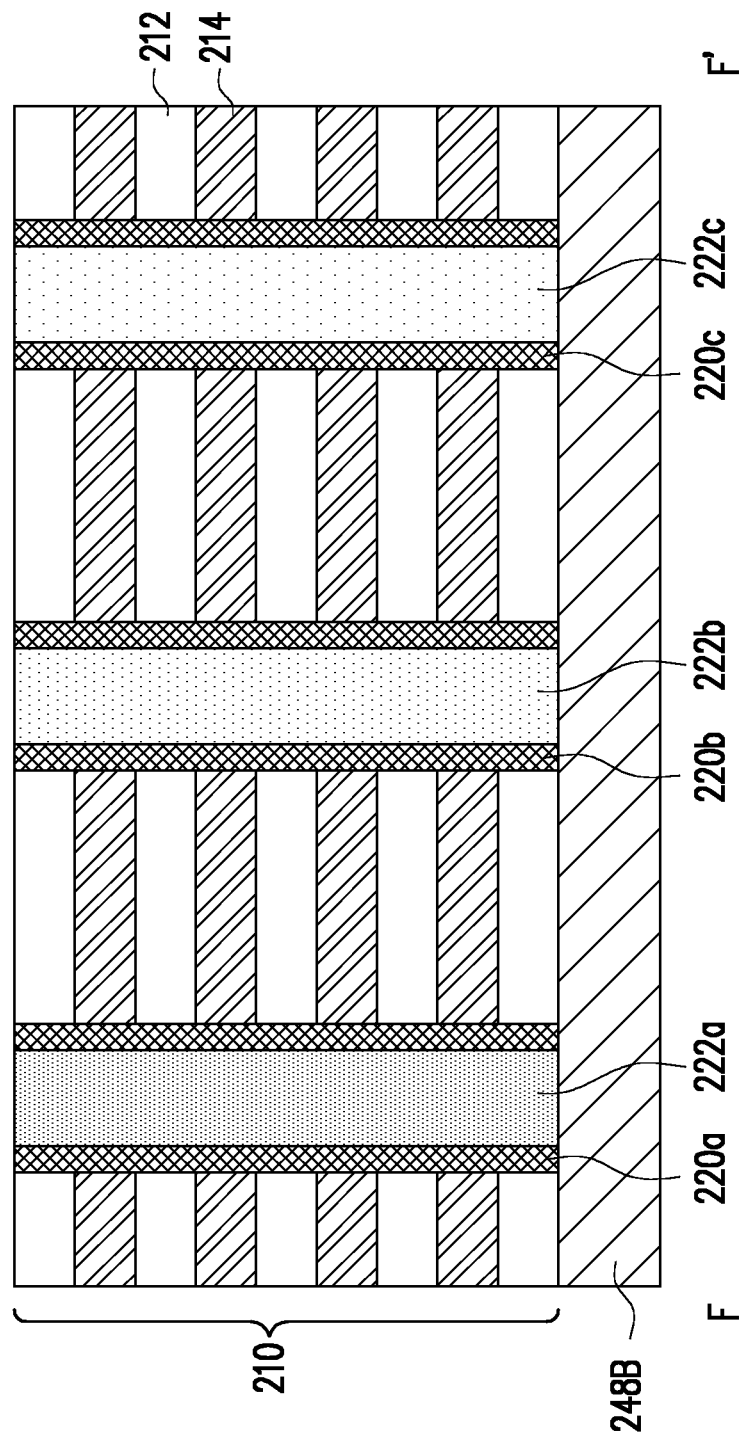

FIGS. 28, 29, 30A and 30B are views of intermediate stages in the manufacturing of channel regions of the 3D memory device 200, in accordance with some embodiments. FIGS. 28, 29 and 30A are illustrated in a partial three-dimensional view. FIG. 30B is illustrated along reference cross-section F-F' illustrated in FIG. 26A.

Referring to FIG. 28, one or more channel pillars 222a and one or more ferroelectric sheathes 220a surrounding the one or more channel pillars 222a are formed in the multi-layer stack 210. In some embodiment, the multi-layer stack 210 is patterned to form one or more openings. The openings may penetrate through the multi-layer stack 210, and may expose sidewalls of the multi-layer stack 210 and the top surface of the conductive layer 248B. Next, the one or more ferroelectric sheathes 220a are formed in the one or more openings to cover the sidewalls of the one or more openings. The forming method of the one or more ferroelectric sheathes 220a may be similar to that of the ferroelectric layer 120a of the 3D memory device 100, and thus detailed descriptions are not repeated here. Thereafter, the one or more channel pillars 222a are formed to fill up the one or more openings. In some embodiments, the one or more channel pillars 222a are formed by depositing a channel material that completely fills the one or more openings. After the channel material is formed, a planarization process (e.g., a chemical mechanical planarization (CMP), etch back, the like, or the combination) may be performed to remove excessive portions of the channel material from the upper surface of the multi-layer stack 210, thereby forming the one or more channel pillars 222a.

Referring to FIG. 29, one or more channel pillars 222b and one or more ferroelectric sheathes 220b surrounding the one or more channel pillars 222b are formed in the multi-layer stack 210. In some embodiment, the multi-layer stack 210 is further patterned to form one or more openings. The openings may penetrate through the multi-layer stack 210, and may expose sidewalls of the multi-layer stack 210 and the top surface of the conductive layer 248B. Next, the one or more ferroelectric sheathes 220b are formed in the one or more openings to cover the sidewalls of the one or more openings. Thereafter, the one or more channel pillars 222b are formed to fill up the one or more openings. The forming methods of the one or more ferroelectric sheathes 220b and the one or more channel pillars 222b may be similar to those of the one or more ferroelectric sheathes 220a and the one or more channel pillars 222a, and thus detailed descriptions are not repeated here.

Referring to FIG. 30A and FIG. 30B, one or more channel pillars 222c and one or more ferroelectric sheathes 220c surrounding the one or more channel pillars 222c are formed in the multi-layer stack 210. In some embodiment, the multi-layer stack 210 is further patterned to form one or more openings. The openings may penetrate through the multi-layer stack 210, and may expose sidewalls of the multi-layer stack 210 and the top surface of the conductive layer 248B. Next, the one or more ferroelectric sheathes 220c are formed in the one or more openings to cover the sidewalls of the one or more openings. Thereafter, the one or more channel pillars 222c are formed to fill up the one or more openings. The forming methods of the one or more ferroelectric sheathes 220c and the one or more channel pillars 222c may be similar to those of the one or more ferroelectric sheathes 220a and the one or more channel pillars 222a, and thus detailed descriptions are not repeated here. As shown in FIG. 30B, the channel pillars 222a, 222b and 222c and the ferroelectric sheathes 220a, 220b and 220c may penetrate through the multi-layer stack 210 and may reach the underlying conductive layer 248B.

The materials of the channel pillars 222a, 222b and 222c and the ferroelectric sheathes 220a, 220b and 220c may be the same as or similar to those of the channel layers 122a, 122b and 122c and the ferroelectric layers 120a, 120b and 120c of the 3D memory device 100, and thus detailed descriptions are not repeated here.

Figure 31:
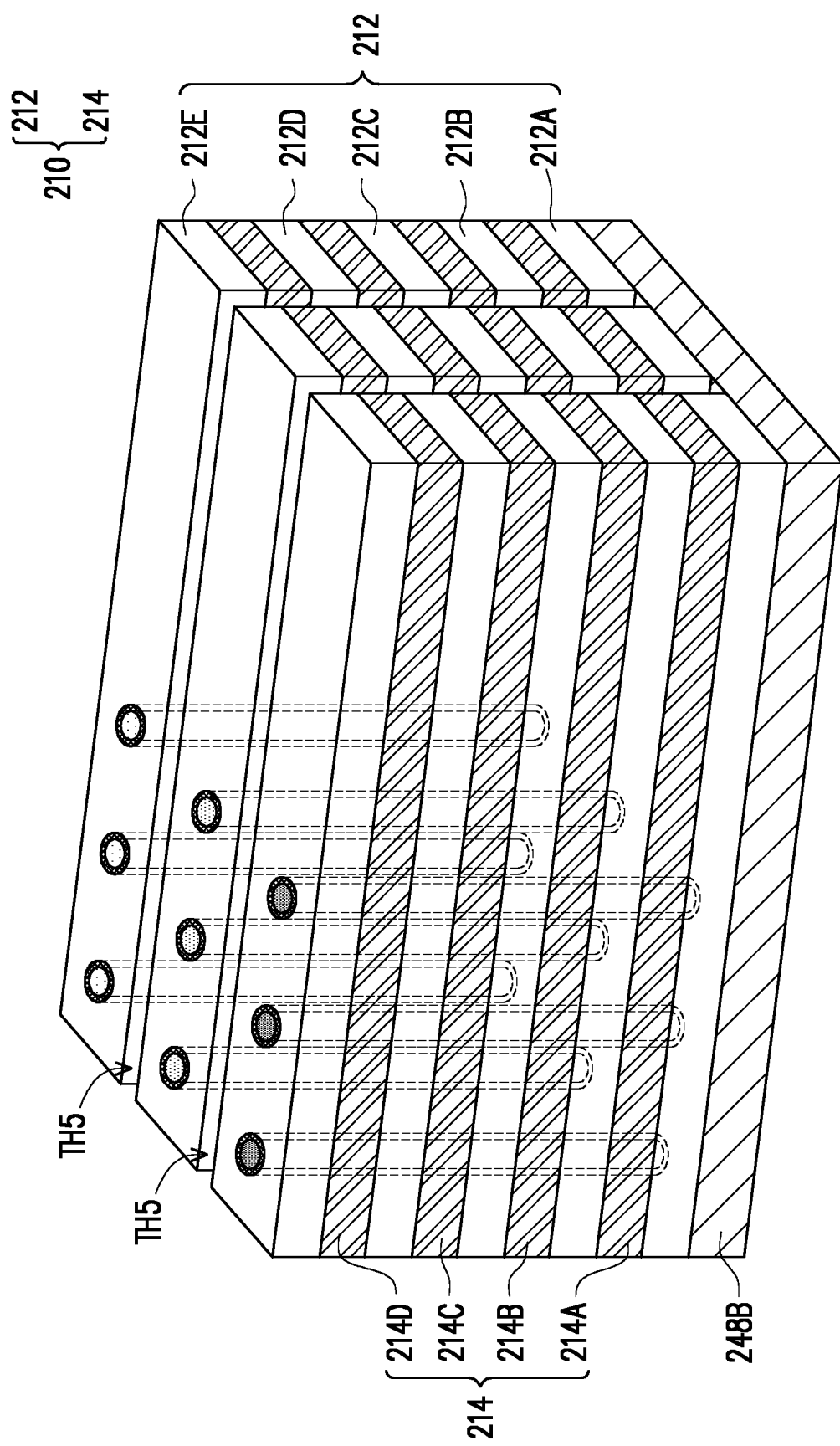
Figure 32:
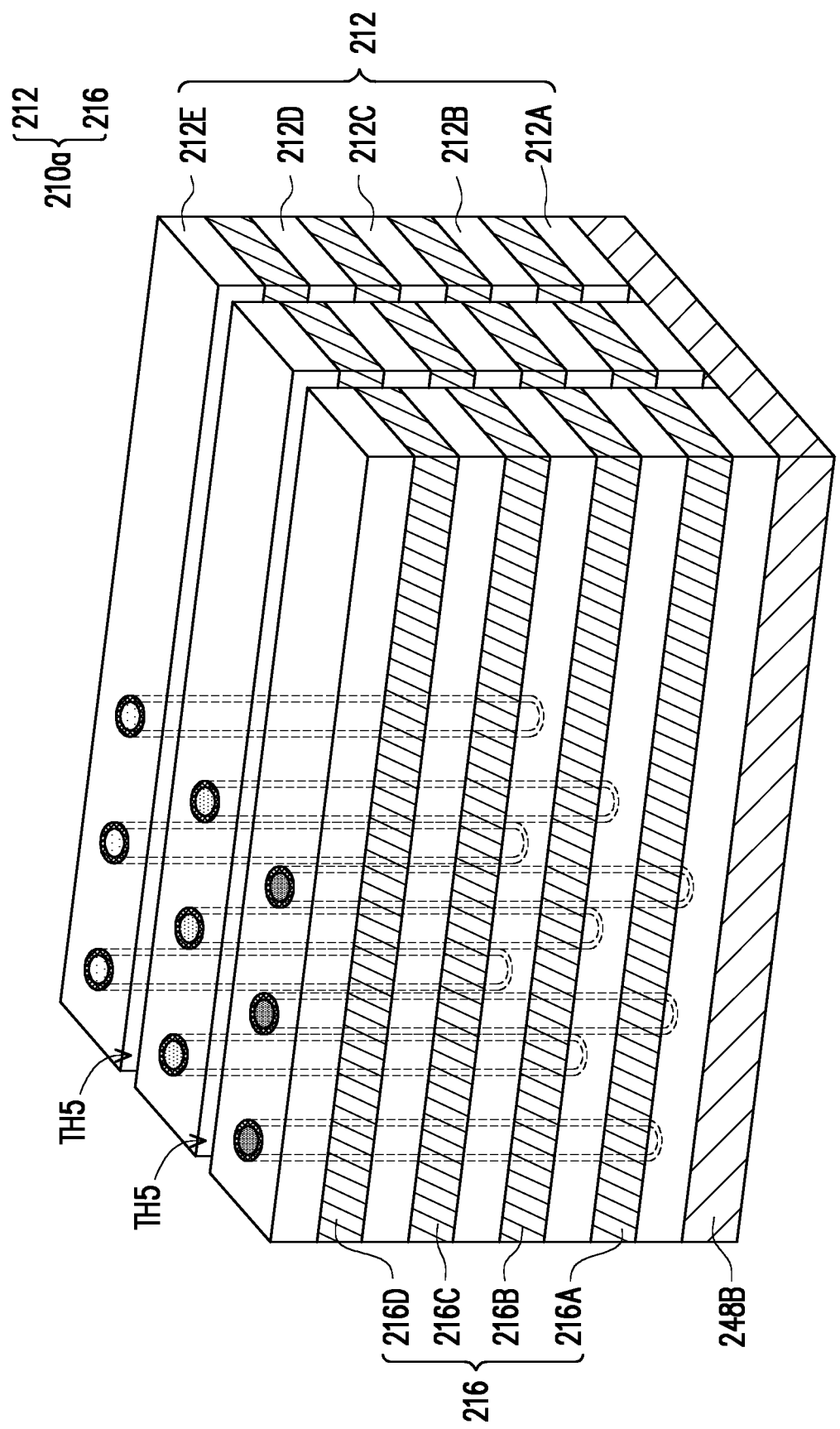
Figure 33A:
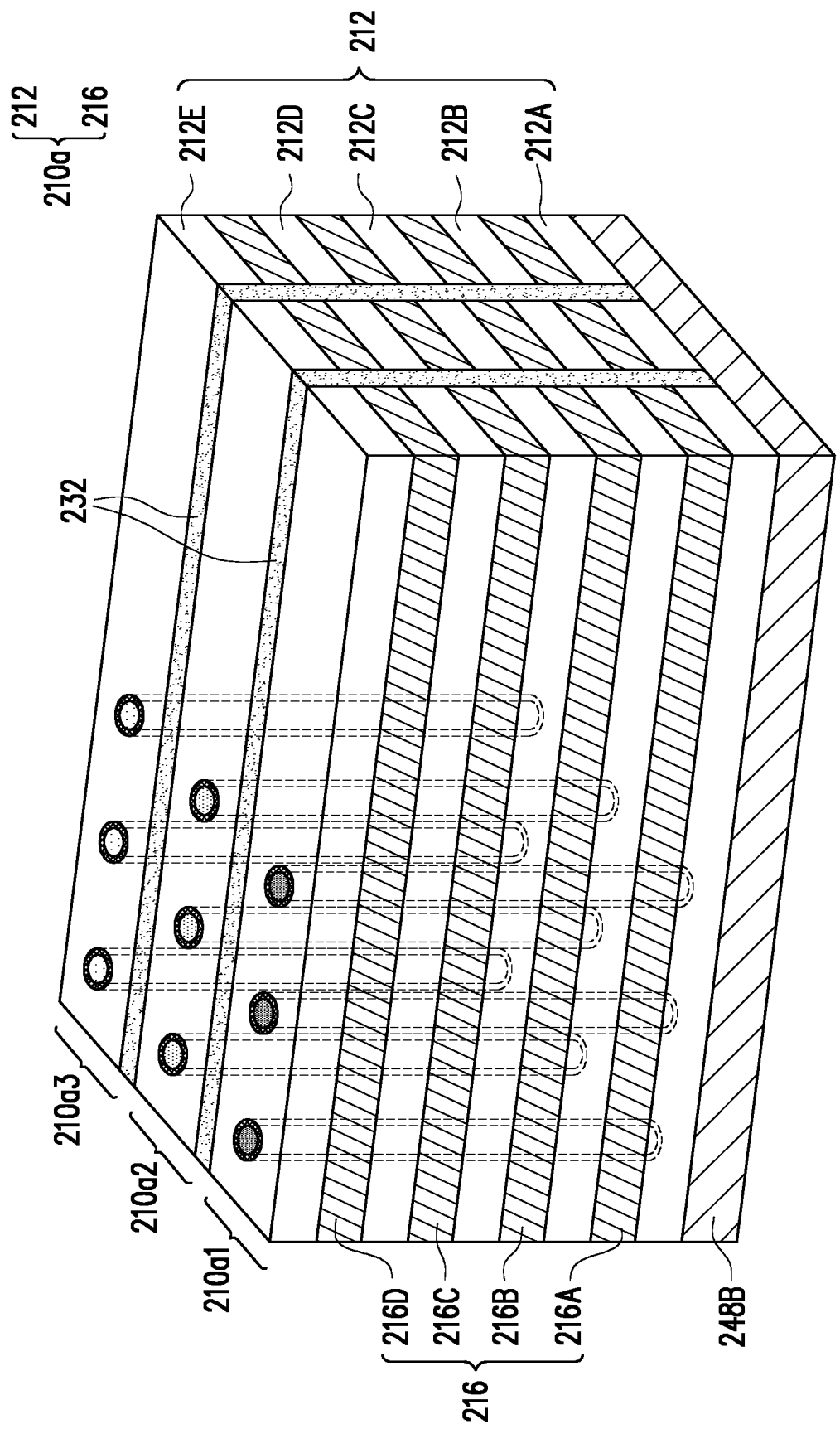

FIGS. 31, 32, 33A and 33B are views of intermediate stages in the manufacturing of memory regions of the 3D memory device 200, in accordance with some embodiments. FIGS. 31, 32 and 33A are illustrated in a partial three-dimensional view. FIG. 32B is illustrated along reference cross-section F-F' illustrated in FIG. 26A.

Referring to FIG. 31, the multi-layer stack 210 is further patterned to form trenches TH5. In some embodiments, the trenches TH5 penetrates through the multi-layer stack 210, and the trenches TH5 may be respectively between the channel pillars 220a and the channel pillars 220b, and between the channel pillars 220b and the channel pillars 220c. The forming method of the trenches TH5 may be similar to that of the trenches TH4 illustrated in FIG. 21, and thus detailed descriptions are not repeated here.

Referring to FIG. 31 and FIG. 32, after the trenches TH5 are formed to expose the sidewalls of the sacrificial layers 214, the sacrificial layers 214 are replaced with conductive materials to define the conductive lines 216. The replacement process may be similar to the replacement process illustrated in FIGS. 22 and 23, and thus detailed descriptions are not repeated here. The topmost and bottommost conductive lines 216D and 216A may correspond to select lines in the 3D memory device 200, and the topmost and bottommost conductive lines 216D and 216A may further provide gate electrodes for the resulting select transistors of the 3D memory device 200. The intermediate conductive lines 216B and 216C may correspond to word lines in the 3D memory device 200, and the intermediate conductive lines 216B and 216C may further provide gate electrodes for the resulting memory cells of the 3D memory device 200. The conductive lines 216 at the same level may be collectively referred to as a conductive layer (or gate layer) 216. In some embodiments, the dielectric layers 212 and the conductive layers 216 constitute a multi-layer stack 210a.

Figure 33B:
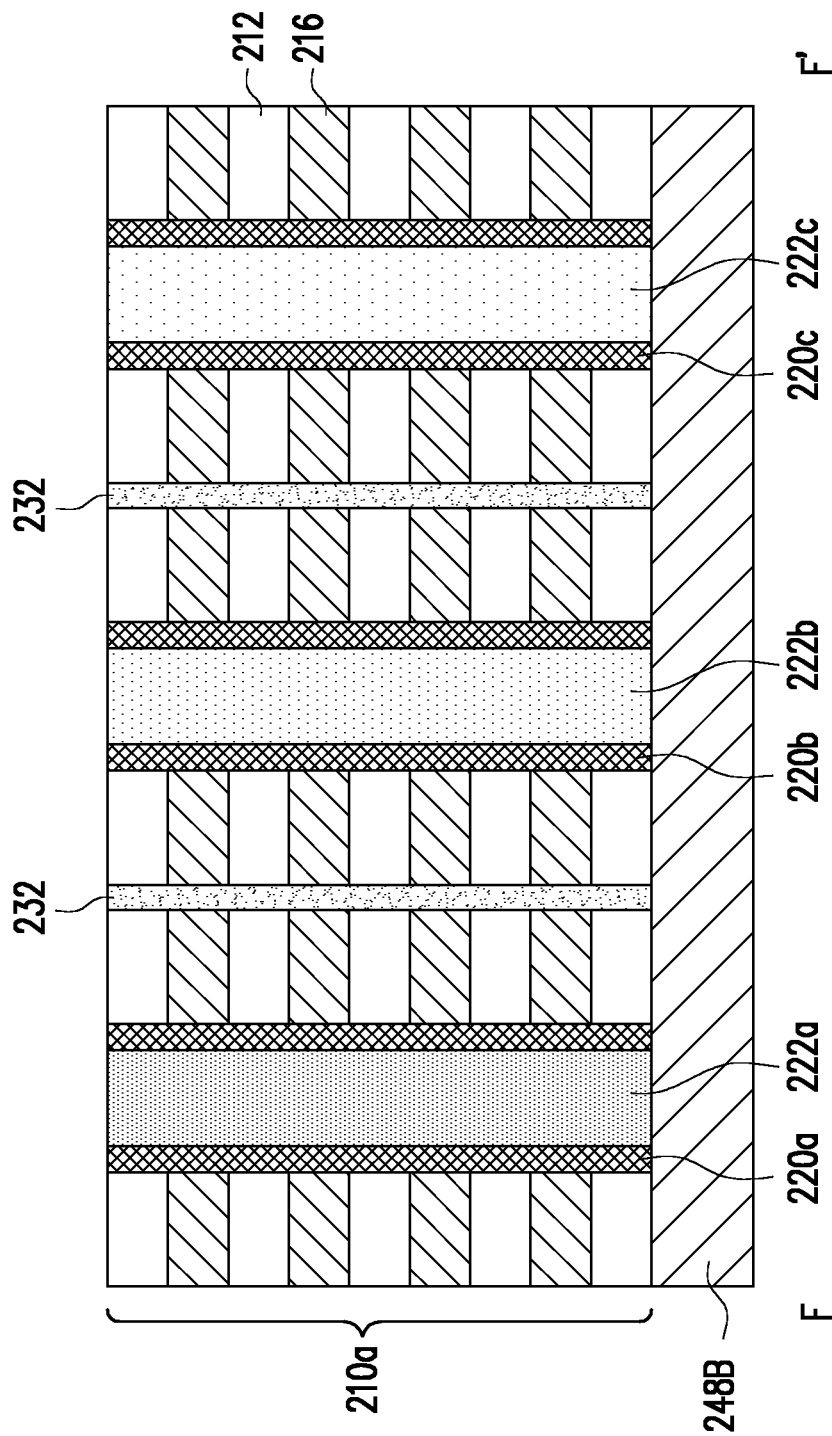

Referring to FIG. 33A and FIG. 33B, after the sacrificial layers 214 are replaced with the conductive lines 216, dielectric isolations 232 are formed in the trenches TH5. In some embodiments, the dielectric isolations 232 may be referred to as gate isolations. The dielectric isolations 232 may be disposed between and isolate gates electrodes of the adjacent memory cells 240 (see FIG. 26B). In some embodiments, the dielectric isolations 232 penetrate through the multi-layer stack 210a and extend between adjacent columns of the memory cells 240, so as to divide the multi-layer stack 210a into a plurality of multi-layer stacks (e.g., multi-layer stacks 210a1, 210a2, 210a3). That is, the plurality of multi-layer stacks (e.g., multi-layer stacks 210a1, 210a2, 210a3) laterally spaced apart from one another by the dielectric isolations 232, respectively. Each of the plurality of multi-layer stacks (e.g., multi-layer stacks 210a1, 210a2, 210a3) includes portions of the dielectric layers 212 and portions of the conductive layers 216. In some embodiments, the ferroelectric sheath 220a and the channel pillar 222a are embedded in the multi-layer stack 210a1, the ferroelectric sheath 220b and the channel pillar 222b are embedded in the multi-layer stack 210a2, and the ferroelectric sheath 220c and the channel pillar 222c are embedded in the multi-layer stack 210a3. The forming method of the dielectric isolations 232 may be similar to that of the dielectric isolations 132 illustrated in FIG. 24, and thus detailed descriptions are not repeated here.

Figure 34A:
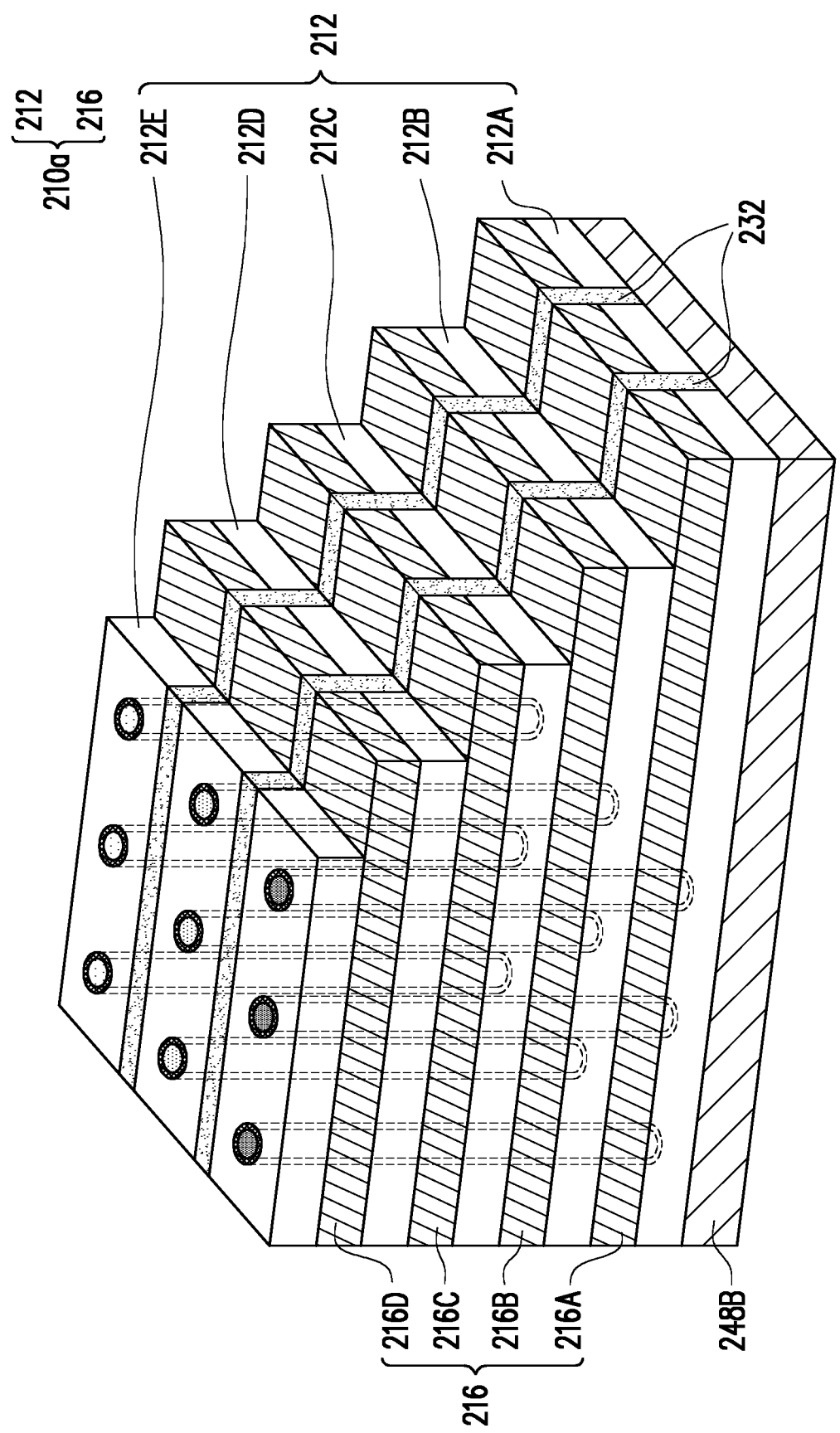
Figure 34B:
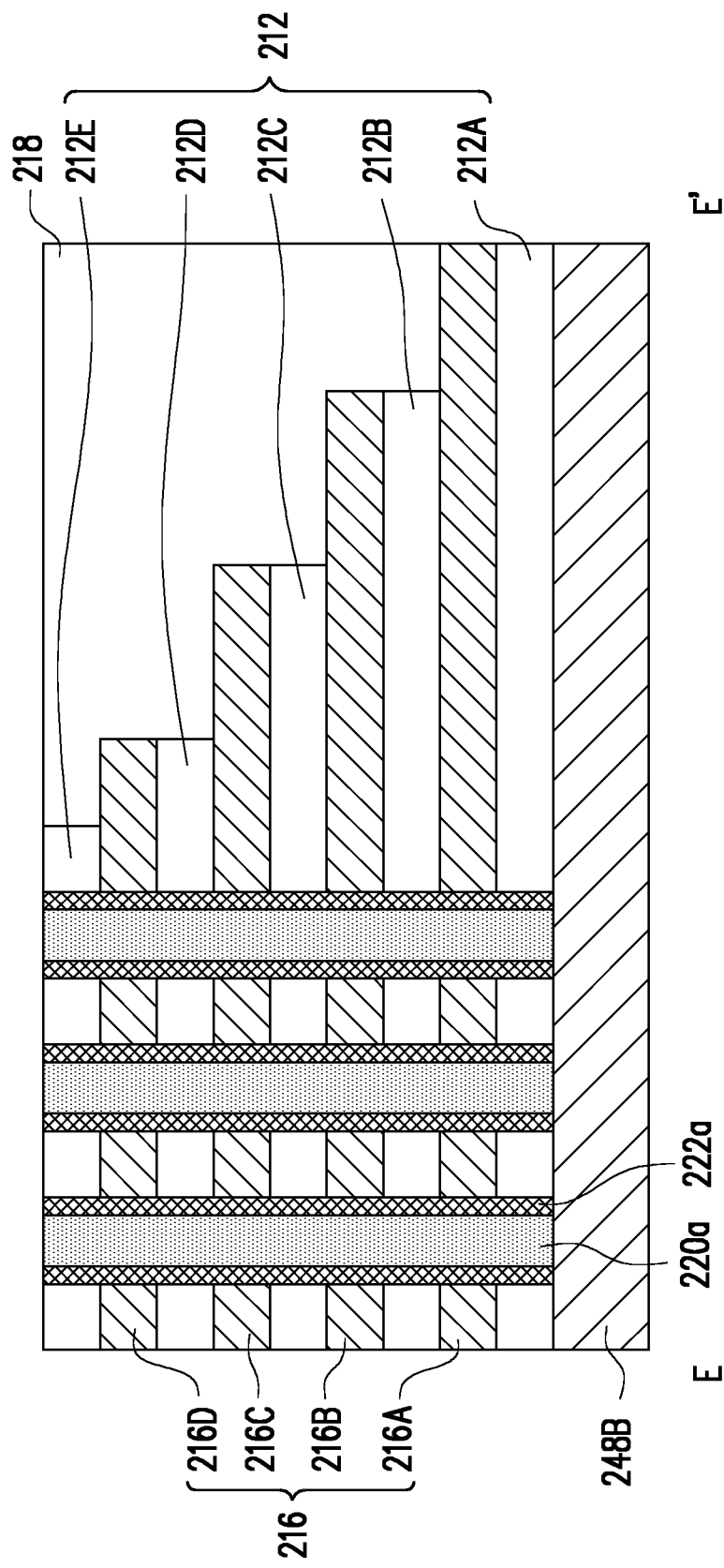

FIGS. 34A and 34B are views of an intermediate stage in the manufacturing of staircase structures of the 3D memory device 200, in accordance with some embodiments. FIG. 34A is illustrated in a partial three-dimensional view. FIG. 34B is illustrated along reference cross-section E-E' illustrated in FIG. 26A.

Referring to FIG. 34A and FIG. 34B, the forming method of the staircase structure of the 3D memory device 200 may be similar to that of the staircase structure of the 3D memory device 100 illustrated in FIGS. 4 through 8, except that the steps described in FIGS. 5 and 6 may be repeated prior to the step described in FIG. 7 in order to form more stairs. After the staircase structure of the 3D memory device 200 is formed, an inter-metal dielectric (IMD) 118 is deposited over the staircase structure of the multi-layer stack 210a. The forming method of the IMD 218 may be similar to that of the IMD 218 illustrated in FIG. 8, and thus detailed descriptions are not repeated here. The IMD 218 extends along sidewalls of the conductive layers 216B-216D and sidewalls of the dielectric layers 112B-112E. Further, the IMD 218 may be in contact with top surfaces of the conductive layers 216A-216D.

As shown in FIGS. 34A and 34B, a strip-shaped staircase structures are thus formed. The strip-shaped staircase structures respectively include alternating stacked layers of conductive line 216 and dielectric layers 212. Lower conductive lines 216 are longer and extend laterally past upper conductive lines 216, and a length of each of the conductive lines 216 increases in a direction towards the conductive layer 248B.

Figure 35A:
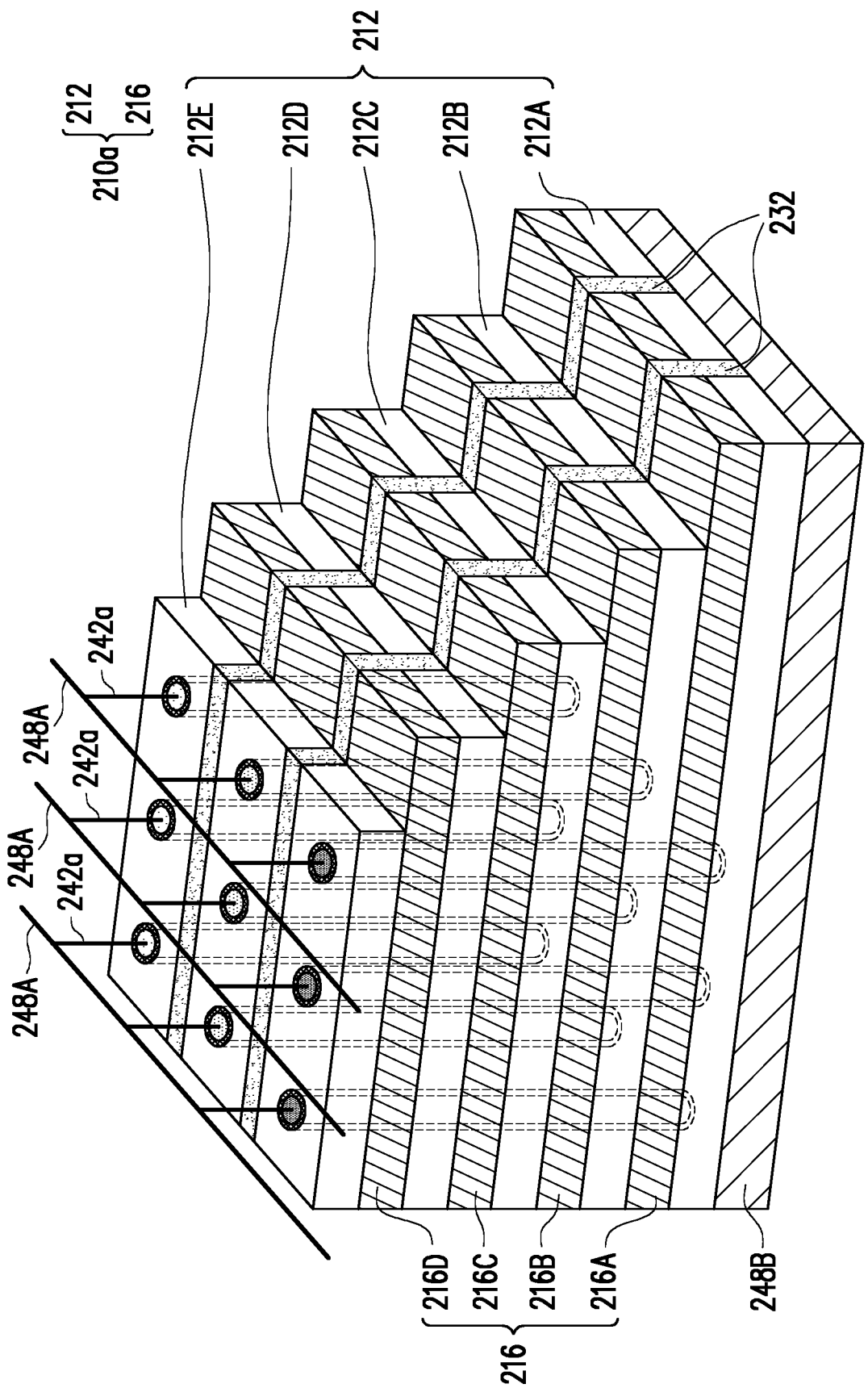
Figure 35B:
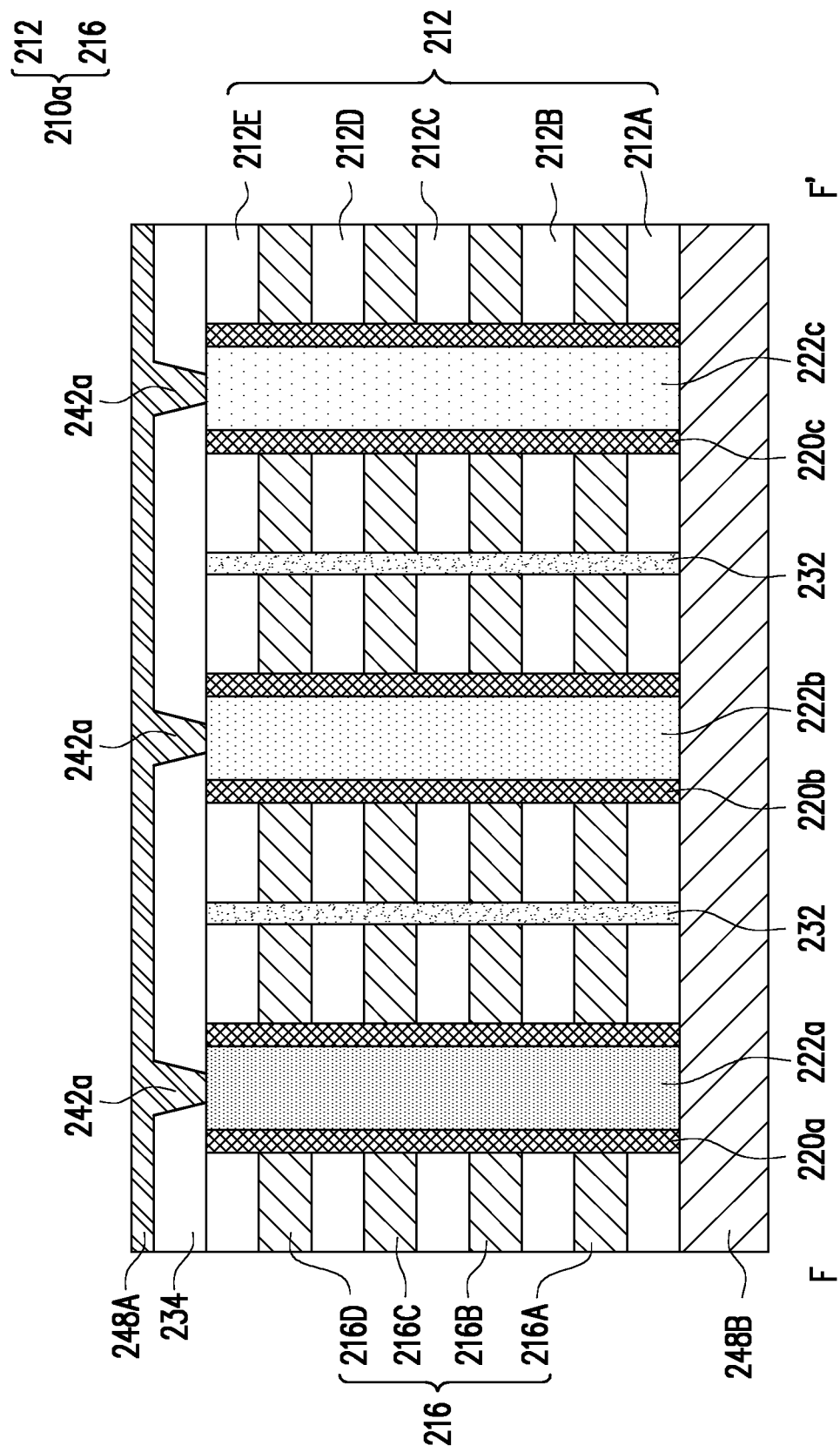
Figure 35C:
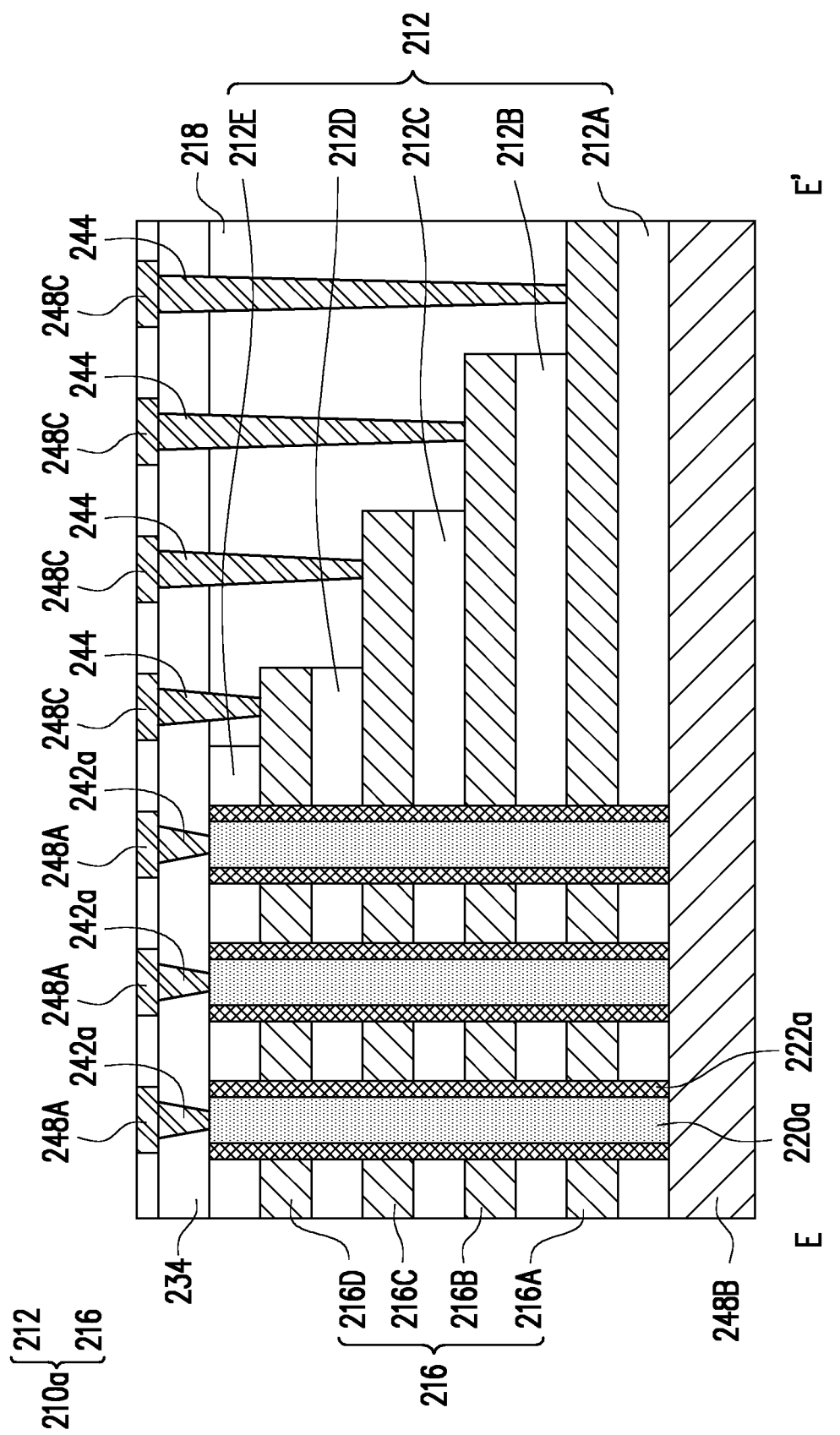

Referring to FIGS. 35A, 35B and 35C, an IMD layer 234 is formed on top surfaces of the multi-layer stack 210a (e.g., the dielectric layer 212E), the ferroelectric sheathes 220a, 220b, 220c, the channel pillars 222a, 222b, 222c and the IMD 218. Conductive contacts 242a are made on the channel layers 222a, 222b, 222c, and the conductive contacts 244 are made on the conductive lines 216. FIG. 35A illustrates a perspective view of the 3D memory device 200. FIG. 35B illustrates a cross-sectional view of the device along line F-F' of FIG. 26A. FIG. 25C illustrates a cross-sectional view along the line E-E' of FIG. 26A. For the purpose of simplicity and clarity, the conductive contacts 244 and the conductive lines 248C to be described with reference to FIG. 35C are omitted in FIG. 35A.

The material and the forming method of the IMD 234 may be similar to those of the IMD 134 illustrated in FIGS. 25A-25D, and thus detailed descriptions are not repeated here.

In some embodiments, the staircase shape of the conductive lines 216 may provide a surface on each of the conductive lines 216 for the conductive contacts 244 to land on. The material and the forming method of the conductive contacts 244 may be similar to those of the conductive contacts 144 illustrated in FIGS. 25A-25D, and thus detailed descriptions are not repeated here.

In some embodiments, the conductive lines 248A (i.e., bit lines) are electrically coupled to first ends of the channel pillars 222a, 222b, 222c, and the conductive layer 248B (i.e., common source) are electrically coupled to second ends of the channel pillars 222a, 222b, 222c opposite to the first ends of the channel pillars 222a, 222b, 222c.

As also illustrated by the perspective view of FIG. 35A, conductive contacts 242a may also be made on the channel pillars 222a, 222b, 222c. The conductive contacts 242a and 244 may be electrically connected to conductive lines 248A and 248C, respectively, which connect the memory device to an underlying/overlying circuitry (e.g., control circuitry) and/or signal or power lines. In addition, the conductive layer 248B may connect the memory device to ground lines in the semiconductor die. For example, as shown in FIG. 35C, the conductive contacts 244 may extend through the IMD 218 and IMD 234 to electrically connect conductive lines 248C to the conductive lines 116 and the underlying active devices of the substrate. Other conductive contacts or vias may be formed through the IMD 234 to electrically connect the conductive lines 248A to the underlying active devices of the substrate, respectively. In alternate embodiments, routing and/or power lines to/from the memory array may be provided by an interconnect structure formed over the memory device 200 in addition to or in lieu of the interconnect structure 70 (shown in FIGS. 2 and 3). Accordingly, the 3D memory device 200 according to some embodiments of the present disclosure may be completed.

In view of the above, in some embodiments of the disclosure, by the design of the channels with different mobilities, the on-currents of the memory cells may be different from each other. Therefore, only three memory cells having different on-currents are needed for storing 3-bit data. Accordingly, the layout area of the memory device is reduced, and therefore the power efficiency and storing capacity are improved.

Although three memory cells having different on-currents are used for storing a 3-bit data as described above, those skilled in the art may implement two memory cells having different on-currents for storing a 2-bit data in other embodiments of the present disclosure.

In the above embodiments, the 3D memory device 100 is formed by a "staircase first process" in which the staircase structure is formed before the memory cells are formed, and the 3D memory device 200 is formed by a "staircase last process" in which the staircase structure is formed after the memory cells are formed. However, the disclosure is not limited thereto. In other embodiments, the 3D memory device 100 may be formed by a "staircase last process", and the 3D memory device 200 is formed by a "staircase first process".

In the above embodiments, the gate electrodes (e.g., word lines) are formed by depositing sacrificial dielectric layers followed by replacing sacrificial dielectric layers with conductive layers. However, the disclosure is not limited thereto. In other embodiments, the gate electrodes (e.g., word lines) may be formed in the first stage without the replacement step as needed.

Many variations of the above examples are contemplated by the present disclosure. It is understood that different embodiments may have different advantages, and that no particular advantage is necessarily required of all embodiments.

In accordance with some embodiments of the disclosure, a memory device includes a multi-layer stack, a plurality of channel layers and a plurality of ferroelectric layers. The multi-layer stack is disposed on a substrate and includes a plurality of gate layers and a plurality of dielectric layers stacked alternately. The plurality of channel layers penetrate through the multi-layer stack and are laterally spaced apart from each other, wherein the plurality of channel layers include a first channel layer and a second channel layer, and a first electron mobility of the first channel layer is different from a second electron mobility of the second channel layer.

Each of the plurality of channel layers are spaced apart from the multi-layer stack by one of the plurality of ferroelectric layers, respectively.

In accordance with some embodiments of the disclosure, a memory device includes a plurality of gate layers, a first channel pillar, a first ferroelectric sheath a second channel pillar and a second ferroelectric sheath. The plurality of gate layers are disposed over a substrate and are vertically spaced apart from each other. The first channel pillar penetrates through the plurality of gate layers. The first ferroelectric sheath covers a sidewall of the first channel pillar. The second channel pillar penetrates through the plurality of gate layers, wherein a first electron mobility of the first channel pillar is less than a second electron mobility of the second channel pillar. The second ferroelectric sheath covers a sidewall of the second channel pillar.

In accordance with some embodiments of the disclosure, a method of forming a memory device includes the following steps. A multi-layer stack is formed over a substrate, wherein the multi-layer stack includes a plurality of first material layers and a plurality of second material layers stacked alternately. A first trench is formed in the multi-layer stack to penetrate through the multi-layer stack. A first ferroelectric layer and a first channel layer are formed in the first trench. A second trench is formed in the multi-layer stack to penetrate through the multi-layer stack. A second ferroelectric layer and a second channel layer are formed in the second trench, wherein the first and second channel layers have different electron mobilities. The first material layers or the second material layers are replaced by gate layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a memory device, comprising:
   forming a first cell region in a first multi-layer stack, wherein the first cell region comprises stacks of first ferroelectric field effect transistors (FeFETs) with a first electron mobility, and the first multi-layer stack comprises alternately stacked first word lines and first dielectric layers; and
   forming a second cell region in a second multi-layer stack, wherein the second cell region comprises stacks of second FeFETs with a second electron mobility greater than the first electron mobility, the second multi-layer stack comprises alternately stacked second word lines and second dielectric layers, and the second multi-layer stack is laterally adjacent to and substantially in parallel with the first multi-layer stack.

2. The method according to claim 1, wherein formation of the first and second multi-layer stacks comprises:
   alternately stacking dielectric layers and sacrificial layers along a vertical direction;
   forming a trench cutting through the dielectric layers and the sacrificial layers, such that the dielectric layers are patterned into the first dielectric layers and the second dielectric layer;
   replacing the sacrificial layers with the first and second word lines.

3. The method according to claim 2, further comprising:
   shaping a stacking structure including the dielectric layers and the sacrificial layers before formation of the trench, to form a staircase structure at a side of the stacking structure.

4. The method according to claim 1, further comprising:
   shaping the first and second multi-layer stacks, to form a staircase at a side of each of the first and second multi-layer stacks.

5. The method according to claim 1, wherein the first and second cell regions laterally penetrate through the first and second multi-layer stacks, respectively.

6. The method according to claim 5, wherein
   the first cell region comprises pairs of first conductive pillars, first channel layers in lateral contact with the first conductive pillars and first ferroelectric layers separating the first channel layers from the first multi-layer stack, and
   the second cell region comprises pairs of second conductive pillars, second channel layers in lateral contact with the second conductive pillars and second ferroelectric layers separating the second channel layers from the second multi-layer stack.

7. The method according to claim 6, wherein the first channel layers are different from the second channel layers in terms of composition, doping and/or crystallinity.

8. The method according to claim 1, wherein
   the first cell region comprises first channel pillars vertically extending through the first multi-layer stack, and comprises first ferroelectric sheaths separating the first channel pillars from the first multi-layer stack,
   the second cell region comprises second channel pillars vertically extending through the second multi-layer stack, and comprises second ferroelectric sheaths separating the second channel pillars from the second multi-layer stack.

9. The method according to claim 8, wherein the first channel pillars are different from the second channel pillars in terms of composition, doping and/or crystallinity.

10. The method according to claim 8, further comprising
    forming a common electrode layer lying below the first and second multi-layer stacks and connected to the first and second channel pillars;
    forming first conductive lines running above the first multilayer stack and connected to the first channel pillars; and
    forming second conductive lines running above the second multilayer stack and connected to the second channel pillars.

11. The method according to claim 1, further comprising:
    forming an isolation structure between the first and second multi-layer stacks, to isolate the first word lines in the first multi-layer stack from the second word lines in the second multi-layer stack.

12. A method for forming a memory device, comprising:
    alternately stacking dielectric layers and sacrificial layers along a vertical direction;
    forming a first trench and a second trench cutting a stacking structure including the dielectric layers and the sacrificial layers into separate portions, wherein the first and second trenches are laterally spaced apart from each other;

filling the first trench with pairs of first conductive pillars, first channel layers and first ferroelectric layers, wherein the first channel layers are in lateral contact with the first conductive pillars from opposite sides of the first conductive pillars, and the first ferroelectric layers separate the first channel layers from the dielectric layers and the sacrificial layers;

filling the second trench with pairs of second conductive pillars, second channel layers and second ferroelectric layers, wherein the second channel layers are in lateral contact with the second conductive pillars from opposite sides of the second conductive pillars, and the second ferroelectric layers separate the second channel layers from the dielectric layers and the sacrificial layers; and replacing the sacrificial layers with word lines, wherein the first channel layers are different from the second channel layers in terms of composition, doping and/or crystallinity, such that stacks of first ferroelectric field effect transistors (FeFETs) resulted in the first trench have an electron mobility different from an electron mobility of stacks of second FeFETs resulted in the second trench.

13. The method according to claim 12, wherein replacing the sacrificial layers with the word lines comprises:

forming a third trench cutting through the dielectric layers and the sacrificial layers and extending in between the first and second trenches;

removing the sacrificial layers from the third trench, to form spacing between the dielectric layers; and filling the spacing with the word lines.

14. The method according to claim 13, further comprising:

filling the third trench with an isolation structure.

15. The method according to claim 12, further comprising:

shaping the stacking structure comprising the dielectric layers and the sacrificial layers, to form a staircase structure at a side of the stacking structure.

16. A method for forming a memory device, comprising:

alternately stacking dielectric layers and sacrificial layers along a vertical direction;

forming first through holes and second through holes penetrating through the dielectric layers and the sacrificial layers;

forming first channel pillars and first ferroelectric sheaths in the first through holes, wherein the first channel pillars are wrapped around by the first ferroelectric sheaths;

forming second channel pillars and second ferroelectric sheaths in the second through holes, wherein the second channel pillars are wrapped around by the second ferroelectric sheaths;

replacing the sacrificial layers with word lines, wherein the first channel pillars are different from the second channel pillars in terms of composition, doping and/or crystallinity, such that stacks of first ferroelectric field effect transistors (FeFETs) defined around the first channel pillars have an electron mobility different from an electron mobility of stacks of second FeFETs defined around the second channel pillars.

17. The method according to claim 16, wherein the dielectric layers and the sacrificial layers are stacked on a common electrode layer.

18. The method according to claim 16, further comprising:

forming first conductive lines running over and connected to the first channel pillars; and forming second conductive lines running over and connected to the second channel pillars.

19. The method according to claim 16, wherein replacing the sacrificial layers with the word lines comprises:

forming a trench cutting through the dielectric layers and the sacrificial layers;

removing the sacrificial layers from the trench, to form spacing between the dielectric layers; and filling the spacing with the word lines.

20. The method according to claim 16, further comprising:

shaping a stacking structure including the dielectric layers and the word lines, to form a staircase structure at a side of the stacking structure.

* * * * *